(12) United States Patent
Masuda et al.

(10) Patent No.: US 6,552,437 B1
(45) Date of Patent: Apr. 22, 2003

(54) SEMICONDUCTOR DEVICE AND METHOD OF MANUFACTURE THEREOF

(75) Inventors: Masachika Masuda, Tokorozawa (JP); Tamaki Wada, Higashimurayama (JP); Michiaki Sugiyama, Tokyo (JP); Tomoko Higashino, Tokyo (JP); Takafumi Nishita, Iruma (JP); Hiroshi Ohno, Tachikawa (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/806,950
(22) PCT Filed: Sep. 14, 1999
(86) PCT No.: PCT/JP99/05028
§ 371 (c)(1), (2), (4) Date: Apr. 6, 2001
(87) PCT Pub. No.: WO00/22676
PCT Pub. Date: Apr. 20, 2000

(30) Foreign Application Priority Data

Oct. 14, 1998 (JP) .......................................... 10-291695
Apr. 2, 1999 (JP) .......................................... 11-096812

(51) Int. Cl.$^7$ .............................................. H01L 29/40
(52) U.S. Cl. ...................... 257/777; 257/666; 257/686; 257/784
(58) Field of Search ................................ 257/666, 686, 257/777, 784

(56) References Cited

U.S. PATENT DOCUMENTS 5,373,189 A * 12/1994 Massit et al. ............... 257/686
6,104,084 A * 8/2000 Ishio et al. .................. 257/666
6,252,305 B1 * 6/2001 Lin et al. ..................... 257/777
6,433,421 B2 * 8/2002 Masuda et al. ............. 257/723
6,476,474 B1 * 11/2002 Hung .......................... 257/686

FOREIGN PATENT DOCUMENTS

| JP | 4-302165 | 10/1992 |
| JP | 7-58281 | 3/1995 |
| JP | 7-273275 | 10/1995 |
| JP | 9-36300 | 2/1997 |

* cited by examiner

Primary Examiner—David Nelms
Assistant Examiner—Dao H. Nguyen
(74) Attorney, Agent, or Firm—Mattingly, Stanger & Malur, P.C.

(57) ABSTRACT

Semiconductor chips (4), (5) are bonded and fixed to each other in a state where the rear surfaces of the respective semiconductor chips are faced to each other so that the other longer latus (4A2) of the semiconductor chip (4) and one longer latus (5A1) of the semiconductor chip (5) may confront the side of leads (10B), and supporting leads (8) are bonded and fixed onto the circuit forming surface (4A) of the semiconductor chip (4) or the circuit forming surface (5A) of the semiconductor chip (5). Owing to such a construction, the structure of a semiconductor device can be thinned.

The semiconductor chips (4), (5) are bonded and fixed to each other in a state where the, positions of the respective semiconductor chips are staggered relatively to each other so that the electrodes (6) of the semiconductor chip (4) may lie outside the other longer latus (5A2) of the semiconductor chip (5), and that the electrodes (6) of the semiconductor chip (5) may lie outside the other longer latus (4A2) of the semiconductor chip (4). Owing to such a construction, the available percentage of the products of the semiconductor device can be heightened.

28 Claims, 42 Drawing Sheets

SEMICONDUCTOR DEVICE AND METHOD OF MANUFACTURE THEREOF

TECHNICAL FIELD

The present invention relates to a semiconductor device, and more particularly to techniques which are effective when applied to a semiconductor device wherein two semiconductor chips are stacked and then encapsulated with an one resin body.

BACKGROUND ART

In order to enlarge the capacity of a storage circuit system, there has been proposed a stacked type semiconductor device wherein two semiconductor chips, in each of which a storage circuit subsystem is constructed, are stacked and then encapsulated with an one resin body. By way of example, a stacked type semiconductor device of LOC (Lead On Chip) structure is disclosed in the official gazette of Japanese Patent Laid-Open No. 58281/1995. Besides, a stacked type semiconductor device of tab structure is disclosed in the official gazette of Japanese Patent Laid-Open No. 302165/1992.

The stacked type semiconductor device of LOC structure is constructed having a first semiconductor chip and a second semiconductor chip in each of which a plurality of electrodes are formed on a circuit forming surface being the front surface (one principal surface) of front and rear surfaces (one principal surface and the other principal surface opposing to each other); a plurality of first leads which are bonded and fixed to the circuit forming surface of the first semiconductor chip through an insulating film, and which are electrically connected to the electrodes of this circuit forming surface through pieces of conductive wire; a plurality of second leads which are bonded and fixed to the circuit forming surface of the second semiconductor chip through an insulating film, and which are electrically connected to the electrodes of this circuit forming surface through pieces of conductive wire; and a resin body which encapsulates the first semiconductor chip, the second semiconductor chip, the inner portions of the first leads, the inner portions of the second leads, and the wire pieces. The first semiconductor chip and the second semiconductor chip are stacked to each other in a state where their circuit forming surfaces are held in opposition to each other. The first leads and the second leads are individually joined in a state where their connection portions are placed one over the other.

The stacked type semiconductor device of tab structure is constructed having a first semiconductor chip which is fixed to the front surface (one principal surface) of the front and rear surfaces (one principal surface and the other principal surface opposing to each other) of a tab (also termed "die pad") through an adhesive layer; a second semiconductor chip which is fixed to the rear surface (the other principal surface) of the tab through an adhesive layer; a plurality of dedicated leads which are electrically connected to the electrodes of either of the first or second semiconductor chips through pieces of conductive wire; a plurality of common leads which are electrically connected to the electrodes of both of the first and second semiconductor chips through pieces of conductive wire; and a resin body which encapsulates the first semiconductor chip, the second semiconductor chip, the inner portions of the dedicated leads, the inner portions of the common leads, and the wire pieces. The electrodes of each of the first and second semiconductor chips are formed on the two longer latus sides of the circuit forming surface opposing to each other and along the respective longer latera thereof. The dedicated leads and the common leads are respectively arranged outside the two longer latera of each of the corresponding semiconductor chips.

Before developing a stacked type semiconductor device, the inventors envisaged problems stated below.

With the LOC structure, the semiconductor device is manufactured using two lead frames, and hence, the fabrication cost thereof becomes high. On the other hand, with the tab structure, the semiconductor device can be manufactured using a single lead frame. Since, however, the semiconductor chips of mirror inversion circuit patterns need to be employed, the fabrication cost of the semiconductor device becomes high even with the tab structure. More specifically, with the tab structure, the two semiconductor chips are respectively mounted on the front and rear surfaces of the tab with their rear surfaces facing each other. Therefore, in the case where the electrodes are formed on the sides of the two longer latera of each circuit forming surface opposing to each other, the electrodes of the lower semiconductor chip are reversed on the right and left sides to those of the upper semiconductor chip.

In this regard, the semiconductor chips of the mirror inversion circuit patterns are dispensed with by employing two semiconductor chips each of which is formed with electrodes on one latus side, and by mounting the two semiconductor chips on the front and rear surfaces of a tab so that one latus side of one semiconductor chip may be located on the opposite side of the other semiconductor chip to one latus side thereof. It is therefore possible to achieve curtailment in the fabrication cost of the semiconductor device of the tab structure.

With the tab structure, however, the thickness of the resin body enlarges, and it is difficult to construct the stacked type semiconductor device as a TSOP (Thin Small Outline Package) type whose resin body is 1.0~1.1 [mm] thick. More specifically, since the tab structure constructs the semiconductor device by mounting the semiconductor chips on the front and rear surfaces of the tab, the tab exists between the upper semiconductor chip and the lower semiconductor chip, and a distance from the circuit forming surface of the upper semiconductor chip to that of the lower semiconductor chip increases, so that the resin body thickens. Further, on account of the construction in which the semiconductor chips are mounted on the front and rear surfaces of the tab, two adhesive layers exist between the upper semiconductor chip and the lower semiconductor chip, and the distance from the circuit forming surface of the upper semiconductor chip to that of the lower semiconductor chip increases, so that the resin body thickens. The inventors study has revealed that the thickness of the resin body can be set at 1.0~1.1 [mm] or less by thinning each semiconductor chip down to 0.1725~0.2 [mm]. In such a case, however, the mechanical strength of the semiconductor chip lowers, and hence, drawbacks such as cracks and fractures are liable to occur in the semiconductor chip. The drawbacks often occur especially at the dicing step of fabrication for splitting a semiconductor wafer into a plurality of chips, and at the die bonding step of fabrication for mounting the semiconductor chips on the tab.

Besides, with the tab structure, inferior connections are liable to occur between the electrodes of the semiconductor chips and the wire pieces. More specifically, it is difficult to bring the tab into touch with a heat stage after the semiconductor chips have been mounted on the front and rear surfaces of the tab. Therefore, the heat of the heat stage is not effectively conducted, and the inferior connections between the electrodes of the semiconductor chips and the wire pieces are liable to occur.

An object of the present invention is to provide a technique capable of attaining the thinned construction of a semiconductor device wherein two semiconductor chips are stacked and then encapsulated with an one resin body.

Another object of the present invention is to provide a technique capable of heightening the available percentage of the products of the thinned semiconductor device.

The above and other objects and novel features of the present invention will become apparent from the description of this specification when read in conjunction with the accompanying drawings.

DISCLOSURE OF THE INVENTION

Typical aspects of performance out of the present invention disclosed in this application are briefly summarized as follows:

(1) A semiconductor device comprising a resin body; a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus; a plurality of first leads which extend inside and outside said resin body, which are arranged outside said first latus of said first semiconductor chip, and which are electrically connected to the corresponding electrodes of said first semiconductor chip through pieces of conductive wire; a plurality of second leads which extend inside and outside said resin body, which are arranged outside a second latus of said first semiconductor chip opposing to said first latus thereof, and which are electrically connected to the corresponding electrodes of said second semiconductor chip through pieces of conductive wire; and supporting leads which support said first semiconductor chip and said second semiconductor chip;

wherein said first semiconductor chip and said second semiconductor chip are bonded and fixed to each other in a state where the rear surfaces of the respective semiconductor chips are faced to each other so that the second latus of said first semiconductor chip and said first latus of said second semiconductor chip may confront a side of said second leads; and said supporting leads are bonded and fixed to the front surface of said first semiconductor chip or the front surface of said second semiconductor chip.

(2) A semiconductor device as defined in the means (1), wherein said first semiconductor chip and said second semiconductor chip are bonded and fixed in a state where positions of the respective semiconductor chips are staggered relatively to each other so that said electrodes of said first semiconductor chip may lie outside a second latus of said second semiconductor chip opposing to said first latus thereof, and that said electrodes of said second semiconductor chip may lie outside said second latus of said first semiconductor chip.

(3) A semiconductor device as defined in the means (2), wherein said first semiconductor chip and said second semiconductor chip are bonded and fixed in a state where the positions of the respective semiconductor chips are staggered relatively to each other so that a third latus of said first semiconductor chip intersecting with said first latus thereof may lie outside a third latus of said second semiconductor chip intersecting with said first latus thereof and lying on the same side as the third latus of said first semiconductor chip, and that a fourth latus of said second semiconductor chip opposing to the third latus thereof may lie outside a fourth latus of said first semiconductor chip opposing to said third latus thereof and lying on the same side as the fourth latus of said second semiconductor chip.

According to the:means (1) explained above, any tab does not exist between the semiconductor chip and the semiconductor chip, so that a distance from the front surface of the first semiconductor chip to the front surface of the second semiconductor chip can be shortened. Moreover, since only one adhesive layer exists between the first semiconductor chip and the second semiconductor chip, the distance from the front surface of the first semiconductor chip to the front surface of the second semiconductor chip can be shortened. Furthermore, since the supporting leads are bonded and fixed to the front surface of the first semiconductor chip or that of the second semiconductor chip, the thickness of each of the supporting leads is cancelled by the loop height of the wire pieces, and the thickness of the resin body is not affected by the supporting leads. As a result, the resin body can be thinned, and hence, the thinned structure of the semiconductor device can be achieved.

According to the means (2) explained above, at a wire bonding step, the region of the rear surface of the first semiconductor chip opposing to the electrodes thereof can be held in direct touch with a heat stage, and the heat of the heat stage is effectively conducted to the electrodes of the first semiconductor chip, so that the inferior connections between the electrodes of the first semiconductor chip and the wire pieces can be relieved. In addition, the region of the rear surface of the second semiconductor chip opposing to the electrodes thereof can be held in direct touch with a heat stage, and the heat of the heat stage is effectively conducted to the electrodes of the second semiconductor chip, so that the inferior connections between the electrodes of the first semiconductor chip and the wire pieces can be relieved. As a result, the available percentage of the products of the semiconductor device can be heightened.

According to the means (3) explained above, at the wire bonding step, the area of touch between the rear surface of the first semiconductor chip and the heat stage increases, and hence, a time period for heating the second semiconductor chip at this step can be shortened. Also, the area of touch between the rear surface of the second semiconductor chip and the heat stage increases, and hence, a time period for heating the second semiconductor chip can be shortened at the wire bonding step. As a result, the production efficiency of the semiconductor device can be heightened.

BEST MODES FOR CARRYING OUT THE INVENTION

Now, embodiments of the present invention will be described in detail with reference to the drawings. Incidentally, throughout the drawings for describing the embodiments, the same symbols are assigned to parts having the same functions, which shall be omitted from repeated explanation.

EMBODIMENT 1

In this embodiment, there will be described an example in which the present invention is applied to a semiconductor device of TSOP type being a bidirectional lead array structure.

Figure 1:
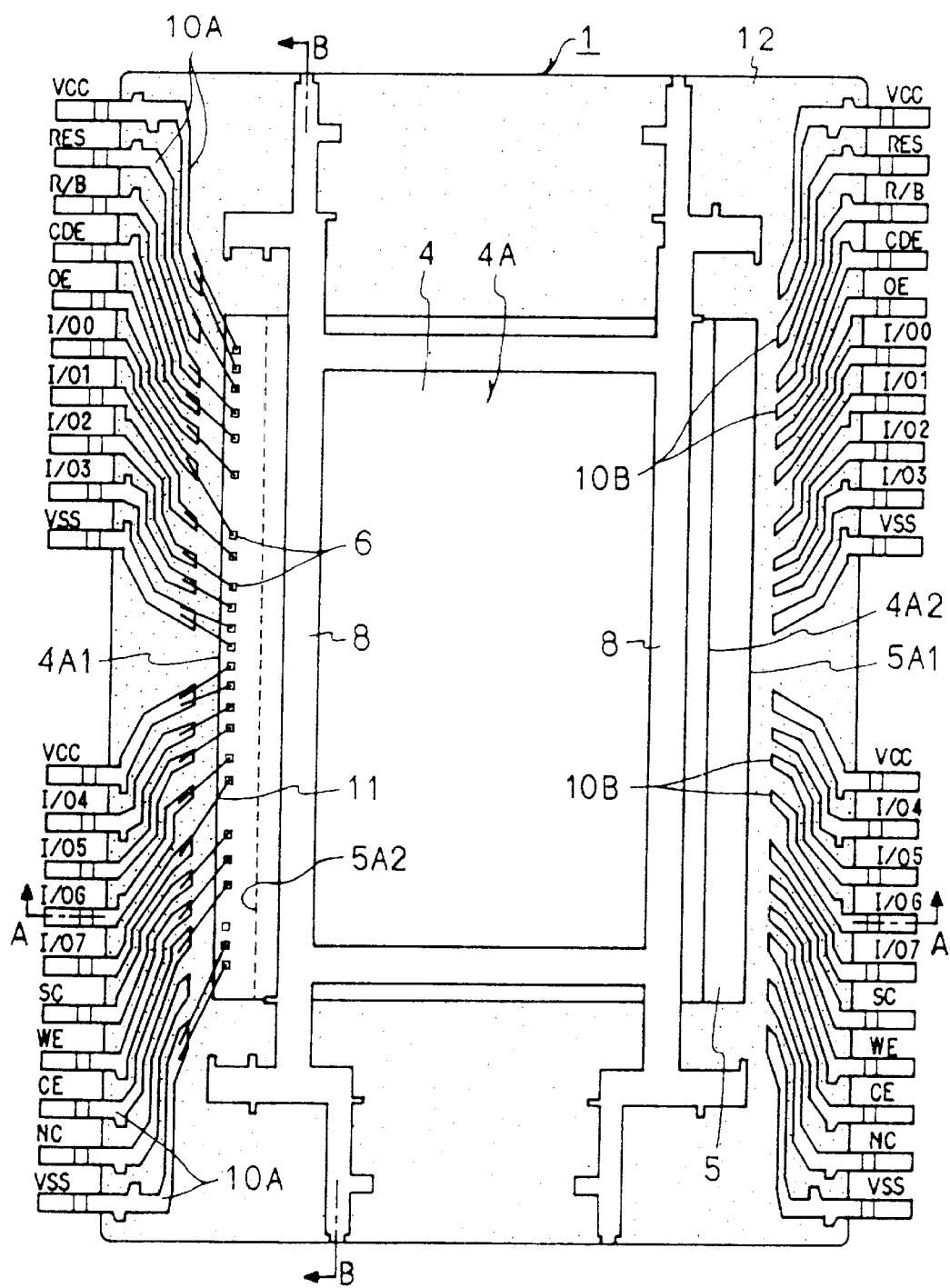
FIG. 1 is a plan view of a semiconductor device being Embodiment of the present invention in a state where the upper part of a resin body has been removed.
Figure 2:
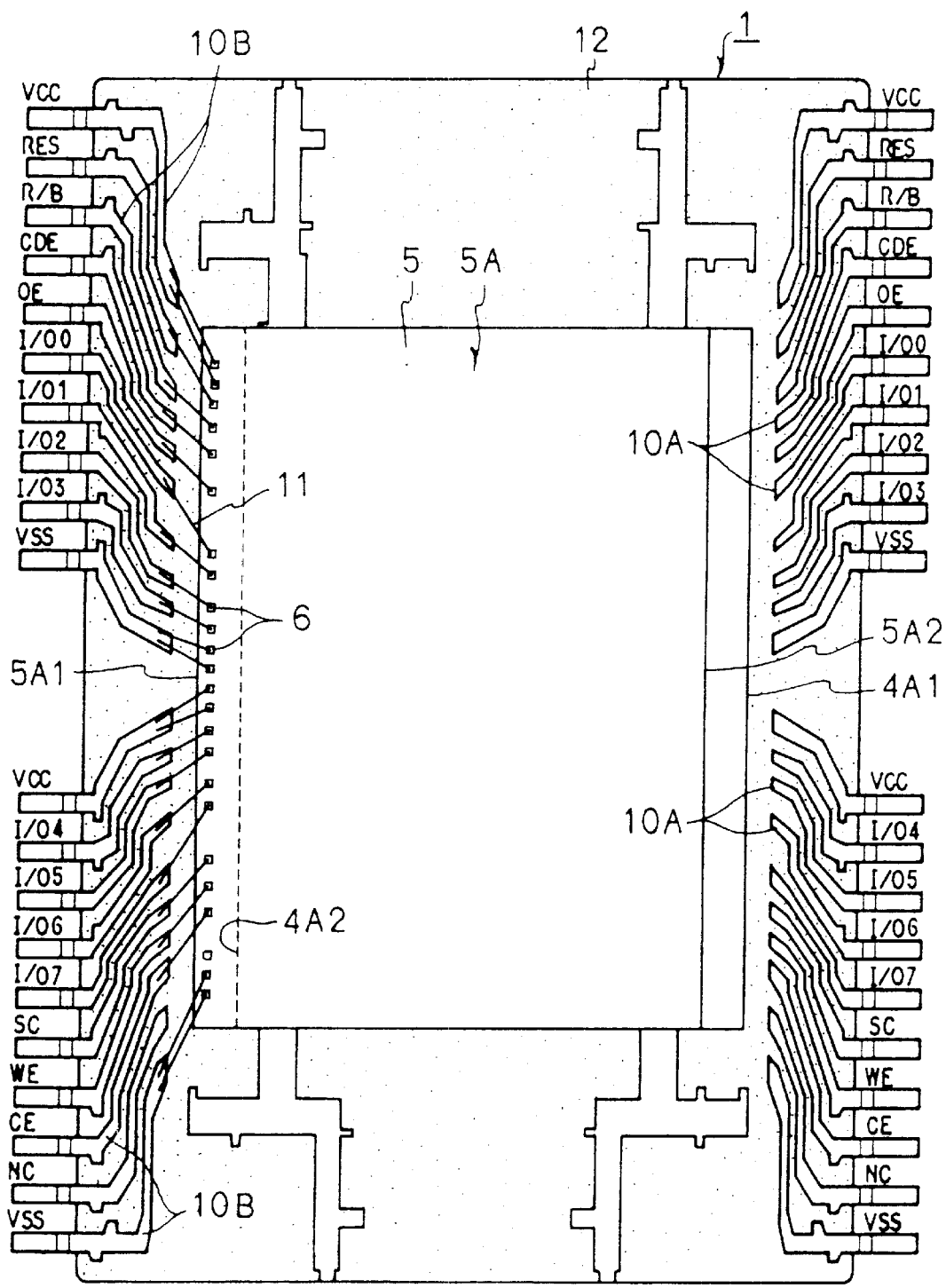
FIG. 2 is a bottom view of the semiconductor device being Embodiment 1 of the present invention in a state where the lower part of the resin body has been removed.
Figure 3:
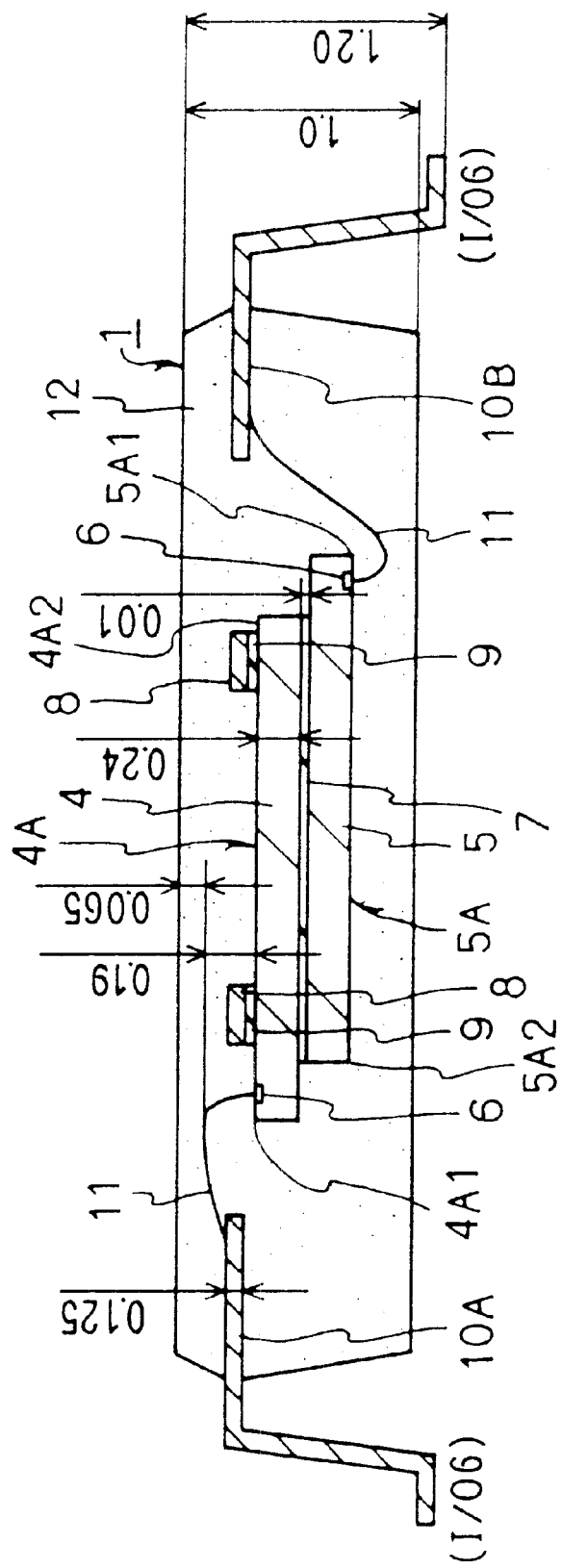
FIG. 3 is a sectional view taken along line A—A indicated in FIG. 1.
Figure 4:
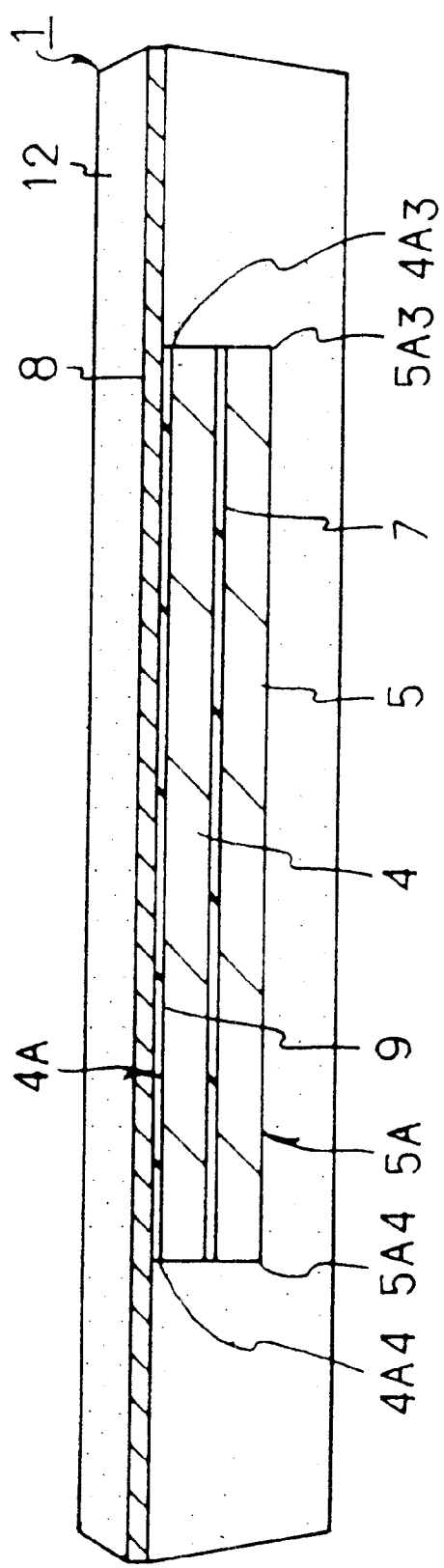
FIG. 4 is a sectional view taken along line B—B indicated in FIG. 1.

FIG. 1 is a plan view of a semiconductor device being Embodiment 1 of the present invention in a state where the upper part of a resin body has been removed, FIG. 2 is a bottom view of the semiconductor device in a state where the lower part of the resin body has been removed, FIG. 3 is a sectional view taken along line A—A indicated in FIG. 1, and FIG. 4 is a sectional view taken along line B—B indicated in FIG. 1. By the way, in FIGS. 1 and 2, a group of leads on the left side shown in FIG. 1 correspond to a group of leads on the right side shown in FIG. 2, while a group of leads on the right side shown in FIG. 1 correspond to a group of leads on the left side shown in FIG. 2.

As illustrated in FIGS. 1, 2 and 3, the semiconductor device 1 of this embodiment is so constructed that a semiconductor chip 4 and a semiconductor chip 5 are stacked one over the other, and that the semiconductor chips 4 and 5 are encapsulated with the one resin body 12. The semiconductor chips 4, 5 are stacked in a state where the rear surfaces (the other principal surfaces) of the front and rear surfaces of these semiconductor chips (each of which has one principal surface and the other principal surface opposing to each other) are faced to each other.

Both the semiconductor chips 4, 5 are formed in the same geometries. Besides, the planar shape of each of the semiconductor chips 4, 5 is a square shape, which is, for example, a rectangle in this embodiment.

By way of example, each of the semiconductor chips 4, 5 chiefly includes a semiconductor substrate which is made of single-crystal silicon, and multiple wiring layers which are formed on the semiconductor substrate. An EEPROM (Electrically Erasable Programmable Read Only Memory) of 64 [Mbits] called "flash memory", for example, is constructed as a storage circuit subsystem in each of the semiconductor chips 4, 5.

In a circuit forming surface 4A which is the front surface (one principal surface) of the front and rear surfaces (one principal surface and the other principal surface opposing to each other) of the semiconductor chip 4, a plurality of electrodes (bonding pads) 6 are formed on the side of one longer latus 4A1 of the two longer latera of this surface 4A opposing to each other and along this longer latus 4A1 (refer to FIG. 1 and FIG. 3). The plurality of electrodes 6 are respectively formed in the uppermost one of the multiple wiring layers of the semiconductor chip 4. The uppermost wiring layer is covered with a front surface protection film (final protection film) which is formed overlying this wiring layer, and which is formed with bonding openings for denuding the front surfaces of the electrodes 6.

In a circuit forming surface 5A which is the front surface (one principal surface) of the front and rear surfaces (one principal surface and the other principal surface opposing to each other) of the semiconductor chip 5, a plurality of electrodes 6 are formed on the side of one longer latus 5A1 of the two longer latera of this surface 5A opposing to each other and along this longer latus 5A1 (refer to FIG. 2 and FIG. 3). The plurality of electrodes 6 are respectively formed in the uppermost one of the multiple wiring layers of the semiconductor chip 5. The uppermost wiring layer is covered with a front surface protection film (final protection film) which is formed overlying this wiring layer, and which is formed with bonding openings for denuding the front surfaces of the electrodes 6.

The circuit pattern of the flash memory constructed in the semiconductor chip 4 is the same as that of the flash memory constructed in the semiconductor chip 5. Besides, the arrangement pattern of the electrodes 6 formed on the circuit forming surface 4A of the semiconductor chip 4 is the same as that of the electrodes 6 formed on the circuit forming surface 5A of the semiconductor chip 5. That is, the semiconductor chip 4 and the semiconductor chip 5 are constructed with the same structures each other.

The planar shape of the resin body 12 is a square shape, which is, for example, a rectangle in this embodiment. A plurality of leads 10A are arrayed on the side of one longer latus of the two longer latera of the resin body 12 opposing to each other and along this longer latus (one longer latus), while a plurality of leads 10B are arrayed on the side of the other longer latus and along this longer latus (the other longer latus). The plurality of leads 10A are extended inside and outside the resin body 12, they are arranged outside one longer latus 4A1 of the semiconductor chip 4, and they are electrically connected to the corresponding electrodes 6 of the semiconductor chip 4 through pieces of conductive wire 11, respectively (refer to FIG. 1 and FIG. 3). The plurality of leads 10B are extended inside and outside the resin body 12, they are arranged outside the other longer latus 4A2 of the semiconductor chip 4 opposing to one longer latus 4A1 thereof, and they are electrically connected to the corresponding electrodes 6 of the semiconductor chip 5 through pieces of conductive wire 11, respectively (refer to FIG. 2 and FIG. 3).

Terminal names are given to the plurality of leads 10A, 10B, respectively. A "VCC terminal" is a supply potential terminal whose potential is fixed to a power supply potential (for example, 5 [V]). A "VSS terminal" is a reference potential terminal whose potential is fixed to a reference potential (for example, 0 [V]). An "I/O0 terminal"~ an "I/O7 terminal" are data input/output terminals. An "RES terminal" is a reset terminal. An "R/B terminal" is a ready/busy terminal. A "CDE terminal" is a command data enable terminal. An "OE terminal" is an output enable terminal. An "SC terminal" is a serial clock terminal. A "WE terminal" is a write enable terminal. A "CE terminal" is a chip enable terminal. An "NC terminal" is a no-connection terminal.

The semiconductor chips 4, 5 are bonded and fixed to each other through an adhesive layer 7 in the state in which the rear surfaces of these semiconductor chips are faced to each other so that the other longer latus 4A2 of the semiconductor chip 4 and one longer latus 5A1 of the semiconductor chip 5 may confront (lie on) the side of the leads 10B. In other words, the semiconductor chips 4, 5 are bonded. and fixed to each other in the state in which the rear surfaces of these semiconductor chips are faced to each other so that the latera of the respective semiconductor chips with the electrodes 6 arrayed thereon may lie on the opposite sides. In addition, both the semiconductor chips 4, 5 are supported by supporting leads 8. The supporting leads 8 are bonded and fixed to the circuit forming surface 4A of the semiconductor chip 4 through an adhesive layer 9.

For these reasons, any tab does not exist between the semiconductor chip 4 and the semiconductor chip 5, so that a distance from the circuit forming surface 4A of the semiconductor chip 4 to the circuit forming surface 5A of the semiconductor chip 5 can be shortened. Moreover, since only the single adhesive layer 7 exists between the semiconductor chip 4 and the semiconductor chip 5, the distance from the circuit forming surface 4A of the semiconductor chip 4 to the circuit forming surface 5A of the semiconductor chip 5 can be shortened. Furthermore, since the supporting leads 8 are bonded and fixed to the circuit forming surface 4A of the semiconductor chip 4, the thickness of each of the supporting leads 8 is cancelled by the loop height of the wire pieces 11 for electrically connecting the electrodes 6 of the semiconductor chip 4 with the leads 10A, and the thickness of the resin body 12 is not affected by the supporting leads 8.

The semiconductor chips 4, 5 are bonded and fixed in a state where the positions of these semiconductor chips are staggered relatively to each other so that the electrodes 6 of the semiconductor chip 4 may lie outside the other longer latus 5A2 of the semiconductor chip 5 opposing to one longer latus 5A1 thereof, and that the electrodes 6 of the semiconductor chip 5 may lie outside the other longer latus 4A2 of the semiconductor chip 4. In other words, the semiconductor chips 4 and 5 are bonded and fixed in a state where the positions of these semiconductor chips are relatively shifted in a direction orthogonal to the direction of arraying the electrodes 6.

Each of the leads 10A and the leads 10B includes an inner portion (inner lead portion) which is encapsulated with the resin body 12, and an outer portion (outer lead portion) which is led outside the resin body 12. The outer portions are molded into, for example, a gull-wing shape as a flat mounting shape.

Gold (Au) wire, for example, is employed as the conductive wire 11. By way of example, bonding in which ultrasonic vibrations are used conjointly with thermocompression is employed as a method of connecting the wire 11.

In order to attain a lower stress, the resin body 12 is formed of, for example, a biphenyl-based resin which is doped with a phenolic hardener, silicone rubber, a filler, or the like. The resin body 12 is formed by transfer molding which is well suited for mass production. The transfer molding is a method wherein, using a metal mold which includes a pot, a runner, a pouring gate and a cavity, a resin is injected under pressure from the pot into the cavity through the runner as well as the pouring gate, thereby to form a resin body.

Referring to FIG. 3, the thickness of each of the semiconductor chips 4, 5 is 0.24 [mm], the thickness of the adhesive layer 7 is 0.01 [mm], the thickness of each of the leads 10A and leads 10B is 0.125 [mm], the height (loop height) from the circuit forming surface 4A of the semiconductor chip 4 to the top of the wire 11 for electrically connecting the electrodes 6 of this semiconductor chip 4 with the leads 10A is 0.19 [mm], an interval from the top of the wire 11 to the upper surface of the resin body 12 is 0.065 [mm], the thickness of the resin body 11 is 1.0 [mm], and a height from the upper surface of the resin body 12 to the mounting surface of the leads (10A, 10B) is 1.20 [mm]. Incidentally, although not shown in the figure, a height from the circuit forming surface 5A of the semiconductor chip 5 to the top of the wire 11 for electrically connecting the electrodes 6 of this semiconductor chip 5 with the leads 10B is 0.19 [mm], and an interval from the top of the wire 11 to the lower surface of the resin body 11 is 0.065 [mm].

The upper surface of each of the supporting leads (suspension leads) 8 is lower than the top of the wire 11. As shown in FIG. 4, the supporting leads 8 extend so as to traverse the two shorter latera 4A3 and 4A4 of the semiconductor chip 4 opposing to each other. By the way, in FIG. 4, symbol 5A3 denotes one of the two shorter latera of the semiconductor chip 5 opposing to each other, and symbol 5A4 denotes the other shorter latus.

Figure 5:
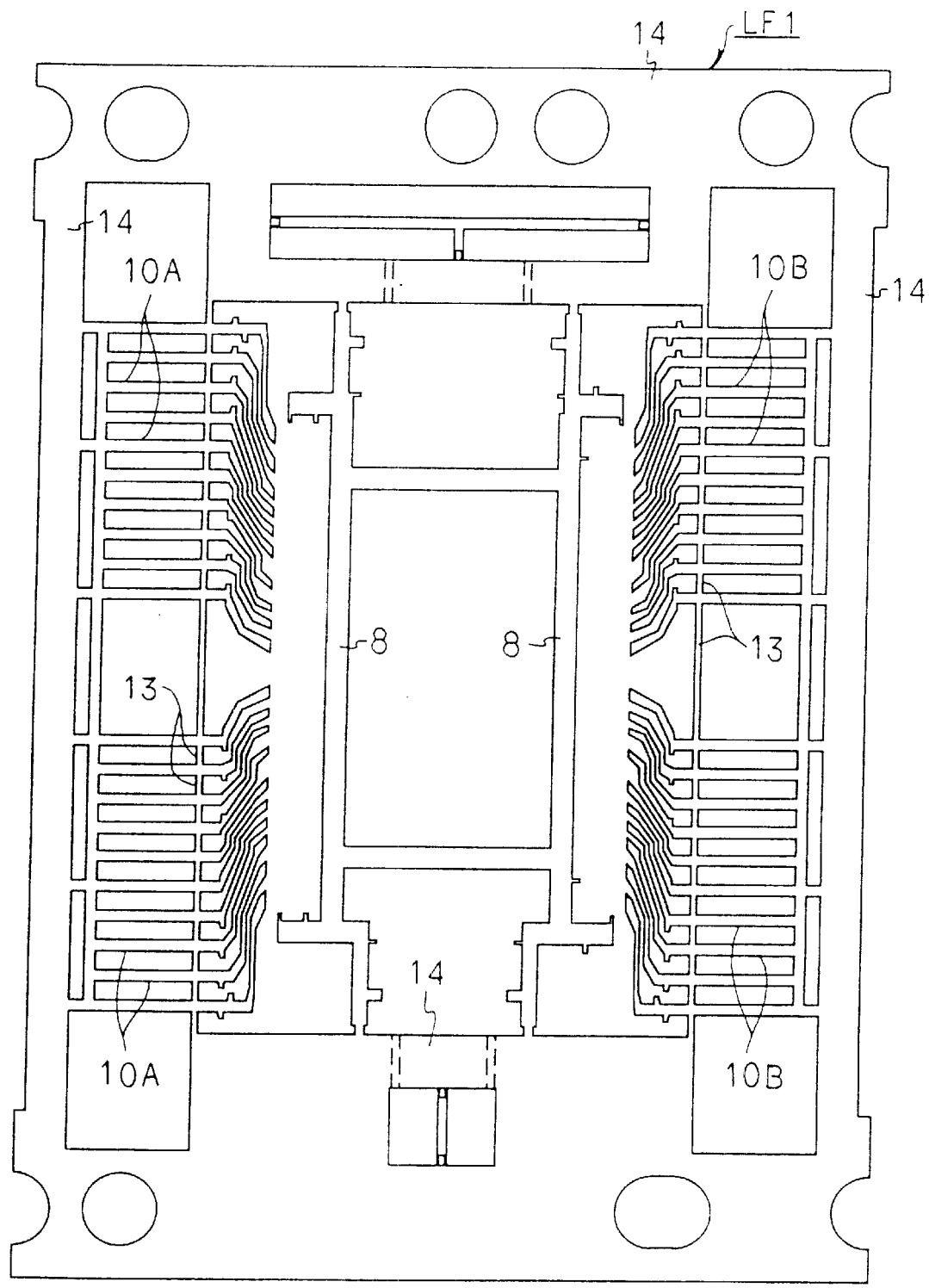
FIG. 5 is a plan view of a lead frame which is used in a manufacturing process for the semiconductor device being Embodiment 1 of the present invention.

Next, a lead frame for use in a process for manufacturing the semiconductor device 1 will be described with reference to FIG. 5. FIG. 5 is a plan view of the lead frame. Incidentally, actual lead frames have a multiple string structure so that a plurality of semiconductor devices can be manufactured. For the brevity of illustration, however, FIG. 5 shows one domain where one semiconductor device is manufactured.

As shown in FIG. 5, the lead frame LF1 is so constructed that a plurality of leads 10A, a plurality of leads 10B, supporting leads 8, etc. are arranged within a region which is defined by a frame member 14. The plurality of leads 10A are arrayed along one of the two longer latus parts of the frame member 14 opposing to each other, and are unitary with the longer latus part. The plurality of leads 10B are arrayed along the other of the two longer latus parts of the frame member 14 opposing to each other, and are unitary with the other longer latus part. The supporting leads 8 are arranged between a group of leads consisting of the plurality of leads 10A and a group of leads consisting of the plurality of leads 10B, and are unitary with the frame member 14. That is, the lead frame LF1 has a bidirectional lead array structure.

Each of the plurality of leads 10A includes an inner portion which is encapsulated with the resin body, and an outer portion which is led outside the resin body. The inner portions and the outer portions are coupled with each other through a tie bar 13. Likewise, each of the plurality of leads 10B includes an inner portion which is encapsulated with the resin body, and an outer portion which is led outside the resin body. The inner portions and the outer portions are coupled with each other through a tie bar 13.

By way of example, the lead frame LF1 is fabricated in such a way that a flat material, which is made of an iron (Fe)—nickel (Ni) alloy, or copper. (Cu) or a copper alloy, is subjected to an etching work or a press work so as to form a predetermined lead pattern.

Next, the process for manufacturing the semiconductor device 1 will be described with reference to FIG. 6 thru FIG. 9 (sectional views).

Figure 6:
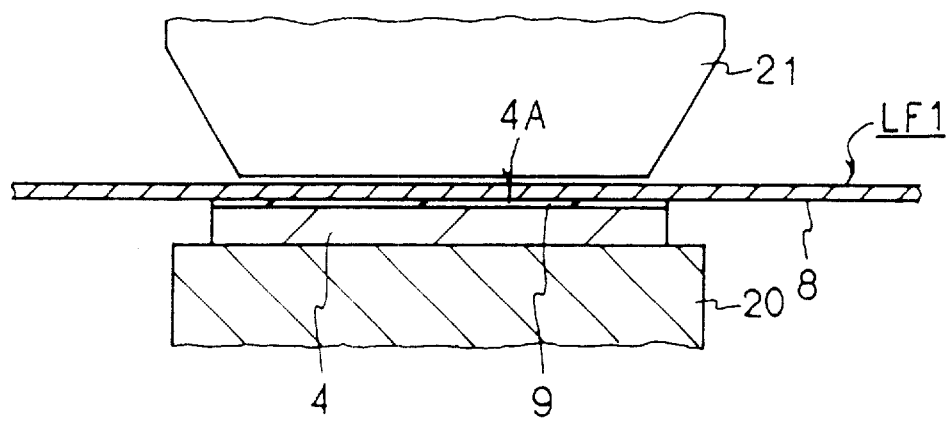
FIG. 6 is a sectional view for explaining the manufacture of the semiconductor device being Embodiment 1 of the present invention.

First, one semiconductor chip 4 is bonded and fixed onto the lead frame LF1. As shown in FIG. 6, the fixation between the lead frame LF1 and the semiconductor chip 4 is done in such a way that the semiconductor chip 4 is set on a heat stage 20, that the circuit forming surface 4A of the semiconductor chip 4 is thereafter coated with an adhesive made of, for example, a thermosetting resin, thereby to form the adhesive layer 9, and that the supporting leads 8 are thereafter pressedly secured onto the circuit forming surface 4A of the semiconductor chip 4 by a bonding tool 21.

Figure 7:
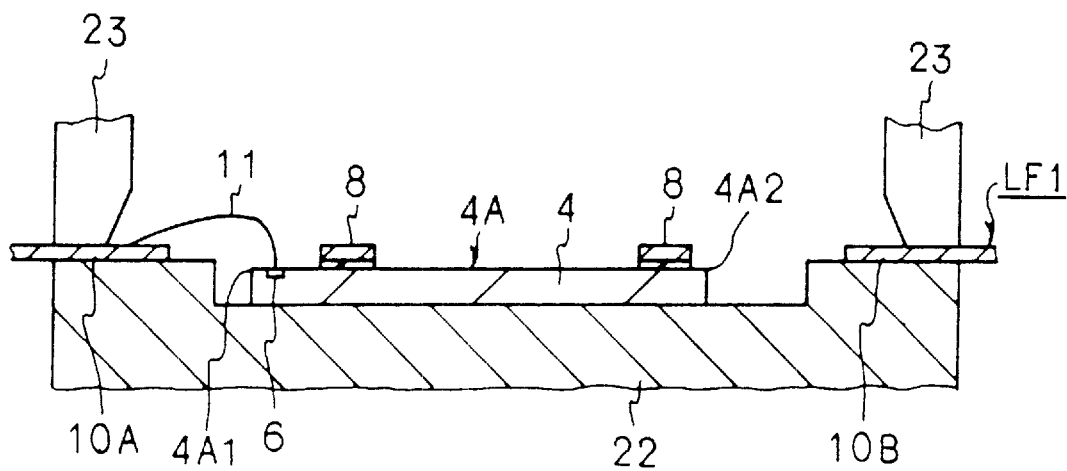
FIG. 7 is a sectional view for explaining the manufacture of the semiconductor device being Embodiment 1 of the present invention.

Subsequently, the electrodes 6 of the semiconductor chip 4 and the leads 10A are electrically connected by the conductive wire pieces 11. As shown in FIG. 7, the connections between the electrodes 6 of the semiconductor chip 4 and the leads 10A are done in a state where the semiconductor chip 4 is set on a heat stage 22, and where the leads 10A and leads 10B are thereafter pushed against the heat stage 22 by a frame keeping member 23. Gold (Au) wire, for example, is employed as the wire 11. Besides, a method of connecting the wire 11 is, for example, bonding in which ultrasonic vibrations are used conjointly with thermocompression.

Figure 8:
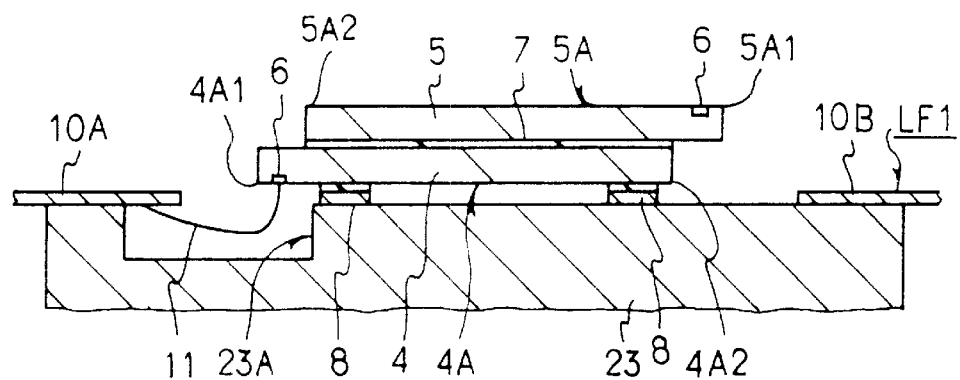
FIG. 8 is a sectional view for explaining the manufacture of the semiconductor device being Embodiment 1 of the present invention.

Subsequently, the semiconductor chip 5 is bonded and fixed to the semiconductor chip 4. As shown in FIG. 8, the fixation between the semiconductor chip 4 and the semiconductor chip 5 is done in such a way that the semiconductor chip 4 is set on a heat stage 23 with its circuit forming surface 4A facing downwards, that the rear surface of the semiconductor chip 4 is thereafter coated with an adhesive made of, for example, a silver (Ag) paste material, thereby to form the adhesive layer 7, and that the semiconductor chip 5 is thereafter secured onto the rear surface of the semiconductor chip 4 with its rear surface facing downwards. On this occasion, the rear surfaces of the respective semiconductor chips 4 and 5 are faced and bonded and fixed to each other in the state of specified orientation in which one longer latus 5A1 of the semiconductor chip 5 lies opposite to one longer latus 4A1 of the semiconductor chip 4. Besides, the rear surfaces of the respective semiconductor chips 4 and 5 are faced and bonded and fixed to each other in the state of staggered positions in which the electrodes 6 of the semiconductor chip 4 lie outside the other longer latus 5A2 of the semiconductor chip 5, and in which the electrodes 6 of the semiconductor chip 5 lie outside the other longer latus 4A2 of the semiconductor chip 4. Incidentally, at this step, the semiconductor chip 4 is set on the heat stage 23 with its circuit forming surface 4A facing downwards, and hence, the heat stage 23 is provided with a recess 23A in order to prevent this heat stage 23 from coming into touch with the wire 11.

Figure 9:
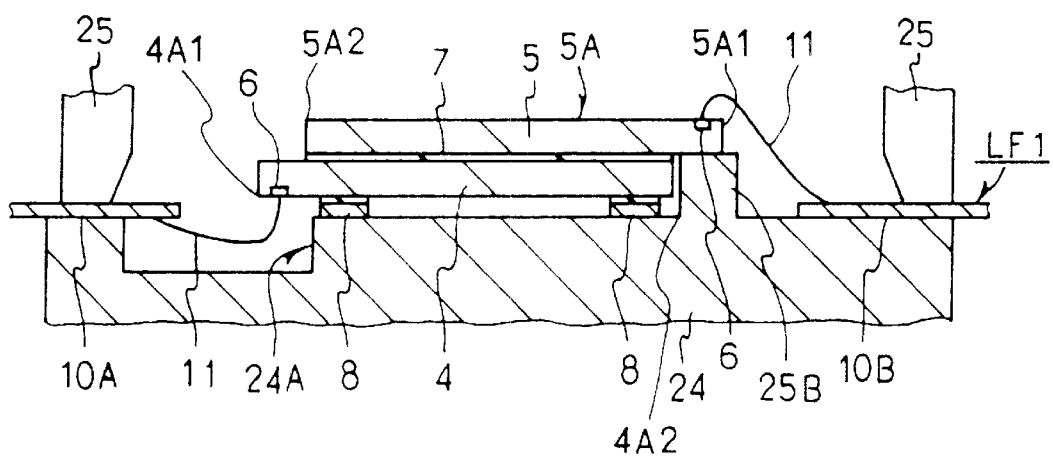
FIG. 9 is a sectional view for explaining the manufacture of the semiconductor device being Embodiment 1 of the present invention.

Subsequently, the electrodes 6 of the semiconductor chip 5 and the leads 10B are electrically connected by the conductive wire pieces 11. As shown in FIG. 9, the connections between the electrodes 6 of the semiconductor chip 5 and the leads 10B are done in a state where the semiconductor chips 4 and 5 are set on a heat stage 24 with the circuit forming surface 5A of the semiconductor chip 5 facing upwards, and where the leads 10A and leads 10B are thereafter pushed against the heat stage 24 by a frame keeping member 25. Gold (Au) wire, for example, is employed as the wire 11. Besides, a method of connecting the wire 11 is, for example, bonding in which ultrasonic vibrations are used conjointly with thermocompression. At this step, the partial region of the rear surface of the semiconductor chip 5 opposing to the electrodes 6 thereof is exposed. Therefore, the heat stage 24 is provided with a protrusion 25B beforehand so as to come into touch with the exposed partial region of the rear surface, whereby this partial region of the rear surface opposing to the electrodes 6 of the semiconductor chip 5 can be held in direct touch with the heat stage 24. More specifically, the rear surfaces of the respective semiconductor chips 4 and 5 are bonded and fixed to each other in the state of staggered positions in which the electrodes 6 of the semiconductor chip 4 lie outside the other longer latus 5A2 of the semiconductor chip 5 and in which the electrodes 6 of the semiconductor chip 5 lie outside the other longer latus 4A2 of the semiconductor chip 4, whereby the partial region of the rear surface of the semiconductor chip 5 opposing to the electrodes 6 thereof can be held in direct touch with the heat stage 24, and the heat of the heat stage 24 can be effectively conducted to the electrodes 6 of the semiconductor chip 5, so that the inferior connections between the electrodes 6 of the semiconductor chip 5 and the wire pieces 11 can be relieved. Incidentally, at this step, the semiconductor chip 4 is set on the heat stage 24 with its circuit forming surface 4A facing downwards, and hence, the heat stage 24 is provided with a recess 24A in order to prevent this heat stage 24 from coming into touch with the wire 11.

Subsequently, the semiconductor chip 4, the semiconductor chip 5, the supporting leads 8, the inner portions of the leads 10A, the inner portions of the leads 10B, and the wire pieces 11 are encapsulated with a resin, thereby to form the resin body 12. The formation of the resin body 12 is done by transfer molding.

Subsequently, the tie bar 13 coupled to the leads 10A and the tie bar 13 coupled to the leads 10B are cut away, the outer portions of the respective leads 10A and 10B are thereafter subjected to a plating treatment, the leads 10A and 10B are thereafter cut away from the frame member 14 of the lead frame LF1, the outer portions of the respective leads 10A and 10B are thereafter molded into, for example, a gull-wing shape as a flat mounting shape, and the supporting leads 8 are thereafter cut away from the frame member 14 of the lead frame LF1. In this way, the semiconductor device 1 shown in FIGS. 1, 2 and 3 is substantially completed.

Figure 10:
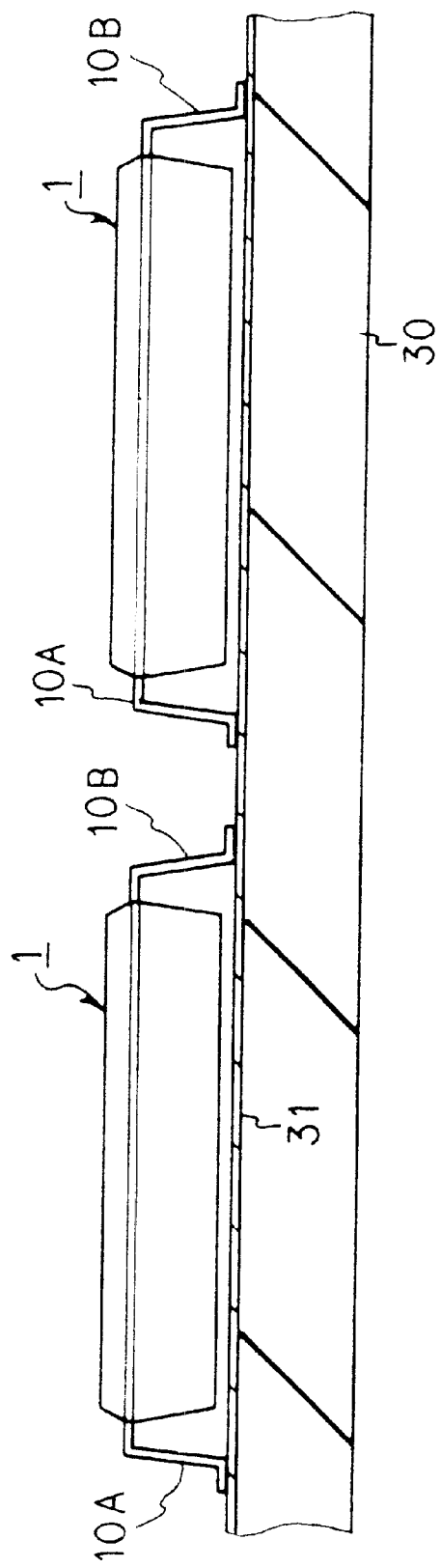
FIG. 10 is a sectional view of essential portions in a state where the semiconductor device being Embodiment 1 of the present invention is packaged on a mounting substrate.

As shown in FIG. 10 (a sectional view of essential portions), a plurality of semiconductor devices 1 thus constructed are packaged on a mounting substrate 30 as the constituent components of an electron device which constructs one circuit system. Since each semiconductor device 1 has the leads of the same functions arranged in opposition, wiring lines 31 for electrically connecting the leads 10A with the leads 10B can be rectilinearly laid. Moreover, wiring lines 31 for electrically connecting the leads 10B of one semiconductor device 1 with the leads 10A of another semiconductor device 1 can be rectilinearly laid. Accordingly, the number of wiring layers of the mounting substrate 30 can be decreased, and hence, the electron device, for example, a memory module can be structurally thinned.

As described above, the following effects are attained in accordance with this embodiment:

(1) The semiconductor chip 4 and the semiconductor chip 5 are bonded and fixed to each other in the state in which the rear surfaces of these semiconductor chips are faced to each other so that the other longer latus 4A2 of the semiconductor chip 4 and one longer latus 5A1 of the semiconductor chip 5 may confront the side of the leads 10B, and the supporting leads 8 are bonded and fixed to the circuit forming surface 4A of the semiconductor chip 4.

For these reasons, any tab does not exist between the semiconductor chip 4 and the semiconductor chip 5, so that a distance from the circuit forming surface 4A of the semiconductor chip 4 to the circuit forming surface 5A of the semiconductor chip 5 can be shortened. Moreover, since only one adhesive layer exists between the semiconductor chip 4 and the semiconductor chip 5, the distance from the circuit forming surface 4A of the semiconductor chip 4 to the circuit forming surface 5A of the semiconductor chip 5 can be shortened. Furthermore, since the supporting leads 8 are bonded and fixed to the circuit forming surface 4A of the semiconductor chip 4, the thickness of each of the supporting leads 8 is cancelled by the loop height of the wire pieces 11, and the thickness of the resin body 12 is not affected by the supporting leads 8. As a result, the resin body 12 can be thinned, and hence, the thinned structure of the semiconductor device 1 can be achieved.

In addition, since the resin body 12 can be thinned without reducing the thickness of each of the semiconductor chips (4, 5), the thinned semiconductor device 1 of high available percentage can be offered.

Besides, since the resin body 12 can be thinned, the semiconductor device 1 in which the two semiconductor chips (4, 5) are stacked and then encapsulated with the one resin body 12 can be constructed as the TSOP type.

It is also dispensed with to use two lead frames or to use semiconductor chips of mirror inversion circuit patterns. It is therefore possible to achieve curtailment in the cost of the semiconductor device 1 and thinning in the structure thereof.

(2) The semiconductor chip 4 and the semiconductor chip 5 are bonded and fixed to each other in the state of staggered positions in which the electrodes 6 of the semiconductor chip 4 lie outside the other longer latus 5A2 of the semiconductor chip 5, and in which the electrodes 6 of the semiconductor chip 5 lie outside the other longer latus 4A2 of the semiconductor chip 4.

For this reason, at the wire bonding step, the partial region of the rear surface of the semiconductor chip 5 opposing to the electrodes 6 thereof can be held in direct touch with the heat stage 24, and the heat of the heat stage 24 can be effectively conducted to the electrodes 6 of the semiconductor chip 5, so that the inferior connections between the electrodes 6 of the semiconductor chip 5 and the wire pieces 11 can be relieved. As a result, the available percentage of the products of the semiconductor device 1 in the manufacturing process (assembling process) can be heightened.

By the way, although the example in which the supporting leads 8 are bonded and fixed to the circuit forming surface 4A of the semiconductor chip 4 has been explained in this embodiment, the supporting leads 8 may well be bonded and fixed to the circuit forming surface 5A of the semiconductor chip 5. In this case, the supporting leads 8 are subjected to a bending work for locating the chip fixation part of this supporting leads onto the side of the circuit forming surface 5A of the semiconductor chip 5. Even in such a case, the thickness of each of the supporting leads 8 is cancelled by the loop height of the wire pieces 11 for electrically connecting the electrodes 6 of the semiconductor chip 5 with the leads 10B, so that the thickness of the resin body 12 is not affected by the supporting leads 8.

EMBODIMENT 2

Figure 11:
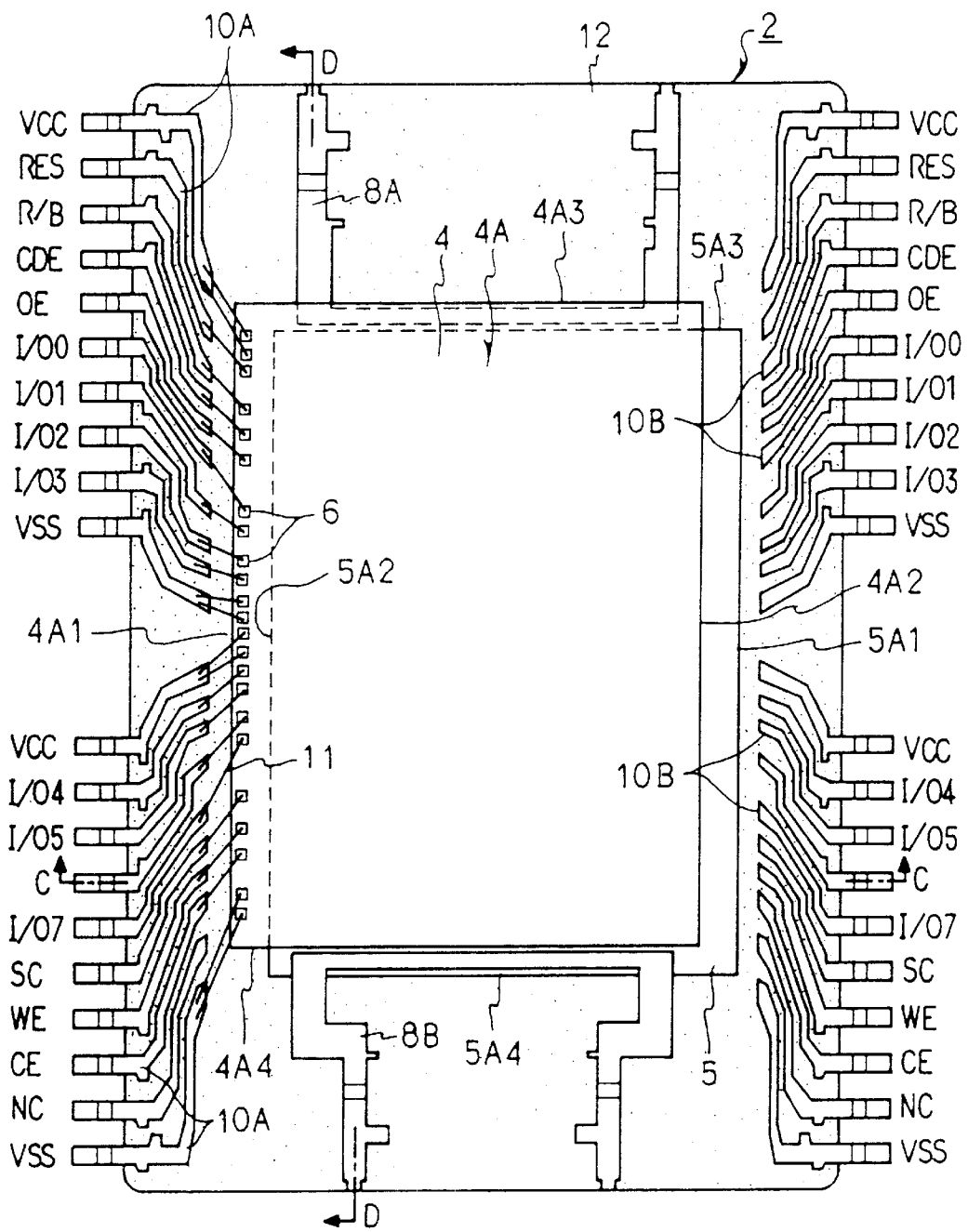
FIG. 11 is a plan view of a semiconductor device being Embodiment 2 of the present invention in a state where the upper part of a resin body has been removed.
Figure 12:
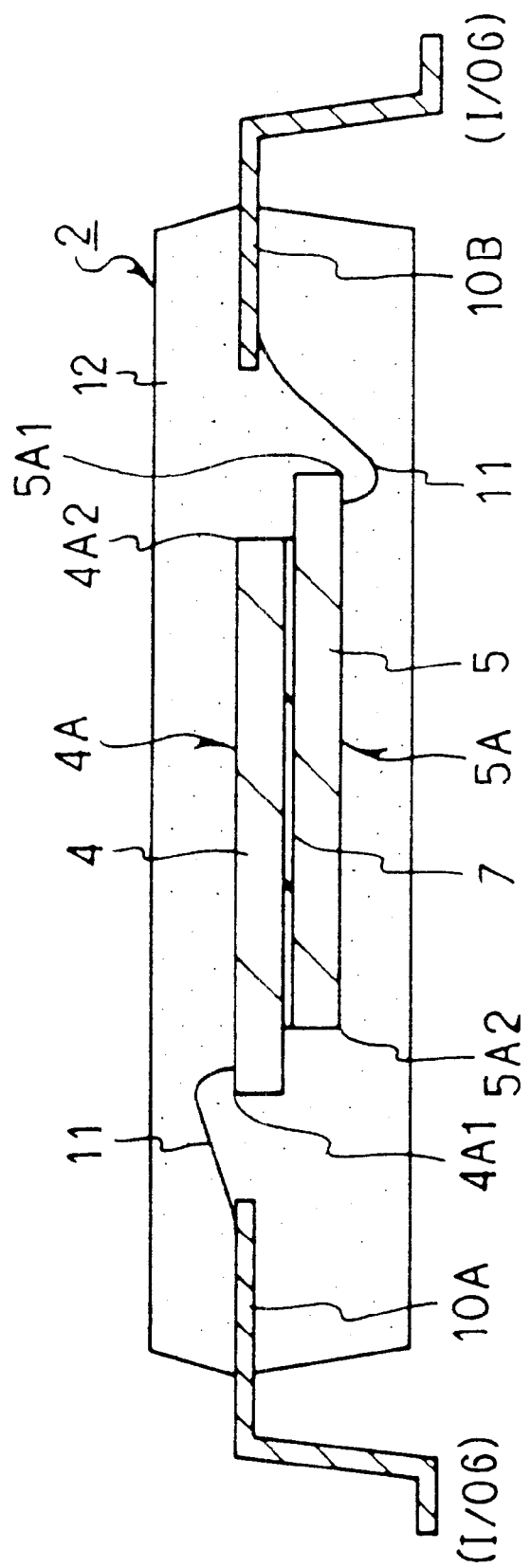
FIG. 12 is a sectional view taken along line C—C indicated in FIG. 11.
Figure 13:
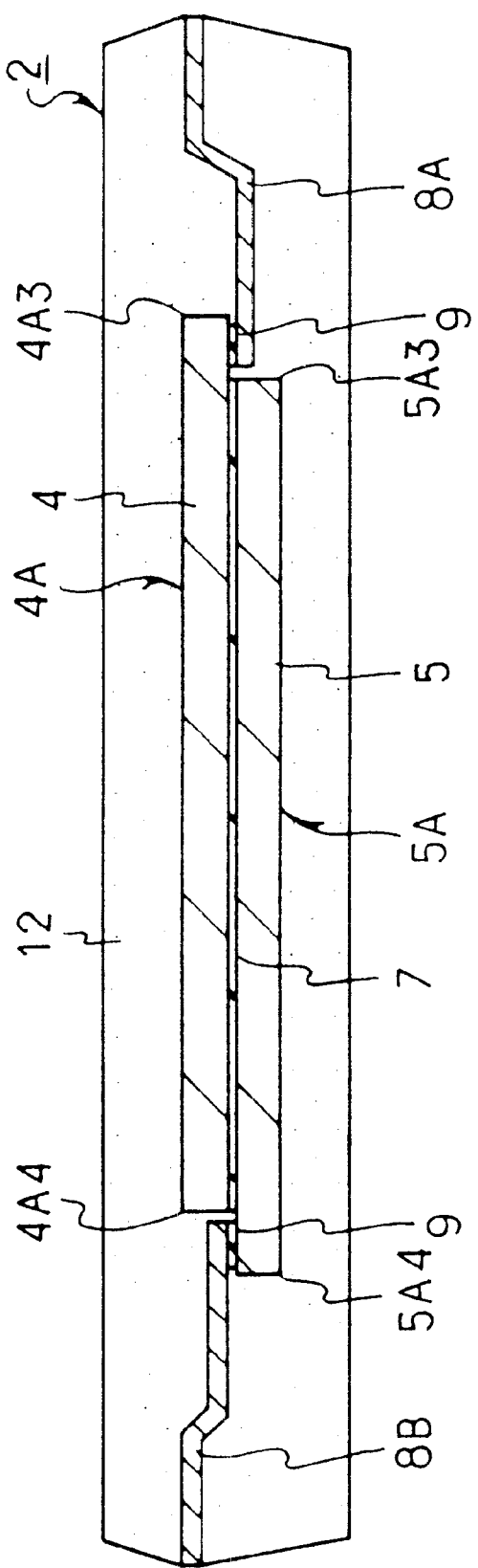
FIG. 13 is a sectional view taken along line D—D indicated in FIG. 11.

FIG. 11 is a plan view of a semiconductor device being Embodiment 2 of the present invention in a state where the upper part of a resin body has been removed, FIG. 12 is a sectional view taken along line C—C indicated in FIG. 11, and FIG. 13 is a sectional view taken along line D—D indicated in FIG. 11.

As illustrated in FIGS. 11, 12 and 13, the semiconductor device 2 of this embodiment has basically the same construction as that of Embodiment 1 described before, but it differs from the foregoing embodiment in constructional points explained below.

A semiconductor chip 4 and a semiconductor chip 5 are bonded and fixed in a state where the positions of these semiconductor chips are staggered relatively to each other so that one shorter latus 4A3 of the semiconductor chip 4 intersecting with one longer latus 4A1 thereof may lie outside one shorter latus 5A3 of the semiconductor chip 5 intersecting with one longer latus 5A1 thereof and lying on the same side as one shorter latus 4A3 of the semiconductor chip 4, and that the other shorter latus 5A4 of the semiconductor chip 5 opposing to one shorter latus 5A3 thereof may lie outside the other shorter latus 4A4 of the semiconductor chip 4 opposing to one shorter latus 4A3 thereof and lying on the same side as the other shorter latus 5A4 of the semiconductor chip 5. In other words, the semiconductor chips 4 and 5 are bonded and fixed in a state where the positions of these semiconductor chips are relatively shifted in the direction of arraying the electrodes 6 thereof.

Besides, the semiconductor device 2 includes a supporting lead 8A which is arranged outside one shorter latus 4A3 of the semiconductor chip 4 and one shorter latus 5A3 of the semiconductor chip 5, and a supporting lead 8B which is arranged outside the other shorter latus 4A4 of the semiconductor chip 4 and the other shorter latus 5A4 of the semiconductor chip 5. The supporting lead 8A is bonded and fixed to the rear surface of the semiconductor chip 4 through an adhesive layer 9, outside one shorter latus 5A3 of the semiconductor chip 5, while the supporting lead 8B is bonded and fixed to the rear surface of the semiconductor chip 5 through an adhesive layer 9, outside the other shorter latus 4A4 of the semiconductor chip 4.

The supporting lead 8A is subjected to a bending work for locating the chip fixation part of this supporting lead onto the side of the rear surface of the semiconductor chip 4, while the supporting lead 8B is subjected to a bending work for locating the chip fixation part of this supporting lead onto the side of the rear surface of the semiconductor chip 5.

Figure 14:
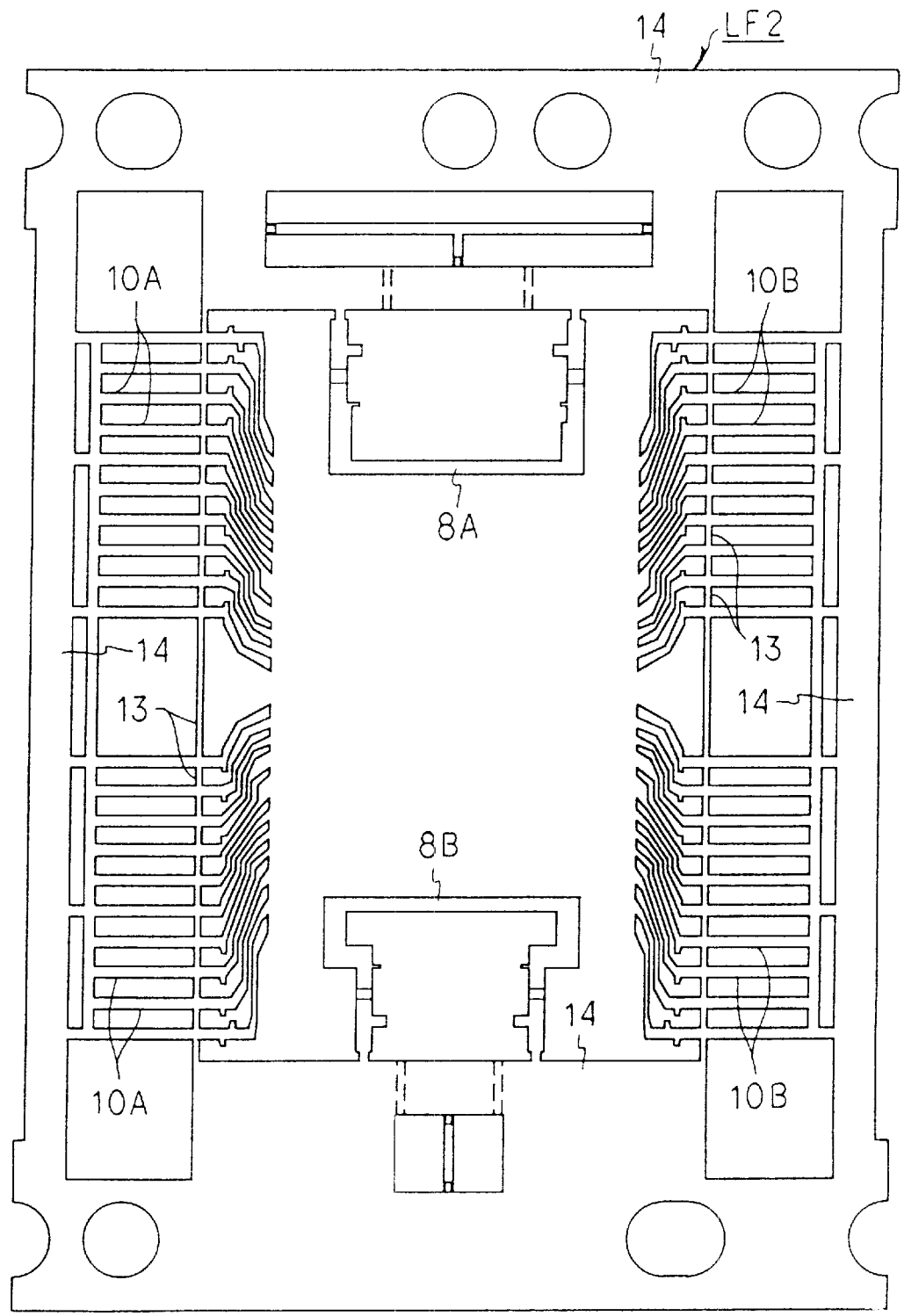
FIG. 14 is a plan view of a lead frame which is used in a manufacturing process for the semiconductor device being Embodiment 2 of the present invention.

The semiconductor device 2 thus constructed is manufactured by a manufacturing process which employs a lead frame LF2 shown in FIG. 14 (a plan view). The manufacture of the semiconductor device 2 of this embodiment is somewhat different from the manufacturing process described in the foregoing embodiment 1. More specifically, the semiconductor chip 4 and the semiconductor chip 5 are bonded and fixed in the state in which the rear surfaces of these semiconductor chips are faced to each other, and the respective semiconductor chips 4 and 5 are bonded and fixed to the supporting leads 8A and 8B, followed by wire bonding. The fixations between the supporting leads and the corresponding semiconductor chips can be done in such a way that the semiconductor chips 4 and 5 bonded and fixed are inserted aslant between the supporting lead 8A and the supporting lead 8B.

The wire bonding step is performed in such a way that the electrodes 6 of the semiconductor chip 4 and leads 10A are electrically connected by pieces of wire 11, and that the electrodes 6 of the semiconductor chip 5 and leads 10B are thereafter electrically connected by pieces of wire 11. Herein, the semiconductor chips 4 and 5 are bonded and fixed in the state in which the positions of these semiconductor chips are staggered in the direction of arraying the electrodes 6. Therefore, when the electrodes 6 of the semiconductor chip 4 are connected with the leads 10A by the wire pieces 11, a heat stage can be held in touch with, the partial region of the rear surface of the semiconductor chip 4 opposing to the region of the side of one shorter latus 4A3 thereof, though not directly but through the supporting lead 8A. Besides, when the electrodes 6 of the semiconductor chip 5 are connected with the leads 10B by the wire pieces 11, the heat stage can be held in touch with the partial region of the rear surface of the semiconductor chip 5 opposing to the region of the side of the other shorter latus 5A4 thereof, though not directly but through the supporting lead 8B.

In this manner, the semiconductor chip 4 and the semiconductor chip 5 are bonded and fixed to each other in the state in which the positions of these semiconductor chips are staggered so that one shorter latus 4A3 of the semiconductor chip 4 may lie outside one shorter latus 5A3 of the semiconductor chip 5 and that the other shorter latus 5A4 of the semiconductor chip 5 may lie outside the other shorter latus 4A4 of the semiconductor chip 4, and the supporting lead 8A is bonded and fixed to the rear surface of the semiconductor chip 4 outside one shorter latus 5A3 of the semiconductor chip 5, while the supporting lead 8B is bonded and fixed to the rear surface of the semiconductor chip 5 outside the other shorter latus 4A4 of the semiconductor chip 4. Therefore, any tab does not exist between the semiconductor chip 4 and the semiconductor chip 5, so that a distance from the circuit forming surface 4A of the semiconductor chip 4 to the circuit forming surface 5A of the semiconductor chip 5 can be shortened.

Besides, since only one adhesive layer exists between the semiconductor chip 4 and the semiconductor chip 5, the distance from the circuit forming surface 4A of the semiconductor chip 4 to the circuit forming surface 5A of the semiconductor chip 5 can be shortened.

In addition, the supporting lead 8A is bonded and fixed to the rear surface of the semiconductor chip 4 led outside one shorter latus 5A3 of the semiconductor chip 5, and the supporting lead 8B is bonded and fixed to the rear surface of the semiconductor chip 5 led outside the other shorter latus 4A4 of the semiconductor chip 4, so that the thickness of each of the supporting leads 8A, 8B is cancelled by the thickness from the circuit forming surface 4A of the semiconductor chip 4 to the circuit forming surface 5A of the semiconductor chip 5, and the thickness of the resin body 12 is not affected by the supporting leads 8A, 8B.

As a result, effects similar to those of the foregoing embodiment 1 are attained.

Moreover, the semiconductor chip 4 and the semiconductor chip 5 are bonded and fixed in the state in which the positions of these semiconductor chips are staggered relatively to each other so that one shorter latus 4A3 of the semiconductor chip 4 intersecting with one longer latus 4A1 thereof may lie outside one shorter latus 5A3 of the semiconductor chip 5 intersecting with one longer latus 5A1 thereof and lying on the same side as one shorter latus 4A3 of the semiconductor chip 4, and that the other shorter latus 5A4 of the semiconductor chip 5 opposing to one shorter latus 5A3 thereof may lie outside the other shorter latus 4A4 of the semiconductor chip 4 opposing to one shorter latus 4A3 thereof and lying on the same side as the other shorter latus 5A4 of the semiconductor chip 5. At the wire bonding step, therefore, the area of touch between the rear surface of the semiconductor chip 4 and the heat stage (24) increases, and hence, a time period for heating the semiconductor chip 4 at this step can be shortened. Also, the area of touch between the rear surface of the semiconductor chip 5 and the heat stage (24) increases, and hence, a time period for heating the semiconductor chip 5 can be shortened at the wire bonding step. As a result, the production efficiency of the semiconductor device 2 can be heightened.

EMBODIMENT 3

Figure 15:
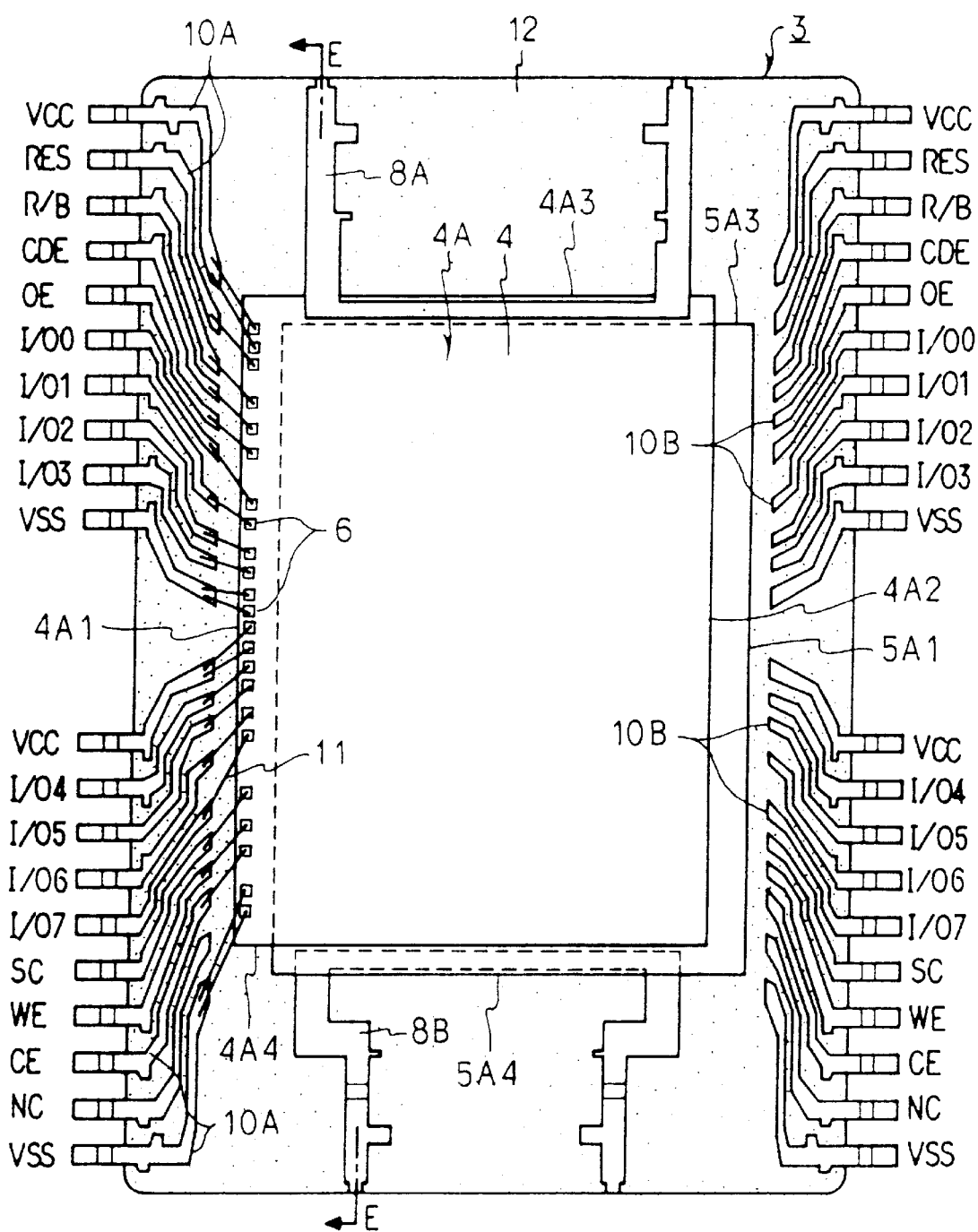
FIG. 15 is a plan view of a semiconductor device being Embodiment 3 of the present invention in a state where the upper part of a resin body has been removed.
Figure 16:
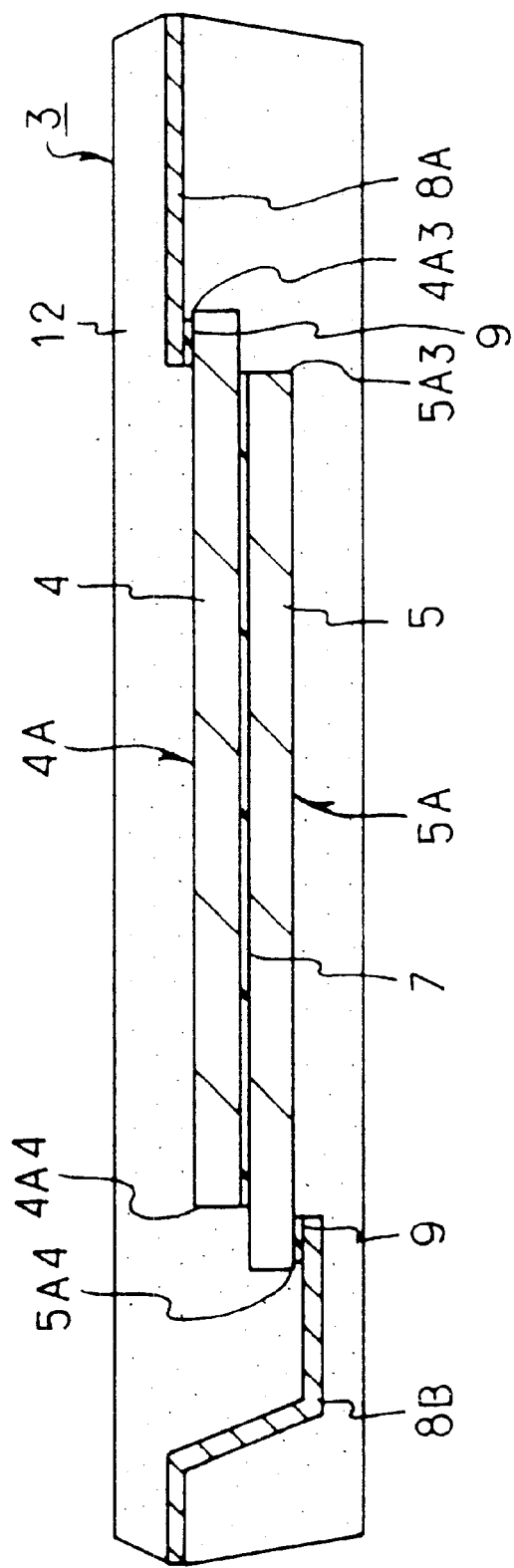
FIG. 16 is a sectional view taken along line E—E indicated in FIG. 15.

FIG. 15 is a plan view of a semiconductor device being Embodiment 3 of the present invention in a state where the upper part of a resin body has been removed, while FIG. 16 is a sectional view taken along line E—E indicated in FIG. 15.

As illustrated in FIGS. 15 and 16, the semiconductor device 3 of this embodiment has basically the same construction as that of Embodiment 2 described before, but it differs from the foregoing embodiment in constructional points explained below.

A supporting lead 8A is bonded and fixed on the side of one shorter latus 4A3 of the circuit forming surface 4A of a semiconductor chip 4, while a supporting lead 8B is bonded and fixed on the side of the other shorter latus 5A4 of the circuit forming surface 5A of a semiconductor chip 5.

Although the supporting lead 8A is not subjected to any bending work, the supporting lead 8B is subjected to a bending work for locating the chip fixation part of this supporting lead onto the side of the circuit forming surface 5A of the semiconductor chip 5.

Figure 17:
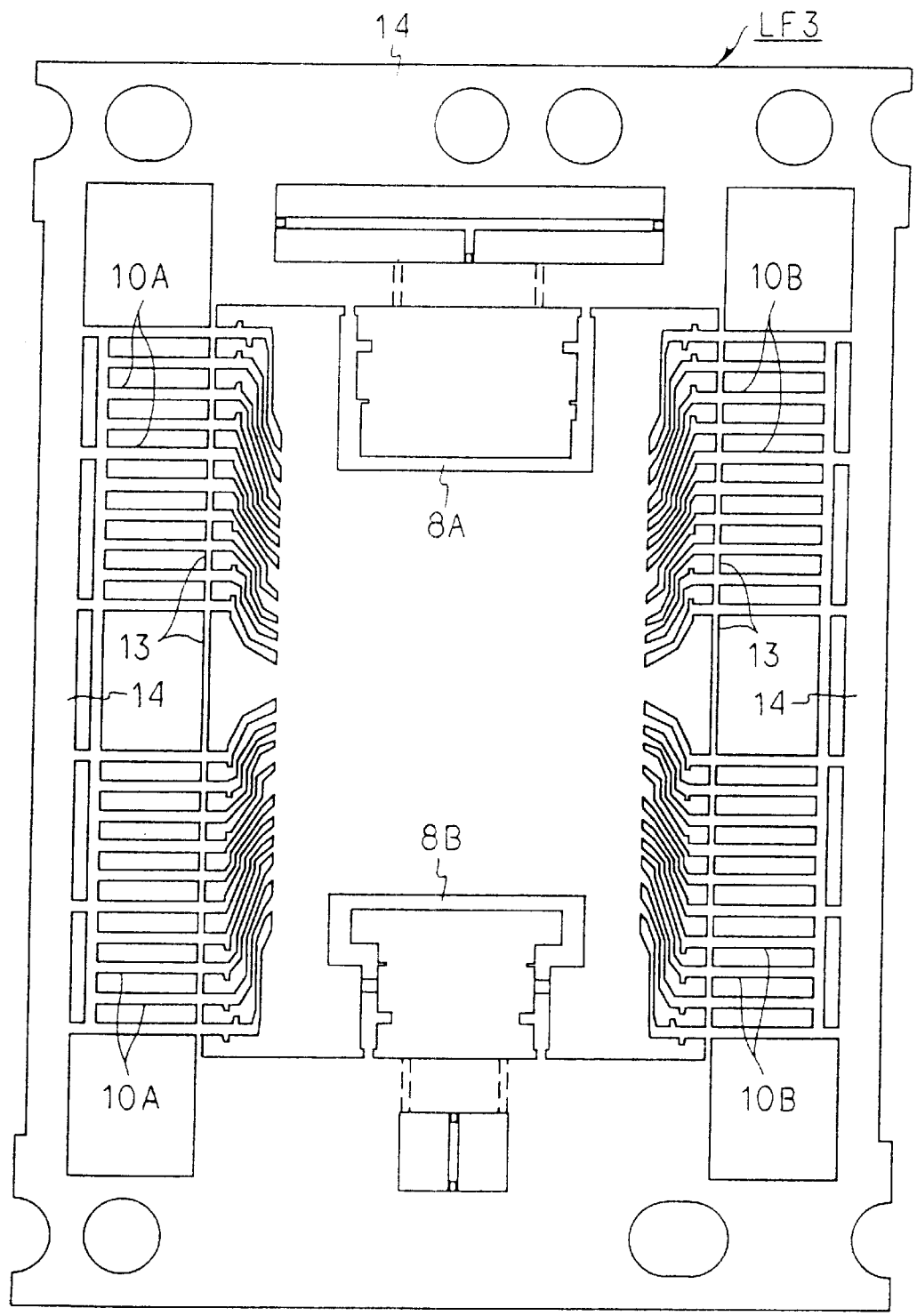
FIG. 17 is a plan view of a lead frame which is used in a manufacturing process for the semiconductor device being Embodiment 3 of the present invention.

The semiconductor device 3 thus constructed is manufactured by a manufacturing process which employs a lead frame LF3 shown in FIG. 17 (a plan view). Likewise to the manufacturing process described in the foregoing embodiment 2, the manufacture of the semiconductor device 3 of this embodiment is so performed that the semiconductor chip 4 and the semiconductor chip 5 are bonded and fixed in a state where the rear surfaces of these semiconductor chips are faced to each other, and that the respective semiconductor chips 4 and 5 are bonded and fixed to the supporting leads 8A and 8B, followed by wire bonding. The fixations between the supporting leads and the corresponding semiconductor chips can be done in such a way that the semiconductor chips 4 and 5 bonded and fixed are inserted aslant between the supporting lead 8A and the supporting lead 8B.

The wire bonding step is performed in such a way that the electrodes 6 of the semiconductor chip 4 and leads 10A are electrically connected by pieces of wire 11, and that the electrodes 6 of the semiconductor chip 5 and leads 10B are thereafter electrically connected by pieces of wire 11. Herein, the semiconductor chips 4 and 5 are bonded and fixed in a state where the positions of these semiconductor chips are relatively staggered in the direction of arraying the electrodes 6, and the supporting lead 8A is bonded and fixed on the side of one shorter latus 4A3 of the circuit forming surface 4A of the semiconductor chip 4, while the supporting lead 8B is bonded and fixed on the side of the other shorter latus 5A4 of the circuit forming surface 5A of a semiconductor chip 5. Therefore, when the electrodes 6 of the semiconductor chip 4 are connected with the leads 10A by the wire pieces 11, a heat stage can be held in direct touch with the partial region of the rear surface of the semiconductor chip 4 opposing to the region of the side of one shorter latus 4A3 thereof. Besides, when the electrodes 6 of the semiconductor chip 5 are connected with the leads 10B by the wire pieces 11, the heat stage can be held in direct touch with the partial region of the rear surface of the semiconductor chip 5 opposing to the region of the side of the other shorter latus 5A4 thereof.

In this manner, the supporting lead 8A is bonded and fixed on the side of one shorter latus 4A3 of the circuit forming surface 4A of the semiconductor chip 4, while the supporting lead 8B is bonded and fixed on the side of the other shorter latus 5A4 of the circuit forming surface 5A of the semiconductor chip 5. Therefore, any tab does not exist between the semiconductor chip 4 and the semiconductor chip 5, so that a distance from the circuit forming surface 4A of the semiconductor chip 4 to the circuit forming surface 5A of the semiconductor chip 5 can be shortened.

Besides, since only one adhesive layer exists between the semiconductor chip 4 and the semiconductor chip 5, the distance from the circuit forming surface 4A of the semiconductor chip 4 to the circuit forming surface 5A of the semiconductor chip 5 can be shortened.

In addition, owing to the contrivance in which the supporting lead 8A is bonded and fixed on the side of one shorter latus 4A3 of the circuit forming surface 4A of the semiconductor chip 4, and in which the supporting lead 8B is bonded and fixed on the side of the other shorter latus 5A4 of the circuit forming surface 5A of the semiconductor chip 5, the thickness of the supporting lead 8A is cancelled by the loop height of the wire pieces 11 for electrically connecting the electrodes 6 of the semiconductor chip 4 with the leads 10A, and the thickness of the supporting lead 8B is cancelled by the loop height of the wire pieces 11 for electrically connecting the electrodes 6 of the semiconductor chip 5 with the leads 10B. Accordingly, the thickness of the resin body 12 is not affected by the supporting leads 8A, 8B. As a result, effects similar to those of the foregoing embodiment 2 are attained.

By the way, even in the foregoing embodiment 1, the rear surfaces of the semiconductor chips 4 and 5 may well be bonded and fixed in the state in which the positions of these semiconductor chips are relatively staggered in the direction of arraying the electrodes 6, in the same manner as in this embodiment 3. Also in this case, as in this embodiment 3, the area of touch between the rear surface of the semiconductor chip 4 and the heat stage increases, so that a time period for heating the semiconductor chip 4 at the wiring bonding step, can be shortened. Besides, the area of touch between the rear surface of the semiconductor chip 5 and the heat stage increases, so that a time period for heating the semiconductor chip 5 can be shortened at the wire bonding step.

EMBODIMENT 4

Figure 18:
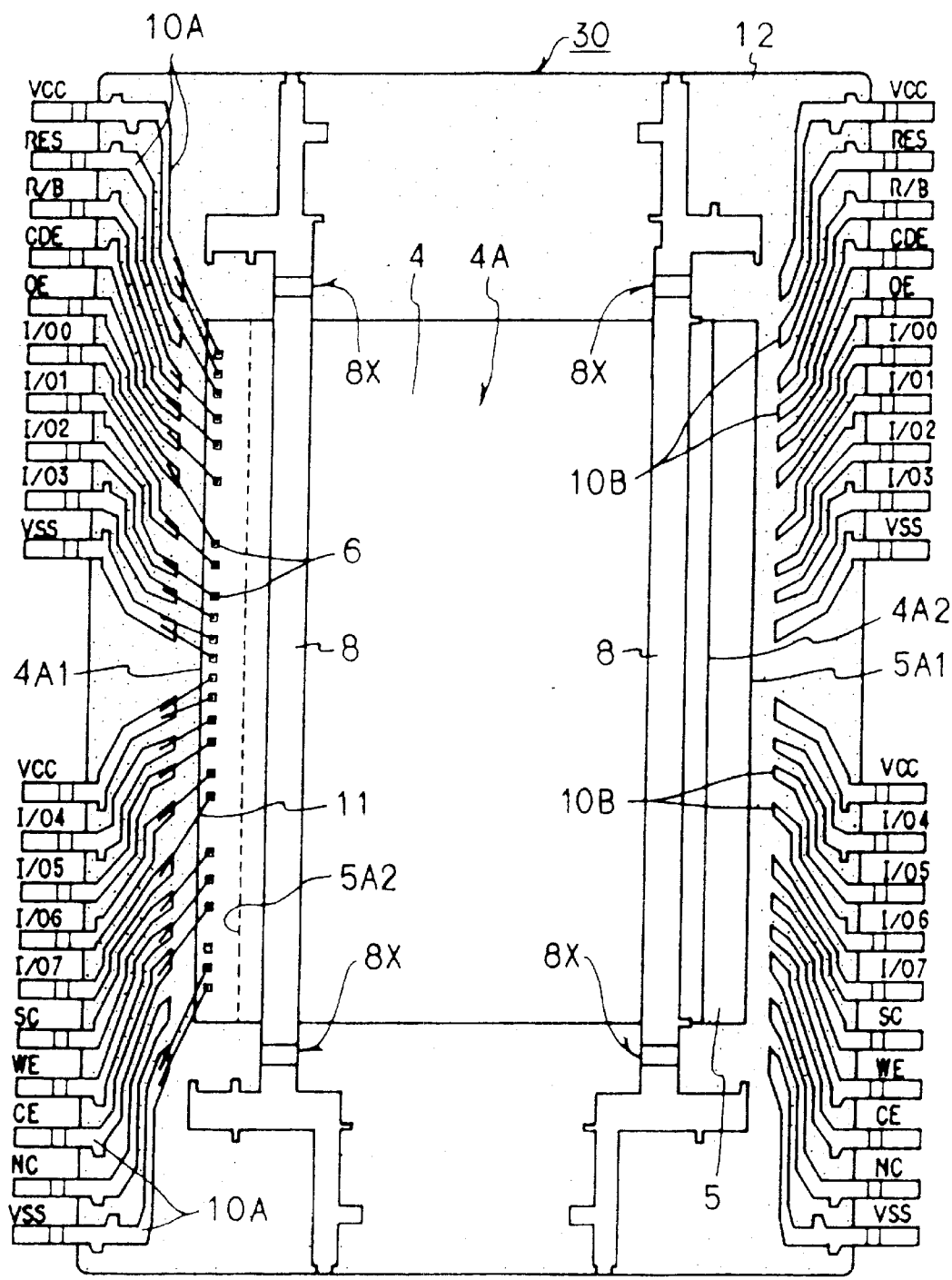
FIG. 18 is a plan view of a semiconductor device being Embodiment 4 of the present invention in a state where the upper part of a resin body has been removed.
Figure 19:
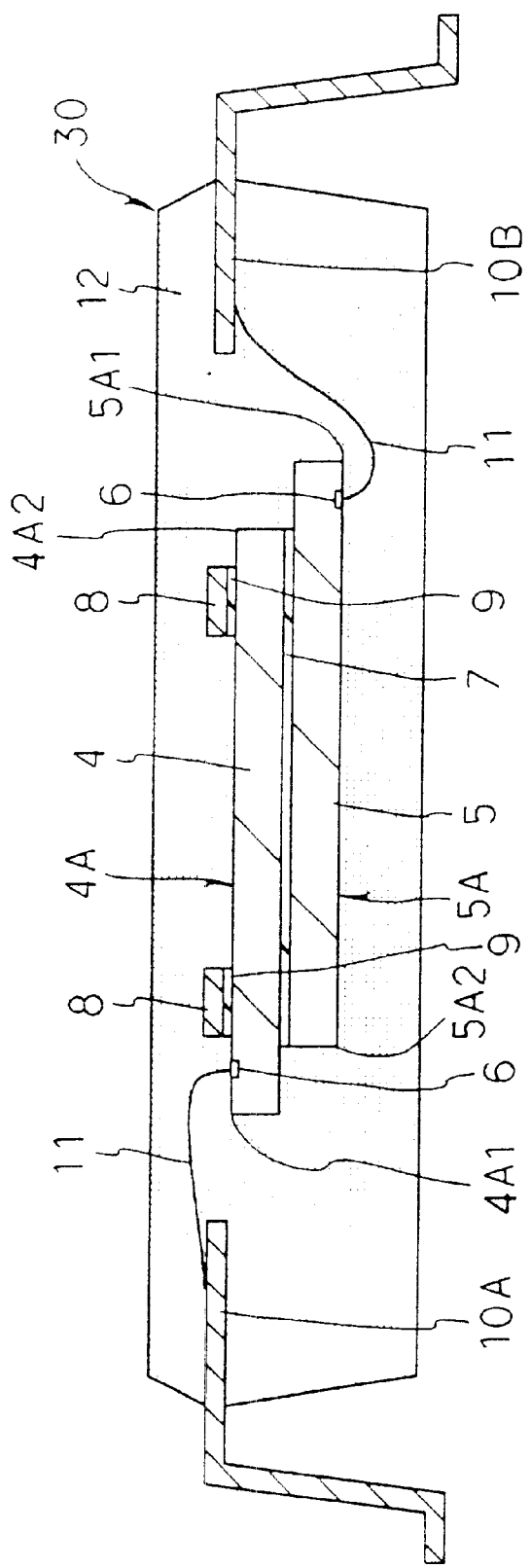
FIG. 19 is a sectional view of the semiconductor device being Embodiment 4 of the present invention.

FIG. 18 is a plan view of a semiconductor device being Embodiment 4 of the present invention in a state where the upper part of a resin body has been removed, while FIG. 19 is a sectional view of the semiconductor device.

As illustrated in FIGS. 18 and 19, the semiconductor device 30 of this embodiment has basically the same construction as that of Embodiment 1 described before, but it differs from the foregoing embodiment in constructional points explained below.

Those parts 8X of supporting leads 8 which lie outside a semiconductor chip 4 are subjected to a bending work so that the thickness of the resin of the resin body 12 on the circuit forming surface 4A of the semiconductor chip 4 may become less than the thickness of the resin of the resin body 12 on the circuit forming surface 5A of a semiconductor chip 5. Although the reason for executing such a bending work will be detailed later, this bending work is intended to suppress those fluctuations of the semiconductor chips in the vertical direction (stacked direction) thereof which are incurred by the flowage of the resin injected under pressure into the cavity of a metal mold, in case of forming the resin body 12 on the basis of transfer molding.

The semiconductor device 30 of this embodiment is constructed having the two supporting leads 8, as in the foregoing embodiment 1. The two supporting leads 8 extend from one shorter latus of the two shorter latera of the resin body 12 opposing to each other, toward the other shorter latus, and they traverse the two shorter latera of the circuit forming surface 4A of the semiconductor chip 4 opposing to each other, respectively. The chip fixation part of one of the two supporting leads 8 is bonded and fixed through an adhesive layer 9 on the side of one longer latus 4A1 of the semiconductor chip 4, while the chip fixation part of the other supporting lead 8 is bonded and fixed through an adhesive layer 9 on the side of the other longer latus 4A2 of the semiconductor chip 4. That is, any adhesive layer for bonding and fixing the supporting lead and the semiconductor chip is not provided on the interspace between one supporting lead 8 and the other supporting lead 8.

Meanwhile, an adhesive layer should be desirably performed the bonding fixation of the supporting lead and the semiconductor chip with the smallest possible area, for the reason that moisture contained in this adhesive layer is vaporized and expanded by heat which arises in a temperature cycle test being an environmental test after the completion of the product of the semiconductor device, or by solder reflow heat which arises when the semiconductor device is soldered and mounted on a mounting substrate, thereby to form the factor of so-called "body cracking" which brings about cracks in the resin body. In a case where the semiconductor chip is bonded and fixed to a tab, the area of a required adhesive layer usually becomes larger in comparison with that of the adhesive layer for the supporting lead though governed by the size of the tab. It is therefore undesirable to support the semiconductor chip by the tab. Accordingly, the semiconductor device of high reliability and thinned structure can be offered by the construction in which the semiconductor chip 4 is bonded and fixed to the supporting leads 8 as in this embodiment.

Figure 20:
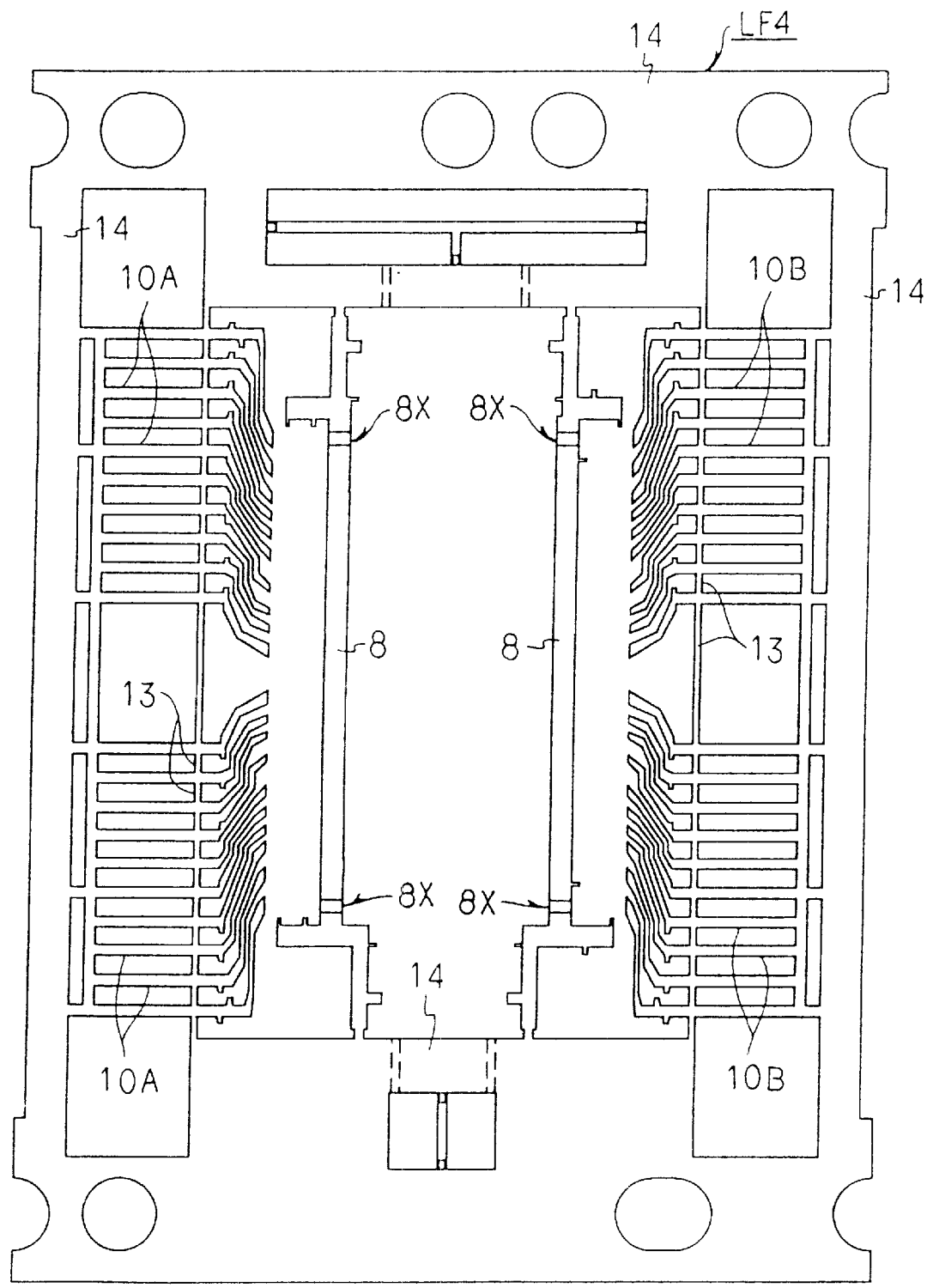
FIG. 20 is a plan view of a lead frame which is used in a manufacturing process for the semiconductor device being Embodiment 4 of the present invention.

Next, the manufacture of the semiconductor device 30 will be described with reference to FIG. 20 thru FIG. 25. FIG. 20 is a plan view of a lead frame which is used in the manufacture of the semiconductor device, and FIGS. 21 thru 25 are sectional views for explaining a manufacturing process. Incidentally, actual lead frames have a multiple string structure so that a plurality of semiconductor devices can be manufactured. For the brevity of illustration, however, FIG. 20 shows one domain where one semiconductor device is manufactured.

Figure 21:
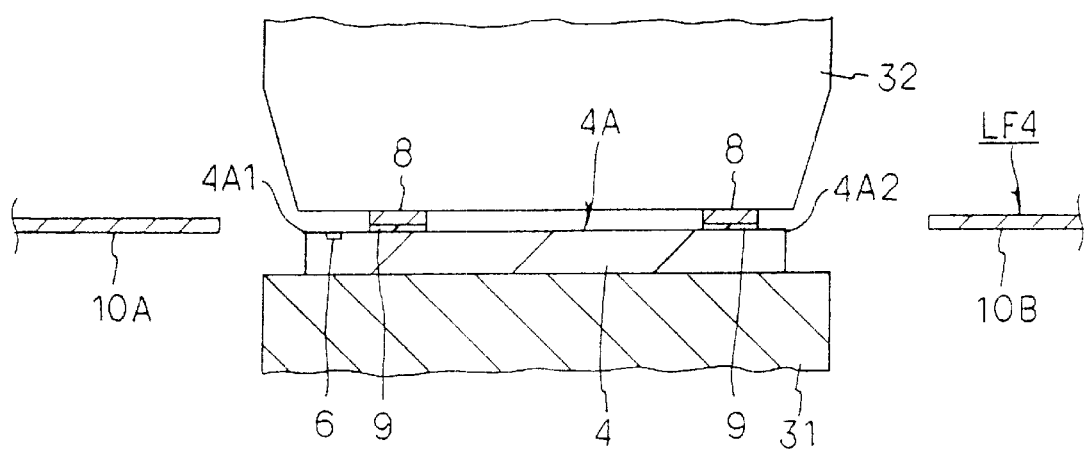
FIG. 21 is a sectional view for explaining the manufacture of the semiconductor device being Embodiment 4 of the present invention.

First, one semiconductor chip 4 is bonded and fixed onto the lead frame LF4. As shown in FIG. 21, the fixation between the lead frame LF4 and the semiconductor chip 4 is done in such a way that the semiconductor chip 4 is set on a heat stage 31, that the circuit forming surface 4A of the semiconductor chip 4 is thereafter coated with an adhesive made of, for example, a thermosetting resin, thereby to form the adhesive layers 9, and that the supporting leads 8 are thereafter secured onto the circuit forming surface 4A of the semiconductor chip 4 by thermocompression with a bonding tool 32. On this occasion, the fixation is done in a state where the semiconductor chip 4 is oriented so that one longer latus 4A1 of this semiconductor chip 4 may lie on the side of leads 10A (on the side of one of two groups of leads opposing to each other).

Incidentally, each of the adhesive layers 9 may well be formed using an insulating resin film which is provided with adhesive layers on both its surfaces (front surface and rear surface). In this case, however, the adhesive layer 9 thickens more than in the case of forming the adhesive layer 9 by applying the adhesive. Therefore, such an expedient is somewhat demeritorious for thinning the semiconductor device.

Figure 22:
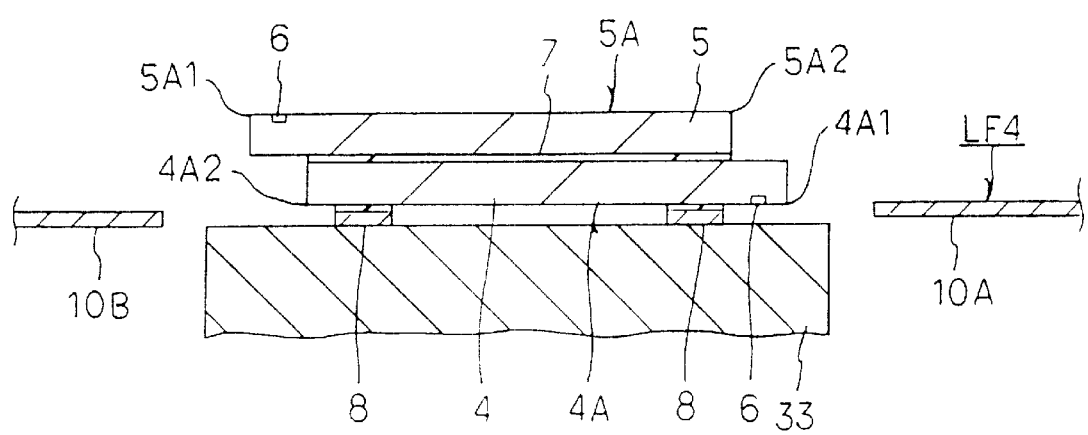
FIG. 22 is a sectional view for explaining the manufacture of the semiconductor device being Embodiment 4 of the present invention.

Subsequently, the lead frame LF4 is turned upside down with the rear surface of the semiconductor chip 4 facing upwards, whereupon the semiconductor chip 5 is bonded and fixed to the semiconductor chip 4. As shown in FIG. 22, the fixation between the semiconductor chip 4 and the semiconductor chip 5 is done in such a way that the semiconductor chip 4 is set on a heat stage 33 in a state where the heat stage 33 and the circuit forming surface 4A of this semiconductor chip 4 face each other, that the rear surface of the semiconductor chip 4 is thereafter coated with an adhesive made of, for example, a silver (Ag) paste material, thereby to form an adhesive layer 7, and that the semiconductor chip 5 is thereafter secured onto the rear surface of the semiconductor chip 4 in a state where the rear surfaces of the semiconductor chips 4 and 5 face each other. On this occasion, the fixation is done in a state where the semiconductor chip 5 is oriented so that one longer latus 5A1 of this semiconductor chip 5 may lie on the side of leads 10B (on the side of the other of the two groups of leads opposing to each other). Besides, the fixation is done in a state where the positions of the semiconductor chips 4 and 5 are staggered relatively to each other so that one longer latus 4A1 of the, semiconductor chip 4 may lie outside the other longer latus 5A2 of the semiconductor chip 5, and that one longer latus 5A1 of the semiconductor chip 5 may lie outside the other longer latus 4A2 of the semiconductor chip 4 (that is, in a state where the positions are relatively shifted in the direction in which one longer latus 4A1 of the semiconductor chip 4 and one longer latus 5A1 of the semiconductor chip 5 come away from each other). The amount of the positional shift between the semiconductor chips 4 and 5 should desirably be to, the extent that the electrodes 6 of the semiconductor chip 4 lie outside the other longer latus 5A2 of the semiconductor chip 5, and that the electrodes 6 of the semiconductor chip 5 lie outside the other longer latus 4A2 of the semiconductor chip 4.

Incidentally, the adhesive layer 7 may well be formed using an insulating resin film which is provided with adhesive layers on both its surfaces. In this case, however, the adhesive layer 7 thickens more than in the case of forming the adhesive layer 7 by applying the adhesive. Therefore, such an expedient is somewhat demeritorious for thinning the semiconductor device.

Figure 23:
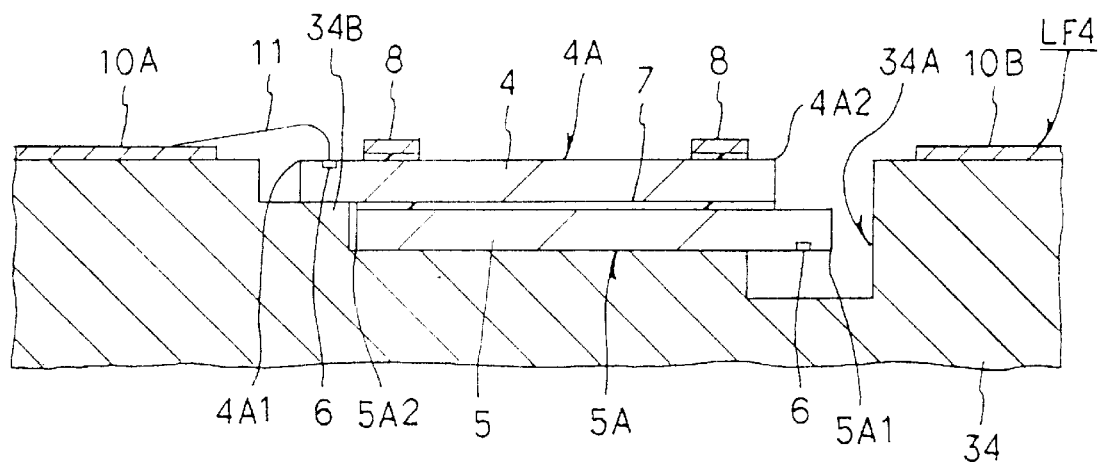
FIG. 23 is a sectional view for explaining the manufacture of the semiconductor device being Embodiment 4 of the present invention.

Subsequently, the lead frame LF4 is inverted upwards with the circuit forming surface 4A of the semiconductor chip 4 facing upwards, whereupon the electrodes 6 of the semiconductor chip 4 and the leads 10A are electrically connected by pieces of conductive wire 11. As shown in FIG. 23, the connections between the electrodes 6 of the semiconductor chip 4 and the leads 10A are done by setting the semiconductor chips 4 and 5 on a heat stage 34 in a state where the heat stage 34 and the circuit forming surface 5A of the semiconductor chip 5 face to each other. Gold (Au) wire, for example, is employed as the wire 11. Besides, a method of connecting the wire 11 is, for example, ball bonding (nailhead bonding) in which ultrasonic vibrations are used conjointly with thermocompression.

At this step, the partial region of the rear surface of the semiconductor chip 4 opposing to the region thereof on the side of one longer latus 4A1 of the circuit forming surface 4A is exposed. Therefore, the heat stage 34 is provided with a protrusion 34B beforehand so as to come into touch with the exposed partial region of the rear surface, whereby this partial region of the rear surface of the semiconductor chip 4 can be held in direct touch with the heat stage 34.

More specifically, the rear surfaces of the respective semiconductor chips 4 and 5 are bonded and fixed to each other in the state of staggered positions in which one longer latus 4A1 of the semiconductor chip 4 lies outside the other longer latus 5A2 of the semiconductor chip 5, and in which one longer latus 5A1 of the semiconductor chip 5 lies outside the other longer latus 4A2 of the semiconductor chip 4, whereby the partial region of the rear surface of the semiconductor chip 4 can be held in direct touch with the heat stage 34, and the heat of the heat stage 34 is effectively conducted to the electrodes 6 of the semiconductor chip 4, so that the inferior connections between the electrodes 6 of the semiconductor chip 4 and the wire pieces 11 can be relieved.

Incidentally, at this step, the semiconductor chip 5 is set on the heat stage 34 in a state where its circuit forming surface 5A faces downwards, so that the heat stage 34 is provided with a recess 34A in order to prevent this heat stage 34 from coming into touch with the electrodes 6 of the semiconductor chip 5.

Figure 24:
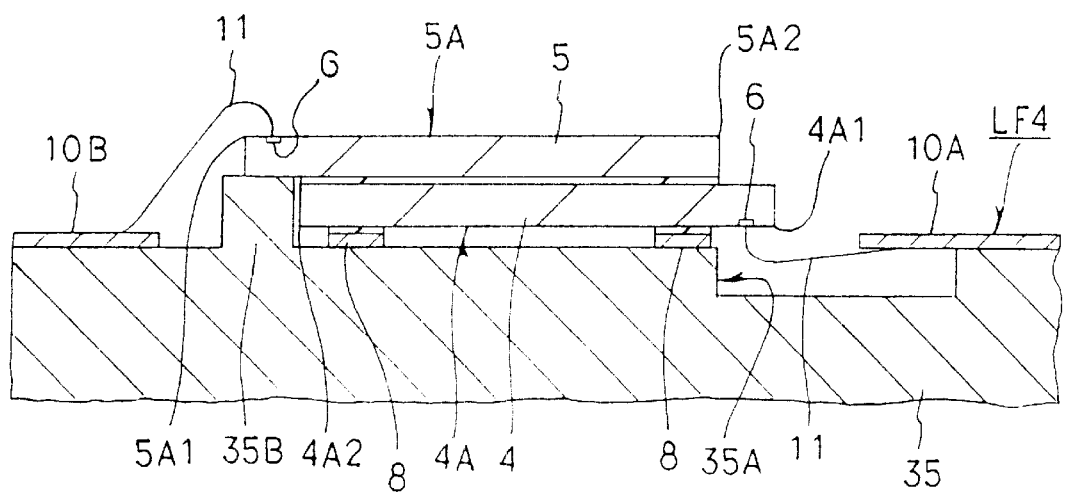
FIG. 24 is a sectional view for explaining the manufacture of the semiconductor device being Embodiment 4 of the present invention.

Subsequently, the lead frame LF4 is turned upside down with the circuit forming surface 5A of the semiconductor chip 5 facing upwards, whereupon the electrodes 6 of the semiconductor chip 5 and the leads 10B are electrically connected by pieces of conductive wire 11. As shown in FIG. 24, the connections between the electrodes 6 of the semiconductor chip 5 and the leads 10B are done by setting the semiconductor chips 4 and 5 on a heat stage 35 in a state where the heat stage 35 and the circuit forming surface 4A of the semiconductor chip 4 face to each other. Gold (Au) wire, for example, is employed as the wire 11. Besides, a method of connecting the wire 11 is, for example, ball bonding in which ultrasonic vibrations are used conjointly with thermocompression.

At this step, the partial region of the rear surface of the semiconductor chip 5 opposing to the region thereof on the side of one longer latus 5A1 of the circuit forming surface 5A is exposed. Therefore, the heat stage 35 is provided with a protrusion 35B beforehand so as to come into touch with the exposed partial region of the rear surface, whereby this partial region of the rear surface of the semiconductor chip 5 can be held in direct touch with the heat stage 35.

More specifically, the rear surfaces of the respective semiconductor chips 4 and 5 are bonded and fixed to each other in the state of staggered positions in which one longer latus 4A1 of the semiconductor chip 4 lies outside the other longer latus 5A2 of the semiconductor chip 5, and in which one longer latus 5A1 of the semiconductor chip 5 lies outside the other longer latus 4A2 of the semiconductor chip 4, whereby the partial region of the rear surface of the semiconductor chip 5 can be held in direct touch with the heat stage 35, and the heat of the heat stage 35 is effectively conducted to the electrodes 6 of the semiconductor chip 5, so that the inferior connections between the electrodes 6 of the semiconductor chip 5 and the wire pieces 11 can be relieved.

Besides, in the process thus far described, the first wire bonding step of electrically connecting the electrodes 6 of the semiconductor chip 4 with the leads 10A by the wire pieces 11, and the second wire bonding step of electrically connecting the electrodes 6 of the semiconductor chip 5 with the leads 10B by the wire pieces 11 are carried out after the chip bonding step of forming the stacked chip assembly by bonding and fixing the semiconductor chip 5 to the semiconductor chip 4. In Embodiment 1 described before, the first wire bonding step is performed before the chip bonding step of forming the stacked chip assembly, and hence, the drawback is liable to occur that the wire pieces 11 subjected to the connection treatment at the first wire bonding step are deformed at the chip bonding step. On the other hand, in this embodiment 4, the first and second wire bonding steps are performed after the chip bonding step, and hence, the wire deformations which appear at the chip bonding step can be substantially excluded.

Incidentally, at this step, the semiconductor chip 4 is set on the heat stage 35 in a state where its circuit forming surface 4A faces downwards, so that the heat stage 35 is provided with a recess 35A in order to prevent this heat stage 35 from coming into touch with the wire pieces 11.

Figure 25:
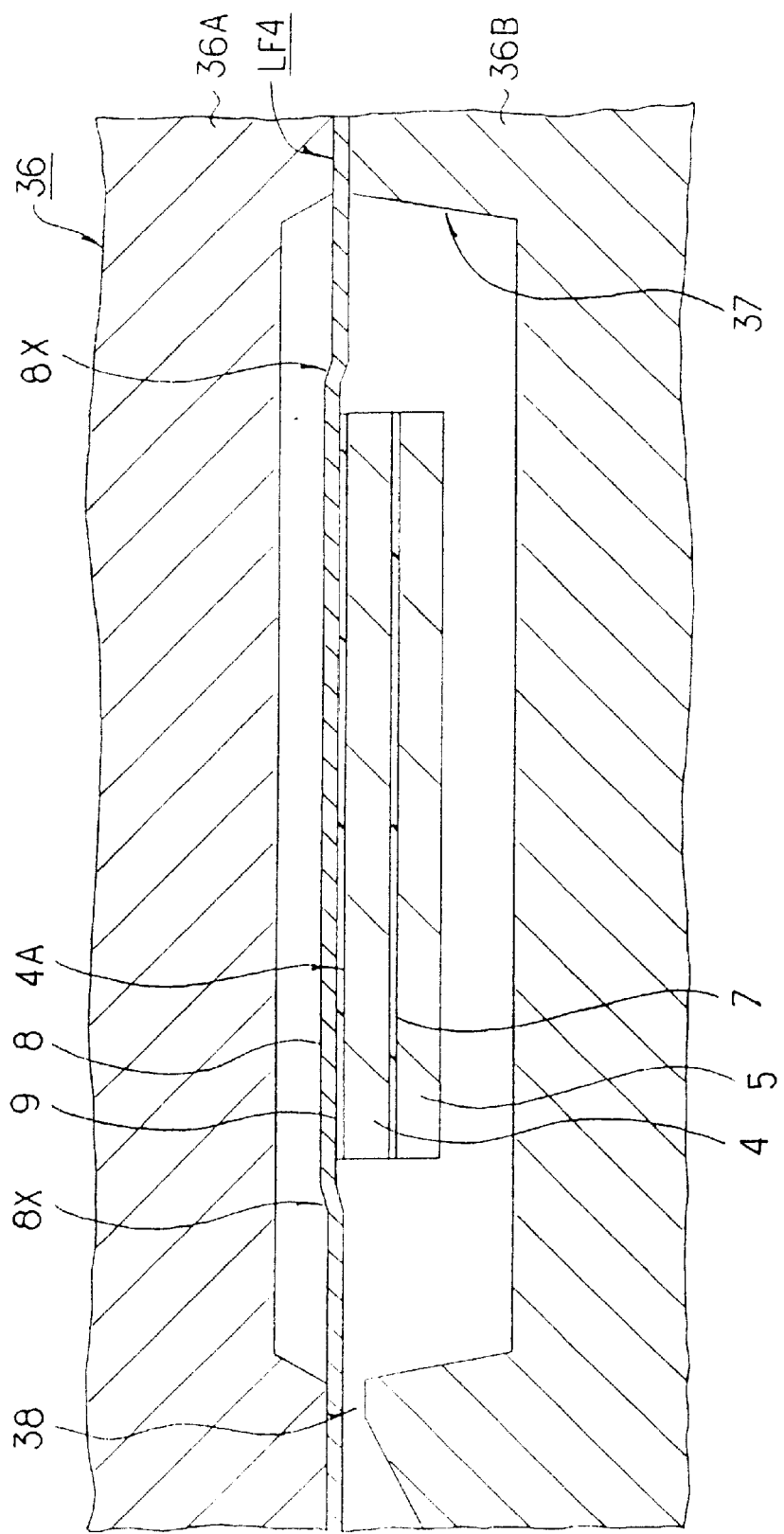
FIG. 25 is a sectional view for explaining the manufacture of the semiconductor device being Embodiment 4 of the present invention.

Subsequently, the lead frame LF4 is inverted upwards with the circuit forming surface 4A of the semiconductor chip 4 facing upwards. Thereafter, as shown in FIG. 25, the lead frame LF4 is positioned between the upper mold 36A and lower mold 36B of the metal mold 36 of a transfer molding equipment. On this occasion, the semiconductor chips 4, 5, the inner portions of the leads 10A, the inner portions of the leads 10B, the supporting leads 8, and the wire pieces 11 are arranged inside a cavity 37 which is defined by the upper mold 36A and the lower mold 36B.

Subsequently, the resin body 12 is formed in such a way that a fluid resin (molten resin) is injected under pressure from the pot of the metal mold 36 into the cavity 37 through the runner, pouring gate etc. thereof. The semiconductor chips 4, 5, the inner portions of the leads 10A, the inner portions of the leads 10B, the supporting leads 8, and the wire pieces 11 are encapsulated with the resin body 12. Employed as the resin is, for example, a biphenyl-based thermosetting resin which is doped with a phenolic hardener, silicone rubber, a filler, or the like.

Meanwhile, the outer portions of leads function also to absorb and relax stresses ascribable to thermal expansions arising when a semiconductor device is mounted on a mounting substrate, and stresses ascribable to the warp of the mounting substrate after the mounting. The stress relaxing function degenerates as a distance from the emergent part of each lead emerging out of a resin body, to the mounting substrate, shortens with the thinning of the semiconductor device. In the thinning of the semiconductor device, therefore, the distance from the emergent part of each lead to the mounting substrate should desirably be lengthened to the utmost by locating the emergent part of each lead above the central level of the resin body in the thickness direction thereof (the horizontal plane of the resin body at ½ of the thickness thereof). Also in the semiconductor device 30 of this embodiment, accordingly, the emergent parts of the leads (10A, 10B) are located above the central level of the resin, body 12 in the thickness direction thereof.

Such a structure is incarnated by locating the lead frame LF4 above the central level of the cavity 37 in the thickness direction thereof (the horizontal plane of the cavity at ½ of the thickness thereof) as illustrated in FIG. 25. Here in the case where the lead frame LF4 is located above the central level of the cavity 37 in the thickness direction thereof, upper and lower gates (also termed "center gates") for injecting a resin from the upper side and lower side of a lead frame into a cavity become difficult of adoption as the pouring gate 38, and hence, the lower gate for injecting the resin from the lower side of the lead frame LF4 is inevitably adopted.

On the other hand, for the purpose of suppressing failure to fill the cavity 37 with the resin, in other words, suppressing the appearance of voids, it is desirable to equalize a first distance from the circuit forming surface 4A of the semiconductor chip 4 to the inwall surface of the cavity 37 confronting this circuit forming surface 4A, with a second distance from the circuit forming surface 5A of the semiconductor chip 5 to the inwall surface of the cavity 37 confronting this circuit forming surface 5A. However, in the case where the resin body 12 having a thickness of 1 [mm] or less is formed by adopting the lower gate, the side of the circuit forming surface 4A of the semiconductor chip 4 is filled up with the resin earlier than the side of the circuit forming surface 5A of the semiconductor chip 5. Therefore, the drawback is liable to occur that the semiconductor chips (4, 5) are pushed downwards by the resin with which the side of the circuit forming surface 4A of the semiconductor chip 4 has been filled up, so the semiconductor chip 5, the wire pieces 11, etc. are exposed out of the resin body 12. This drawback forms a factor for incurring the lowering of the available percentage of the products of the semiconductor device.

The fluctuations of the semiconductor chips.(4, 5) in the vertical direction can be suppressed by setting the first distance (the distance from the circuit forming surface 4A of the semiconductor chip 4 to the inwall surface of the cavity 37) shorter than the second distance (the distance from the circuit forming surface 5A of the semiconductor chip 5 to the inwall surface of the cavity 37). In this embodiment, therefore, the parts 8X of the supporting leads 8 are subjected to the bending work so that the first distance may become shorter than the second distance, in other words, that the resin thickness of the resin body 12 on the circuit forming surface 4A of the semiconductor chip 4 may become less than the resin thickness on the circuit forming surface 5A of the semiconductor chip 5.

Subsequently, the lead frame LF4 is taken out of the metal mold 36, a tie bar 13 coupled to the leads 10A and a tie bar 13 coupled to the leads 10B are thereafter cut away, the outer portions of the respective leads 10A and 10B are thereafter cut away from the frame member 14 of the lead frame LF4, the outer portions of the respective leads 10A and 10B are thereafter molded into, for example, a gull-wing shape being one flat mounting shape, and the supporting leads 8 are thereafter cut away from the frame member 14 of the lead frame LF4. In this way, the semiconductor device 30 shown in FIGS. 18 and 19 is substantially completed.

Figure 26:
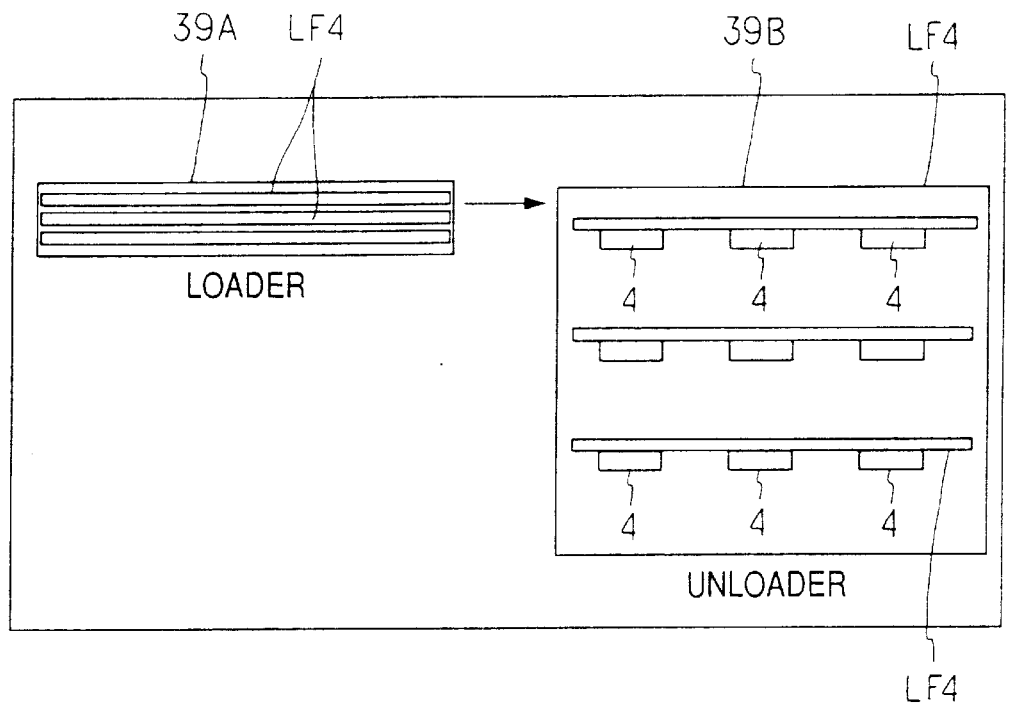
FIG. 26 is a schematic view for explaining the manufacture of the semiconductor device being Embodiment 4 of the present invention.
Figure 27:
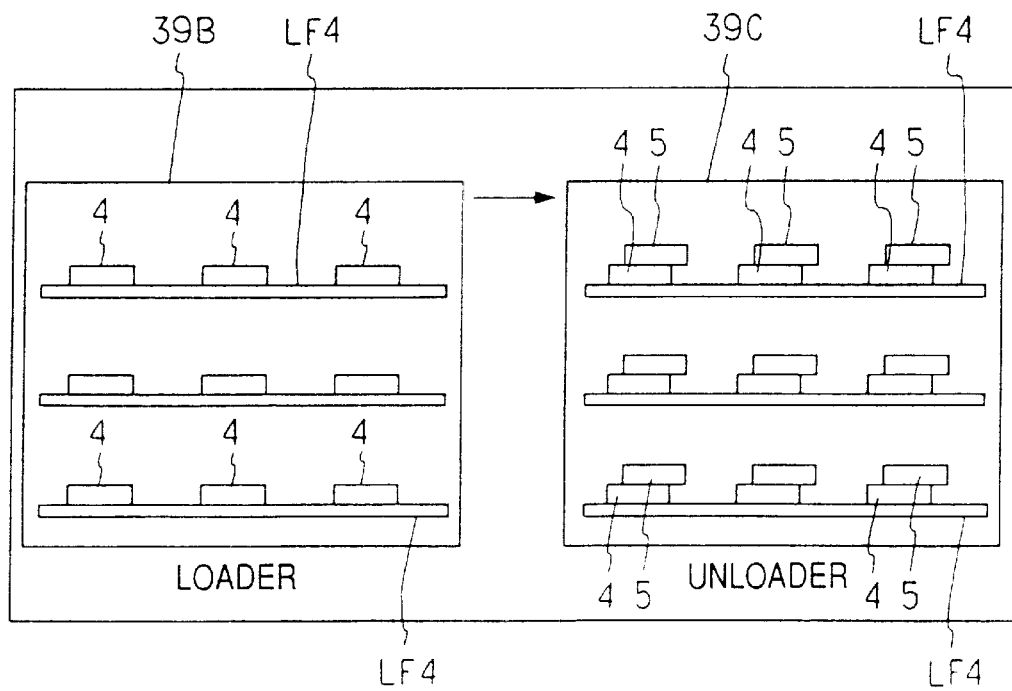
FIG. 27 is a schematic view for explaining the manufacture of the semiconductor device being Embodiment 4 of the present invention.
Figure 28:
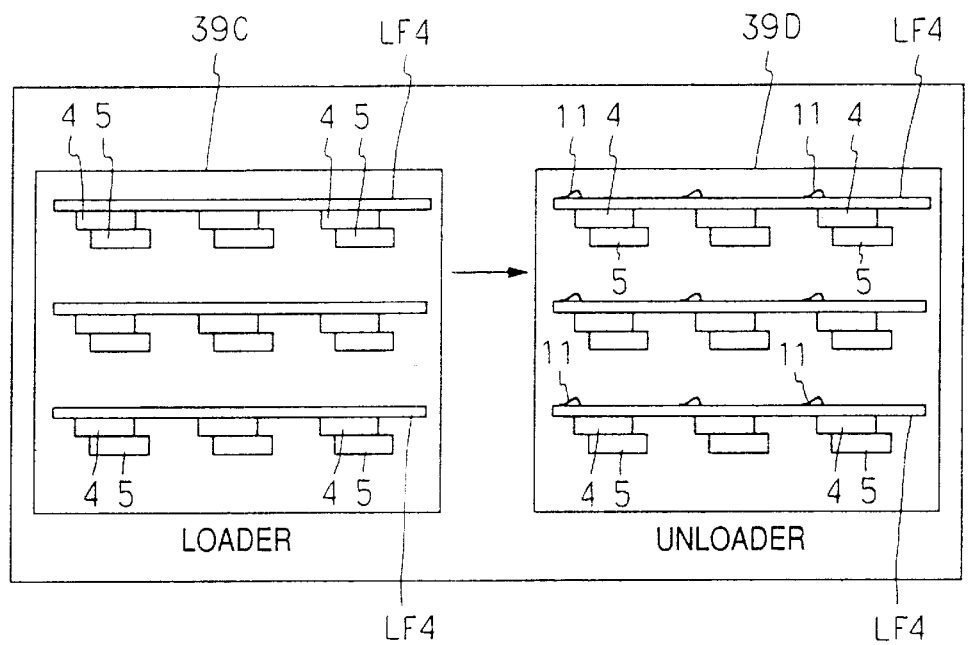
FIG. 28 is a schematic view for explaining the manufacture of the semiconductor device being Embodiment 4 of the present invention.
Figure 29:
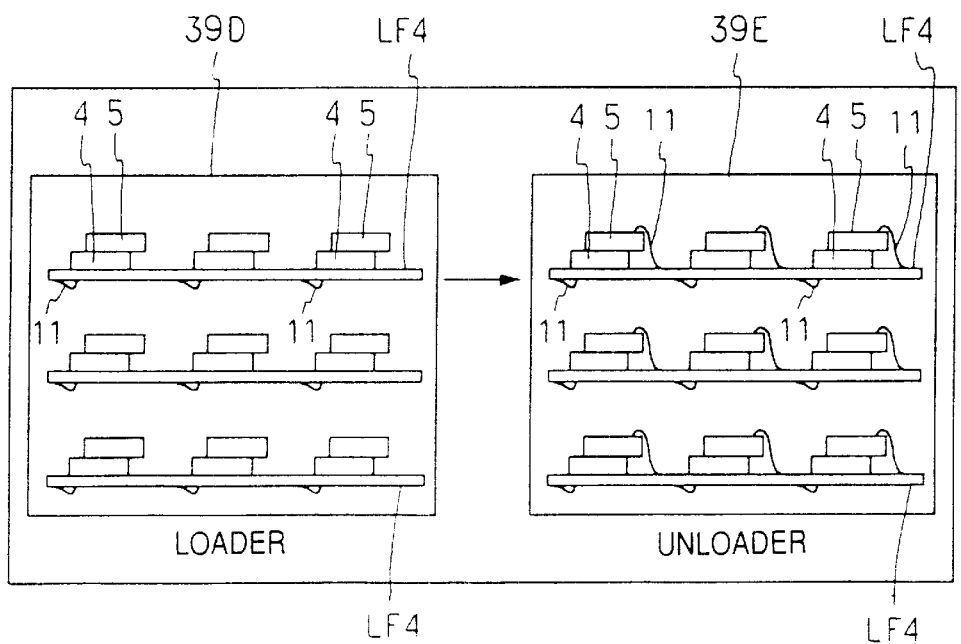
FIG. 29 is a schematic view for explaining the manufacture of the semiconductor device being Embodiment 4 of the present invention.

Incidentally, in a first chip bonding equipment for fixing the semiconductor chips 4 to the lead frames LF4, the lead frames LF4 are received from a cassette holder 39A installed in a loader section, into a cassette holder 39B installed in an unloader section, as illustrated in FIG. 26 (a schematic view). Also, in a second chip bonding equipment for fixing the semiconductor chips 5 to the semiconductor chips 4, the lead frames LF4 are received from the cassette holder 39B installed in a loader section, into a cassette holder 39C installed in an unloader section, as illustrated in FIG. 27 (a schematic view). Besides, in a first wire bonding equipment for electrically connecting the electrodes 6 of the semiconductor chips 4 and the leads 10A by the wire pieces 11, the lead frames LF4 are received from the cassette holder 39C installed in a loader section, into a cassette holder 39D installed in an unloader section, as illustrated in FIG. 28 (a schematic view). Also, in a second wire bonding equipment for electrically connecting the electrodes 6 of the semiconductor chips 5 and the leads 10B by the wire pieces 11, the lead frames LF4 are received from the cassette holder 39D installed in a loader section, into a cassette holder 39E installed in an unloader section, as illustrated in FIG. 29 (a schematic view).

After having received the lead frames LF4, the cassette holder 39B installed in the unloader section of the first chip bonding equipment is installed in the loader section of the second chip bonding equipment. At this time, the cassette holder 39B is inverted upwards and then installed, whereby the lead frames LF4 can be readily inverted at the second chip bonding step.

Also, after having received the lead frames LF4, the cassette holder 39C installed in the unloader section of the second chip bonding equipment is installed in the loader section of the first wire bonding equipment. At this time, the cassette holder 39C is inverted downwards and then installed, whereby the lead frames LF4 can be readily inverted at the first wire bonding step.

Besides, after having received the lead frames LF4, the cassette holder 39D installed in the unloader section of the first wire bonding equipment is installed in the loader section of the second wire bonding equipment. At this time, the cassette holder 39D is inverted upwards and then installed, whereby the lead frames LF4 can be readily inverted at the second wire bonding step.

In this manner, the following effects are attained in accordance with this embodiment:

(1) The chip fixation part of one supporting lead 8 is bonded and fixed on the side of one longer latus 4A1 of the semiconductor chip 4, while the chip fixation part of the other supporting lead 8 is bonded and fixed on the side of the other longer latus 4A2 of the semiconductor chip 4.

Owing to such a construction, the area of each adhesive layer 9 for bonding and fixing the semiconductor chip 4 to the corresponding supporting lead 8 can be made small, and hence, the body cracking which is ascribable to the vaporization and expansion of the moisture absorbed in the adhesive layer 9 can be suppressed. As a result, the reliability of the semiconductor device 30 can be enhanced.

(2) The part 8X of each supporting lead 8 is subjected to the bending work so that the resin thickness of the resin body 12 on the circuit forming surface 4A of the semiconductor chip 4 may become less than the resin thickness thereof on the circuit forming surface 5A of a semiconductor chip 5.

Owing to such a construction, even when the lower gate is adopted in order to locate the lead frame LF4 above the central level of the cavity 37 in the thickness direction thereof, in the case of forming the resin body 12 of the thickness of 1 [mm] or less on the basis of the transfer molding, it is possible to suppress those fluctuations of the semiconductor chips (4, 5) in the vertical direction thereof which are incurred by the flowage of the resin injected under pressure into the cavity 37, and accordingly to suppress the drawback that the semiconductor chip 5, the wire pieces 11, etc. are exposed out of the resin body 12. As a result, the available percentage of the products of the semiconductor device 30 can be heightened.

(3) In the manufacture of the semiconductor device 30, the first wire bonding step of electrically connecting the electrodes 6 of the semiconductor chip 4 with the leads 10A by the wire pieces 11, and the second wire bonding step of electrically connecting the electrodes 6 of the semiconductor chip 5 with the leads 10B by the wire pieces 11 are carried out after the chip bonding step of bonding and fixing the semiconductor chip 5 to the semiconductor chip 4.

Thus, the wire deformations which appear at the chip bonding step can be substantially excluded, so that the available percentage of the products of the semiconductor device 30 can be heightened.

EMBODIMENT 5

Figure 30:
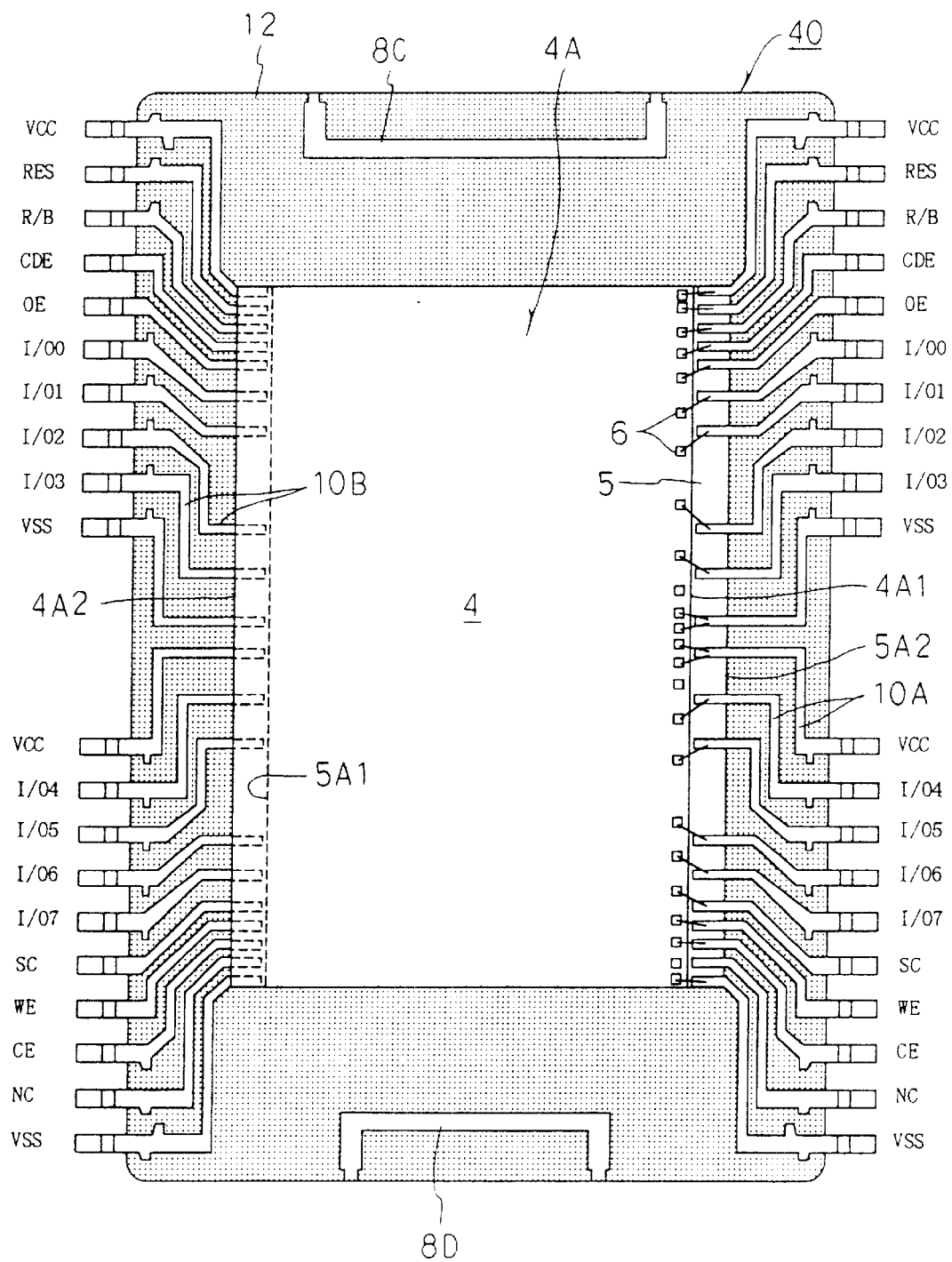
FIG. 30 is a plan view of a semiconductor device being Embodiment 5 of the present invention in a state where the upper part of a resin body has been removed.
Figure 31:
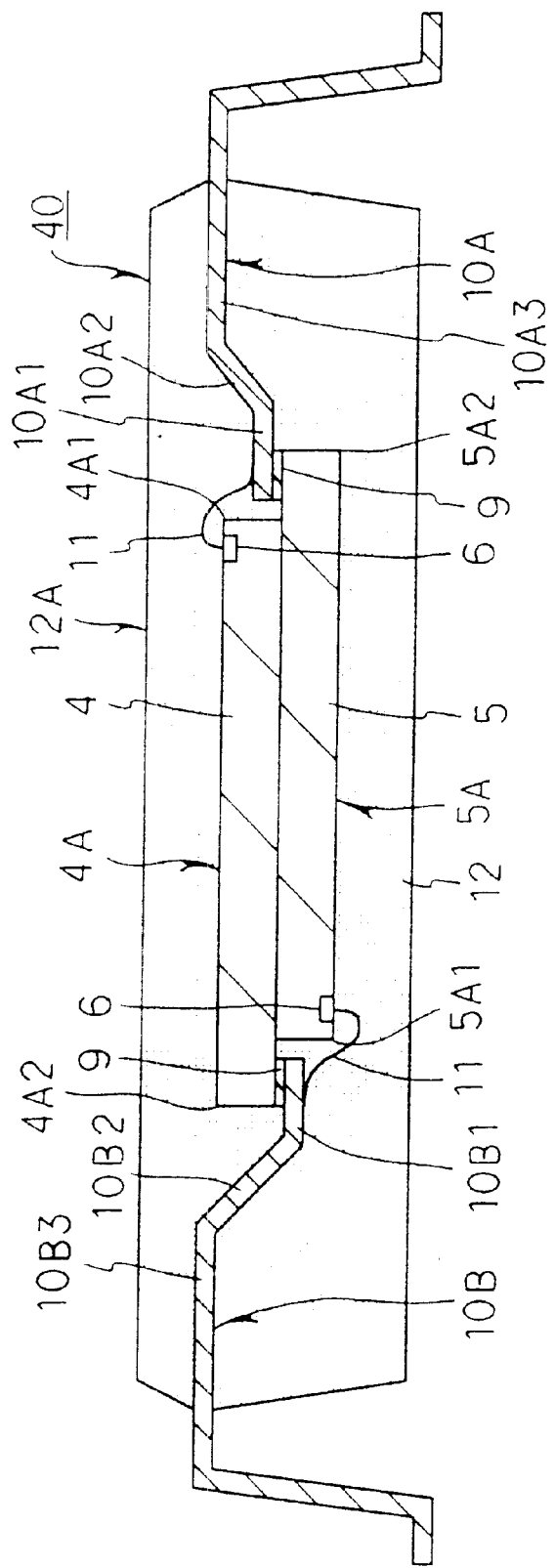
FIG. 31 is a sectional view of the semiconductor device being Embodiment 5 of the present invention.

FIG. 30 is a plan view of a semiconductor device being Embodiment 5 of the present invention in a state where the upper part of a resin body has been removed, while FIG. 31 is a sectional view of the semiconductor device.

As illustrated in FIGS. 30 and 31, the semiconductor device 40 of this embodiment has basically the same construction as that of Embodiment 1 described before, but it differs from the foregoing embodiment in constructional points explained below.

Semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may confront the side of leads 10A, and besides, where the positions of these semiconductor chips are staggered relatively to each other so that the other longer latus 4A2 of the semiconductor chip 4 may lie outside one longer latus 5A1 of the semiconductor chip 5 and that the other longer latus 5A2 of the semiconductor chip 5 may lie outside one longer latus 4A1 of the semiconductor chip 4 (that is, where the positions are relatively shifted in the direction in which one longer latus 4A1 of the semiconductor chip 4 and one longer latus 5A1 of the semiconductor chip 5 come near to each other).

In addition, the semiconductor chips 4 and 5 have not their rear surfaces bonded and fixed to each other, but they are stacked with their rear surfaces held in touch with each other.

Yet in addition, each of the plurality of leads 10A is such that the distal end part of its inner portion lying within the resin body 12 is bonded and fixed to the rear surface of the semiconductor chip 5 through an adhesive layer 9 outside one longer latus 4A1 of the semiconductor chip 4, and each of a plurality of leads 10B is such that the distal end part of its inner portion lying within the resin body 12 is bonded and fixed to the rear surface of the semiconductor chip 4 through an adhesive layer 9 outside one longer latus 5A1 of the semiconductor chip 5.

Further, those wire connection surfaces of the leads 10A to which pieces of wire 11 are connected lie nearer to the side of the semiconductor chip 5 with respect to the circuit forming surface 4A of the semiconductor chip 4, while those wire connection surfaces of the leads 10B to which pieces of wire 11 are connected lie nearer to the side of the semiconductor chip 4 with respect to the circuit forming surface 5A of the semiconductor chip 5.

Still further, the inner portion of each lead 10A is constructed having a first part 10A1 which traverses the longer latus of the rear surface of the semiconductor chip 5 lying outside one longer latus 4A1 of the semiconductor chip 4 and which is bonded and fixed to this rear surface, a second part 10A2 which bends from the first part 10A1 to the side of the circuit forming surface 4A of the semiconductor chip 4, and a third part 10A3 which extends from the second part 10A2 in the same direction as the extending direction of the first part 10A1. Likewise, the inner portion of each lead 10B is constructed having a first part 10B1 which traverses the longer latus of the rear surface of the semiconductor chip 4 lying outside one longer latus 5A1 of the semiconductor chip 5 and which is bonded and fixed to this rear surface, a second part 10B2 which bends from the first part 10B1 to the side of the circuit forming surface 5A of the semiconductor chip 4, and a third part 10B3 which extends from the second part 10B2 in the same direction as the extending direction of the first part 10B1. The third part 10A3 of each lead 10A and the third part 10B3 of each lead 10B lie above the central level of the resin body 12 in the thickness direction thereof (the horizontal plane of the resin body 12 at ½ of the thickness thereof) (that is, the third parts 10A3 and 10B3 lean toward the side of the upper surface 12A of the resin body 12).

Yet further, a supporting lead 8C is arranged outside one shorter latus of the two shorter latera of the semiconductor chip 4 opposing to each other, while a supporting lead 8D is arranged outside the other shorter latus. Unlike the supporting leads explained in the foregoing embodiments, the supporting leads 8C and 8D serve to support the resin body 12 on a lead frame in a manufacturing process for the semiconductor device 40.

The manufacture of the semiconductor device 40 of this embodiment proceeds so that the region of the rear surface of the semiconductor chip 4 opposing to the region of the side of the other longer latus 4A2 of the circuit forming surface 4A of this semiconductor chip 4 is bonded and fixed to the first parts 10B1 of the leads 10B through the adhesive layer 9, while the partial region of the rear surface of the semiconductor chip 5 opposing to the region of the side of the other longer latus 5A2 of the circuit forming surface 5A of this semiconductor chip 5 is bonded and fixed to the first parts 10A1 of the leads 10A through the adhesive layer 9, and that the electrodes 6 of the semiconductor chip 4 and the first parts 10A1 of the leads 10A are electrically connected by the wire pieces 11, while the electrodes 6 of the semiconductor chip 5 and the first parts 10B1 of the leads 10B are electrically connected by the wire pieces 11. In the manufacture of the semiconductor device 40, the semiconductor chip 4 is supported on the frame member of the lead frame through the leads 10A, and the semiconductor chip 5 is supported on the frame member of the lead frame through the leads 10B.

In this manner, the following effects are attained in accordance with this embodiment:

(1) The semiconductor chips 4 and 5 are stacked in the state in which the rear surfaces of these semiconductor chips are faced to each other so that one longer latus 4A1 of the semiconductor chip 4 and the other longer latus 5A2 of the semiconductor chip 5 may confront the side of the leads 10A, and in which the positions of these semiconductor chips are staggered relatively to each other so that the other longer latus 4A2 of the semiconductor chip 4 may lie outside one longer latus 5A1 of the semiconductor chip 5 and that the other longer latus 5A2 of the semiconductor chip 5 may lie outside one longer latus 4A1 of the semiconductor chip 4, and moreover, each of the plurality of leads 10A is such that the distal end part (the first part 10A1) of its inner portion lying within the resin body 12 is bonded and fixed to the rear surface of the semiconductor chip 5 outside one longer latus 4A1 of the semiconductor chip 4, while each of the plurality of leads 10B is such that the distal end part (the first part 10B1) of its inner portion lying within the resin body 12 is bonded and fixed to the rear surface of the semiconductor chip 4 outside one longer latus 5A1 of the semiconductor chip 5.

Owing to such a construction, the length of each of the leads (10A, 10B) in the inner portion (the length of each lead extending from the outer periphery of the resin body 12 toward the outer periphery of the semiconductor chip) increases. It is therefore possible to suppress corrosion arising at the wire connection parts of the leads (10A, 10B) and the electrodes 6 of the semiconductor chips (4, 5) due to moisture which invades the semiconductor device from outside with paths being the interfaces between the resin of the resin body 12 and the leads. As a result, the reliability of the semiconductor device 40 can be enhanced.

Besides, the semiconductor chip 4 is supported by the distal end parts (10B1) of the plurality of leads 10B, while the semiconductor chip 5 is supported by the distal end parts (10A1) of the plurality of leads 10A, so that the bonding fixation of the respective semiconductor chips 4, 5 can be dispensed with, in other words, that an adhesive layer can be omitted. As a result, thinning in the structure of the semiconductor device 40 and curtailment in the cost thereof can be achieved.

(2) Those wire connection surfaces of the leads 10A to which the wire pieces 11 are connected lie nearer to the side of the semiconductor chip 5 with respect to the circuit forming surface 4A of the semiconductor chip 4, while those wire connection surfaces of the leads 10B to which the wire pieces 11 are connected lie nearer to the side of the semiconductor chip 4 with respect to the circuit forming surface 5A of the semiconductor chip 5.

Owing to such a construction, the loop height of the wire pieces 11 (a height from the circuit forming surface 4A of the semiconductor chip 4 to the uppermost parts of the wire pieces) for electrically connecting the electrodes 6 of the semiconductor chip 4 with the leads 10A decreases, so that the resin thickness of the resin body 12 can be reduced on the side of the circuit forming surface 4A of the semiconductor chip 4. Likewise, the loop height of the wire pieces 11 (a height from the circuit forming surface 5A of the semiconductor chip 5 to the lowermost parts of the wire pieces) for electrically connecting the electrodes 6 of the semiconductor chip 5 with the leads 10B decreases, so that the resin thickness of the resin body 12 can be reduced on the side of the circuit forming surface 5A of the semiconductor chip 5. As a result, thinning in the structure of the semiconductor device 40 can be achieved.

(3) The inner portion of each lead 10A is constructed having the first part 10A1 which traverses the longer latus of the rear surface of the semiconductor chip 5 lying outside one longer latus 4A1 of the semiconductor chip 4 and which is bonded and fixed to this rear surface, the second part 10A2 which bends from the first part 10A1 to the side of the circuit forming surface 4A of the semiconductor chip 4, and the third part 10A3 which extends from the second part 10A2 in the same direction as the extending direction of the first part 10A1. Also, the inner portion of each lead 10B is constructed having the first part 10B1 which traverses the longer latus of the rear surface of the semiconductor chip 4 lying outside one longer latus 5A1 of the semiconductor chip 5 and which is bonded and fixed to this rear surface, the second part 10B2 which bends from the first part 10B1 to the side of the circuit forming surface 4A of the semiconductor chip 4, and the third part 10B3 which extends from the second part 10B2 in the same direction as the extending direction of the first part 10B1.

Owing to such a construction, the emergent parts of the leads (10A, 10B) emerging out of the resin body 12 can be located above the central level of this resin body 12 in the thickness direction thereof, so that the reliability of the semiconductor device 40 in mounting operations and the reliability thereof after the mounting can be enhanced.

Figure 32:
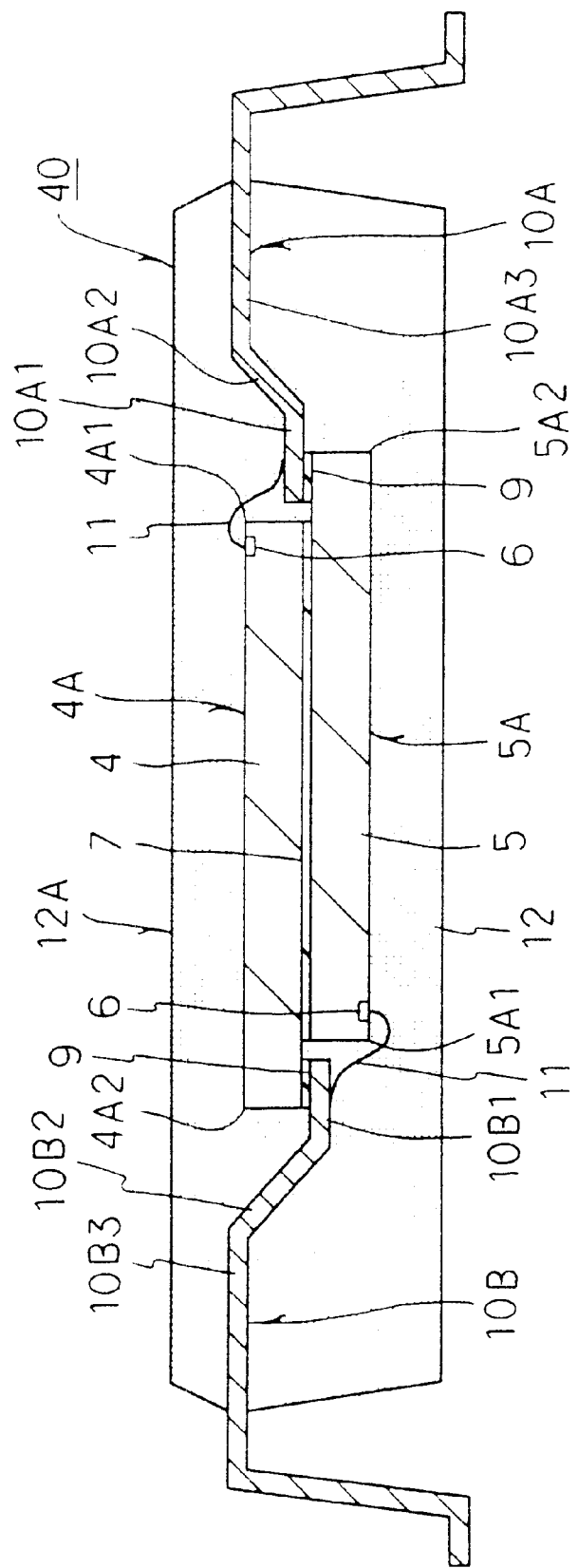
FIG. 32 is a sectional view of a semiconductor device showing a modification to Embodiment 5 of the present invention.

Incidentally, although the example in which the bonding fixation of the semiconductor chips 4, 5 is omitted has been described in this embodiment, the rear surfaces of the semiconductor chips 4, 5 may well be bonded and fixed through an adhesive layer 7 as illustrated in FIG. 32 (a sectional view). In this case, the drawback can be suppressed that, in forming the resin body 12 on the basis of transfer molding, the semiconductor chips 4 and 5 separates due to the flowage of the resin injected under pressure into the cavity of a metal mold. Therefore, the available percentage of the products of the semiconductor device 40 can be heightened, but the thickness of the semiconductor device 40 increases instead.

EMBODIMENT 6

Figure 33:
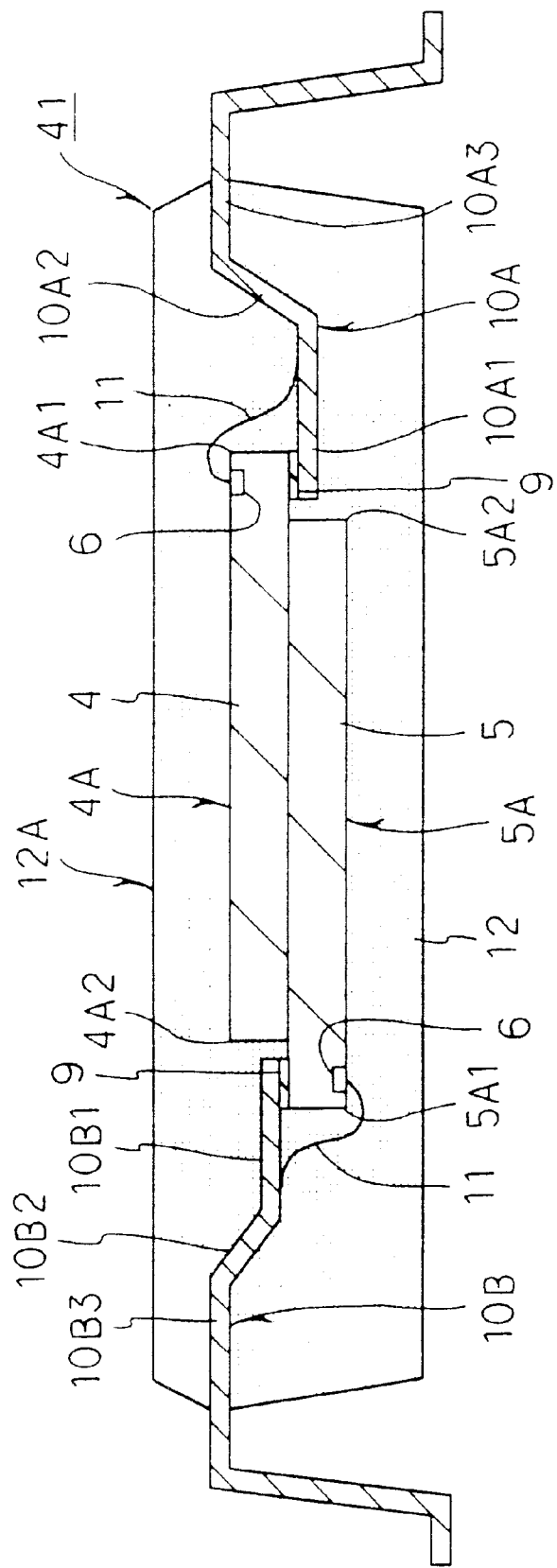
FIG. 33 is a sectional view of a semiconductor device being Embodiment 6 of the present invention.

FIG. 33 is a sectional view of a semiconductor device being Embodiment 6 of the present invention.

As illustrated in FIG. 33, the semiconductor device 41 of this embodiment has basically the same construction as that of Embodiment 5 described before, but it differs from the foregoing embodiment in constructional points explained below.

Semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may, confront the side of leads 10A, and besides, where the positions of these semiconductor chips are staggered relatively to each other so that one longer latus 4A1 of the semiconductor chip 4 may lie outside the other longer latus 5A2 of the semiconductor chip 5 and that one longer latus 5A1 of the semiconductor chip 5 may lie outside the other longer latus 4A2 of the semiconductor chip 4 (that is, where the positions are relatively shifted in the direction in which one longer latus 4A1 of the semiconductor chip 4 and one longer latus 5A1 of the semiconductor chip 5 come away from each other).

In addition, each of the plurality of leads 10A is such that the distal end part of its inner portion lying within a resin body 12 is bonded and fixed to the rear surface of the semiconductor chip 4 through an adhesive layer 9 outside the other longer latus 5A2 of the semiconductor chip 5, and each of a plurality of leads 10B is such that the distal end part of its inner portion lying within the resin body 12 is bonded and fixed to the rear surface of the semiconductor chip 5 through an adhesive layer 9 outside the other longer latus 4A2 of the semiconductor chip 4.

The inner portion of each lead 10A is constructed having a first part 10A1 which traverses the longer latus of the rear surface of the semiconductor chip 4 lying outside the other longer latus 5A2 of the semiconductor chip 5 and which is bonded and fixed to this rear surface, a second part 10A2 which bends from the first part 10A1 to the side of the circuit forming surface 4A of the semiconductor chip 4, and a third part 10A3 which extends from the second part 10A2 in the same direction as the extending direction of the first part 10A1. Likewise, the inner portion of each lead 10B is constructed having a first part 10B1 which traverses the longer latus of the rear surface of the semiconductor chip 5 lying outside the other longer latus 4A2 of the semiconductor chip 4 and which is bonded and fixed to this rear surface, a second part 10B2 which bends from the first part 10B1 to the side of the circuit forming surface 4A of the semiconductor chip 4, and a third part 10B3 which extends from the second part 10B2 in the same direction as the extending direction of the first part 10B1. The third part 10A3 of each lead 10A and the third part 10B3 of each lead 10B lie above the central level of the resin body 12 in the thickness direction thereof (that is, the third parts 10A3 and 10B3 lie on the side of the upper surface 12A of the resin body 12).

The manufacture of the semiconductor device 41 of this embodiment is somewhat different from the manufacturing process described in the foregoing embodiment 5. The first parts 10A1 of the leads 10A are bonded and fixed to the region of the rear surface of the semiconductor chip 4 opposing to the region of the side of one longer latus 4A1 of the circuit forming surface 4A of this semiconductor chip 4, while the first parts 10B1 of the leads 10B are bonded and fixed to the region of the rear surface of the semiconductor chip 5 opposing to the region of the side of one longer latus 5A1 of the circuit forming surface 5A of this semiconductor chip 5, followed by wire bonding.

According to the semiconductor device 41 of this embodiment thus constructed, effects similar to those of the foregoing embodiment 5 are attained.

Moreover, each of the plurality of leads 10A is such that the distal end part of its inner portion lying within the resin body 12 is bonded and fixed to the rear surface of the semiconductor chip 4 through the adhesive layer 9 outside the other longer latus 5A2 of the semiconductor chip 5, so that in electrically connecting the electrodes 6 of the semiconductor chip 4 with the inner portions of the leads 10A by the wire pieces 11, a bonding stage can be held in touch with the distal end parts of the inner portions of the leads 10A, so as to effectively conduct the heat of the bonding stage to the electrodes 6 of the semiconductor chip 4.

Besides, each of the plurality of leads 10B is such that the distal end part of its inner portion lying within the resin body 12 is bonded and fixed to the rear surface of the semiconductor chip 5 through the adhesive layer 9 outside the other longer latus 4A2 of the semiconductor chip 4, so that in electrically connecting the electrodes 6 of the semiconductor chip 5 with the inner portions of the leads 10B by the wire pieces 11, a bonding stage can be held in touch with the distal end parts of the inner portions of the leads 10B, so as to effectively conduct the heat of the bonding stage to the electrodes 6 of the semiconductor chip 5.

As a result, the inferior connections between the electrodes 6 of the semiconductor chip 4 and the wire pieces 11 can be relieved, and the inferior connections between the electrodes 6 of the semiconductor chip 5 and the wire pieces 11 can be relieved, so that the available percentage of the products of the semiconductor device 41 can be heightened.

Figure 34:
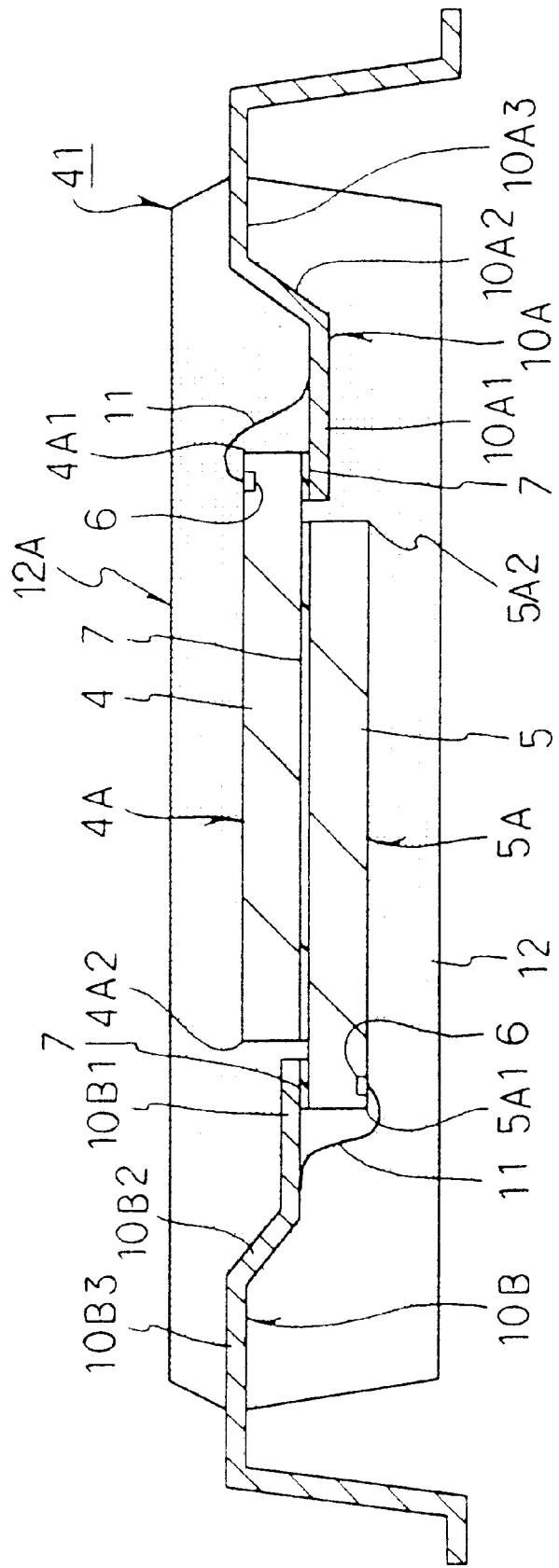
FIG. 34 is a sectional view of a semiconductor device showing a modification to Embodiment 6 of the present invention.

By the way, even in the semiconductor device 41 of this embodiment, the rear surfaces of the semiconductor chips 4, 5 may well be bonded and fixed through an adhesive layer 7 as illustrated in FIG. 34 (a sectional view).

EMBODIMENT 7

Figure 35:
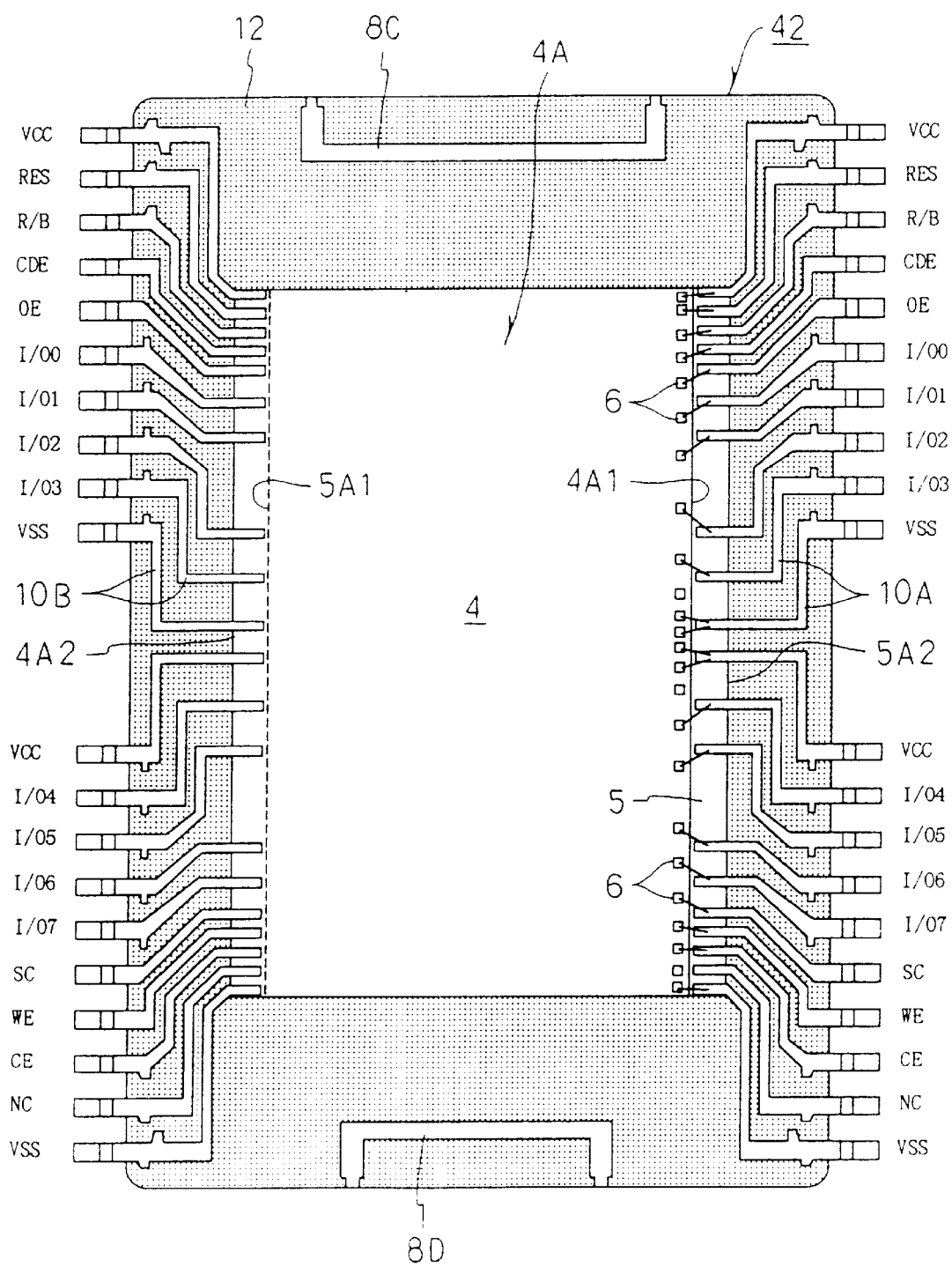
FIG. 35 is a plan view of a semiconductor device being Embodiment 7 of the present invention in a state here the upper part of a resin body has been removed.
Figure 36:
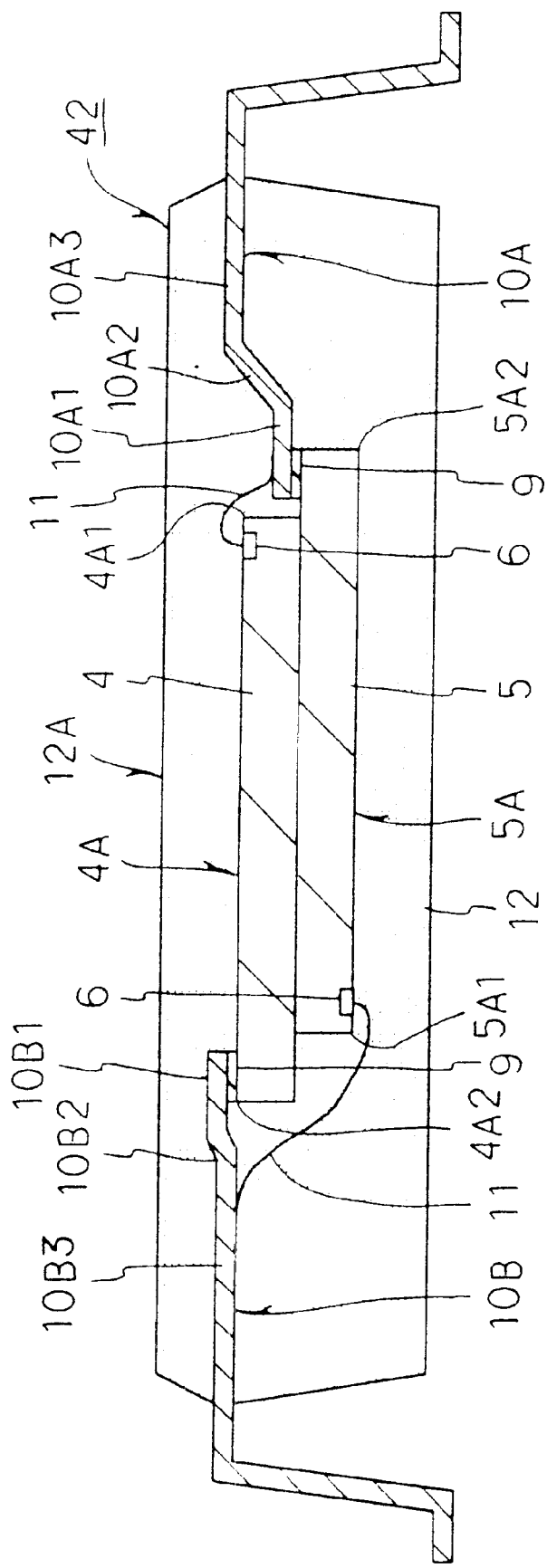
FIG. 36 is a sectional view of the semiconductor device being Embodiment 7 of the present invention.

FIG. 35 is a plan view of a semiconductor device being Embodiment 7 of the present invention in a state where the upper part of a resin body has been removed, while FIG. 36 is a sectional view of the semiconductor device.

As illustrated in FIGS. 35 and 36, the semiconductor device 42 of this embodiment has basically the same construction as that of Embodiment 5 described before, but it differs from the foregoing embodiment in constructional points explained below.

Each of a plurality of leads 10B is such that the distal end part of its inner portion lying within the resin body 12 is bonded and fixed through an adhesive layer 9 to the circuit forming surface 4A of the semiconductor chip 4 and on the side of the other longer latus 4A2 thereof.

Besides, the inner portion of each lead 10B is constructed having a first part 10B1 which traverses the other longer latus 4A2 of the semiconductor chip 4 lying outside one longer latus 5A1 of the semiconductor chip 5 and which is bonded and fixed to this circuit forming surface 4A, a second part 10B2 which bends from the first part 10B1 to the side of the rear surface of the semiconductor chip 4, and a third part 10B3 which extends from the second part 10B2 in the same direction as the extending direction of the first part 10B1. The third part 10A3 of each lead 10A and the third part 10B3 of each lead 10B lie above the central level of the resin body 12 in the thickness direction thereof (the horizontal plane of the resin body 12 at ½ of the thickness thereof) (that is, the third parts 10A3 and 10B3 lie on the side of the upper surface 12A of the resin body 12).

The manufacture of the semiconductor device 42 of this embodiment is somewhat different from the manufacturing process described in the foregoing embodiment 5. The first parts 10B1 of the leads 10B are bonded onto the side of the other longer latus 4A2 of the circuit forming surface 4A of this semiconductor chip 4, and the first parts 10A1 of the leads 10A are bonded to the region of the rear surface of the semiconductor chip 5 opposing to the region thereof on the side of the other longer latus 5A2 of the circuit forming surface 5A of this semiconductor chip 5, followed by wire bonding.

According to the semiconductor device 42 of this embodiment thus constructed, effects similar to those of the foregoing embodiment 5 are attained.

Figure 37:
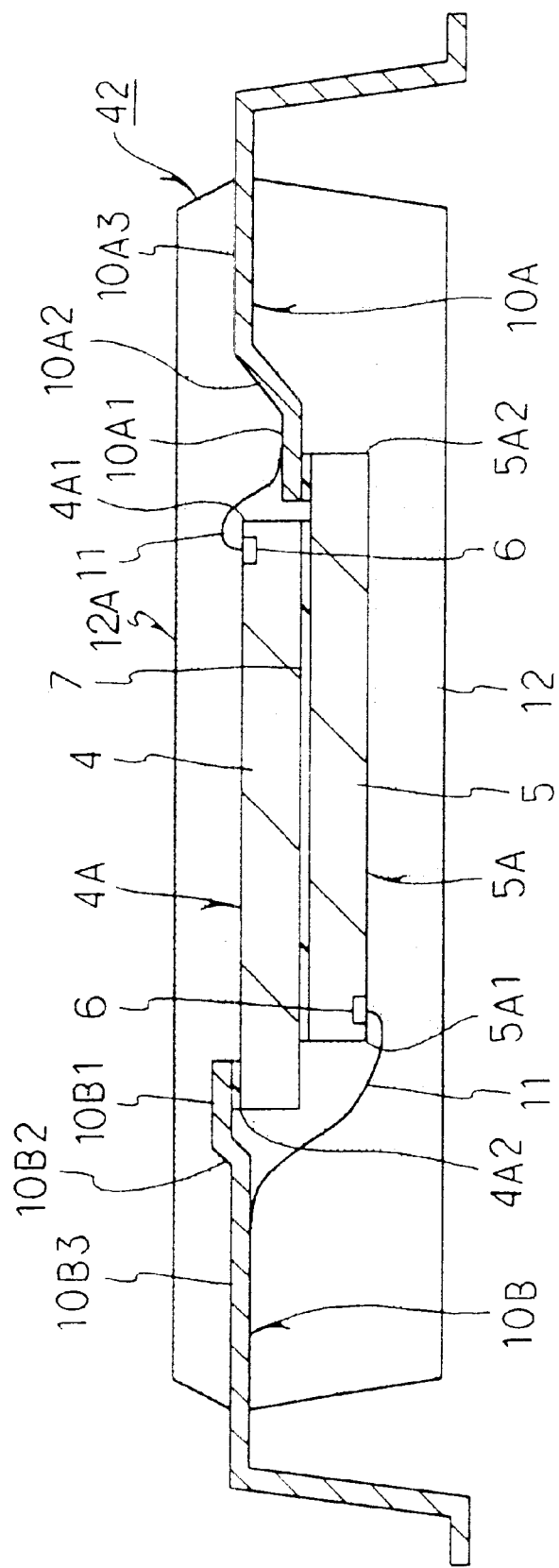
FIG. 37 is a sectional view of a semiconductor device showing a modification to Embodiment 7 of the present invention.

By the way, even in the semiconductor device 42 of this embodiment, the rear surfaces of the semiconductor chips 4, 5 may well be bonded and fixed through an adhesive layer 7 as illustrated in FIG. 37 (a sectional view).

EMBODIMENT 8

Figure 38:
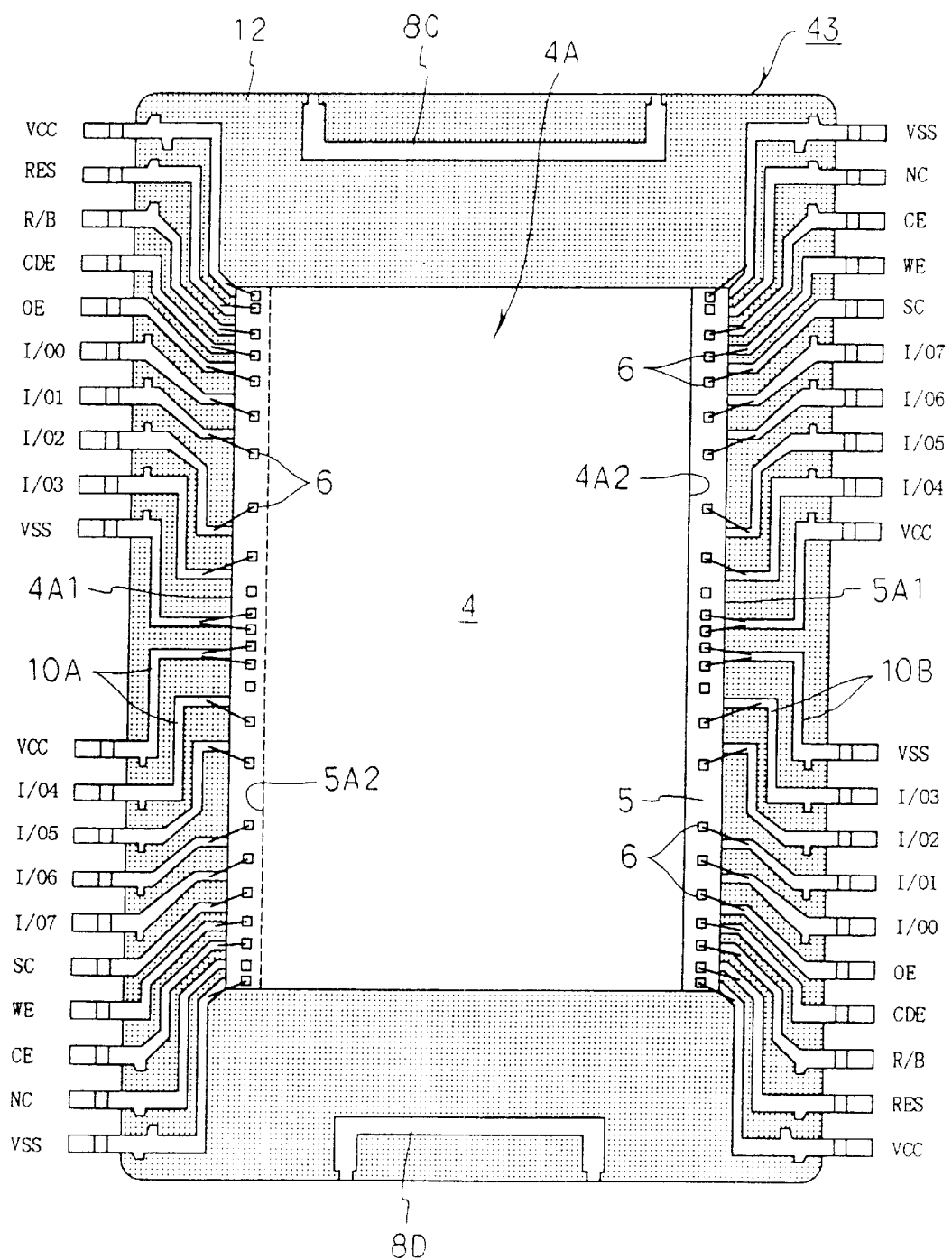
FIG. 38 is a plan view of a semiconductor device being Embodiment 8 of the present invention in a state where the upper part of a resin body has been removed.
Figure 39:
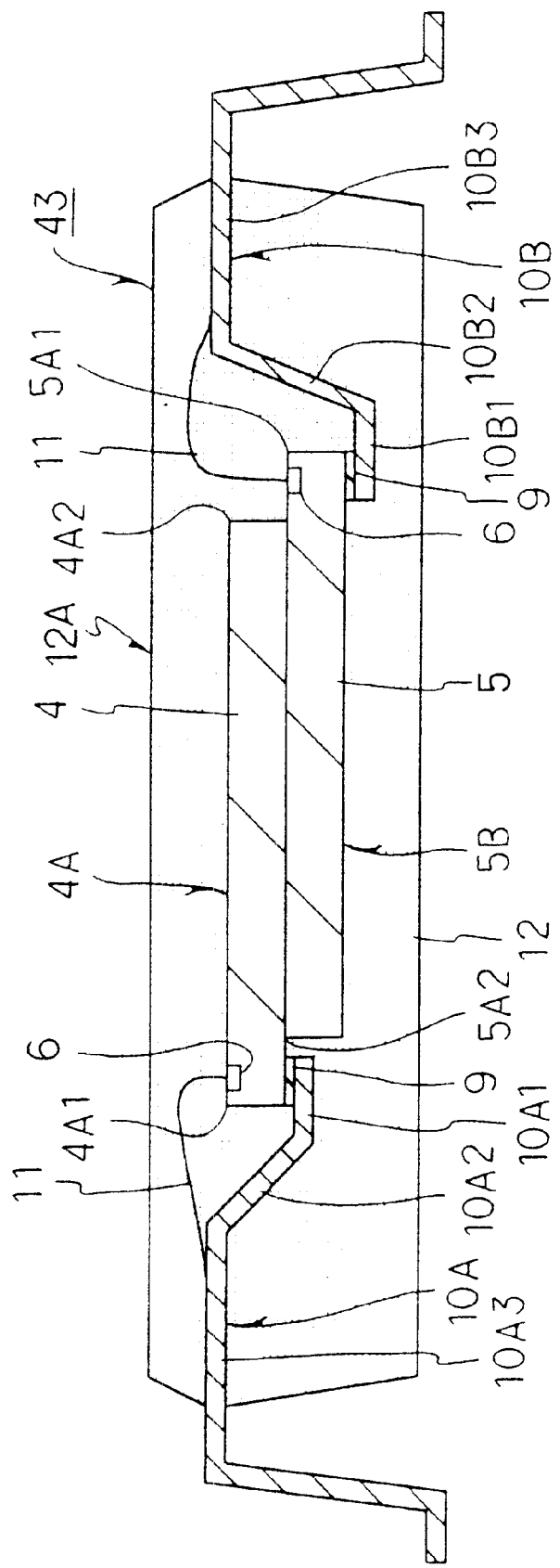
FIG. 39 is a sectional view of the semiconductor device being Embodiment 8 of the present invention.

FIG. 38 is a plan view of a semiconductor device being Embodiment 8 of the present invention in a state where the upper part of a resin body has been removed, while FIG. 39 is a sectional view of the semiconductor device.

As illustrated in FIGS. 38 and 39, the semiconductor device 43 of this embodiment has basically the same construction as that of Embodiment 5 described before, but it differs from the foregoing embodiment in constructional points explained below.

Semiconductor chips 4 and 5 are stacked in a state where the rear surface of these semiconductor chip 4 and the circuit forming surface 5A of the semiconductor chip 5 are faced to each other so that one longer latus 4A1 of the semiconductor chip 4 and the other longer latus 5A2 of the semiconductor chip 5 may confront the side of leads 10A, and besides, where the positions of these semiconductor chips are staggered relatively to each other so that one longer latus 4A1 of the semiconductor chip 4 may lie outside the other longer latus 5A2 of the semiconductor chip 5 and that one longer latus 5A1 of the semiconductor chip 5 may lie outside the other longer latus 4A2 of the semiconductor chip 4 (that is, where the positions are relatively shifted in the direction in which one longer latus 4A1 of the semiconductor chip 4 and one longer latus 5A1 of the semiconductor chip 5 come away from each other).

In addition, each of the plurality of leads 10A is such that the distal end part of its inner portion, lying within the resin body 12 is bonded and fixed to the rear surface of the semiconductor chip 4 through an adhesive layer 9 outside the other longer latus 5A2 of the semiconductor chip 5. Each of a plurality of leads 10B is such that the distal end part of its inner portion lying within the resin body 12 is bonded and fixed to the rear surface of the semiconductor chip 5 through an adhesive layer 9 outside the other longer latus 4A2 of the semiconductor chip 4.

Besides, the inner portion of each lead 10A is constructed having a first part 10A1 which traverses the longer latus of the rear surface of the semiconductor chip 4 lying outside the other longer latus 5A2 of the semiconductor chip 5 and which is bonded and fixed to this rear surface, a second part 10A2 which bends from the first part 10A1 to the side of the circuit forming surface 4A of the semiconductor chip 4, and a third part 10A3 which extends from the second part 10A2 in the same direction as the extending direction of the first part 10A1. Also, the inner portion of each lead 10B is constructed having a first part 10B1 which traverses the longer latus of the rear surface of the semiconductor chip 5 lying outside the other longer latus 4A2 of the semiconductor chip 4 and which is bonded and fixed to this rear surface, a second part 10B2 which bends from the first part 10B1 to the side of the circuit forming surface 4A of the semiconductor chip 4, and a third part 10B3 which extends from the second part 10B2 in the same direction as the extending direction of the first part 10B1. The third part 10A3 of each lead 10A and the third part 10B3 of each lead 10B lie above the central level of the resin body 12 in the thickness direction thereof (that is, the third parts 10A3 and 10B3 lie on the side of the upper surface 12A of the resin body 12).

The manufacture of the semiconductor device 43 of this embodiment is somewhat different from the manufacturing process described in the foregoing embodiment 5. The first parts 10B1 of the leads 10B are bonded onto the region of the rear surface of the semiconductor chip 5 opposing to the region thereof on the side of one longer latus 5A1 of the circuit forming surface 5A of this semiconductor chip 5, and the first parts 10A1 of the leads 10A are thereafter bonded onto the region of the rear surface of the semiconductor chip 4 opposing to the region thereof on the side of one longer latus 4A1 of the circuit forming surface 4 of this semiconductor chip 4, followed by wire bonding.

According to the semiconductor device 43 of this embodiment thus constructed, effects similar to those of the foregoing embodiment 5 are attained.

Moreover, each of the plurality of leads 10A is such that the distal end part of its inner portion lying within the resin body 12 is bonded and fixed to the rear surface of the semiconductor chip 4 through the adhesive layer 9 outside the other longer latus 5A2 of the semiconductor chip 5, so that in electrically connecting the electrodes 6 of the semiconductor chip 4 with the inner portions of the leads 10A by pieces of wire 11, a bonding stage can be held in touch with the distal end parts of the inner portions of the leads 10A, so as to effectively conduct the heat of the bonding stage to the electrodes 6 of the semiconductor chip 4.

Besides, each of a plurality of leads 10B is such that the distal end part of its inner portion lying within the resin body 12 is bonded and fixed to the rear surface of the semiconductor chip 5 through the adhesive layer 9 outside the other longer latus 4A2 of the semiconductor chip 4, so that in electrically connecting the electrodes 6 of the semiconductor chip 5 with the inner portions of the leads 10B by pieces of wire 11, a bonding stage can be held in touch with the distal end parts of the inner portions of the leads 10B, so as to effectively conduct the heat of the bonding stage to the electrodes 6 of the semiconductor chip 5.

As a result, the inferior connections between the electrodes 6 of the semiconductor chip 4 and the wire pieces 11 can be relieved, and the inferior connections between the electrodes 6 of the semiconductor chip 5 and the wire pieces 11 can be relieved, so that the available percentage of the products of the semiconductor device 43 can be heightened.

Figure 40:
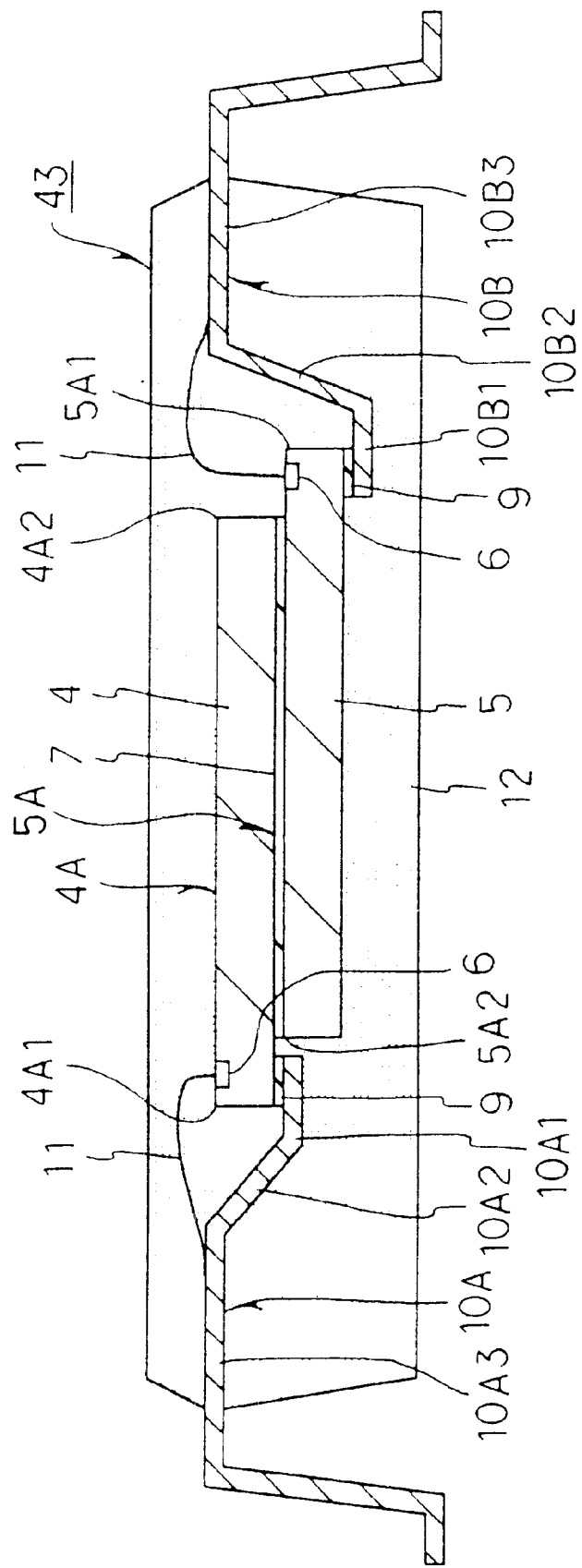
FIG. 40 is a sectional view of a semiconductor device showing a modification to Embodiment 8 of the present invention.

By the way, even in the semiconductor device 43 of this embodiment, the rear surface of the semiconductor chip 4 and the circuit forming surface 5A of the semiconductor chip 5 may well be bonded and fixed through an adhesive layer 7 as illustrated in FIG. 40 (a sectional view).

EMBODIMENT 9

Figure 41:
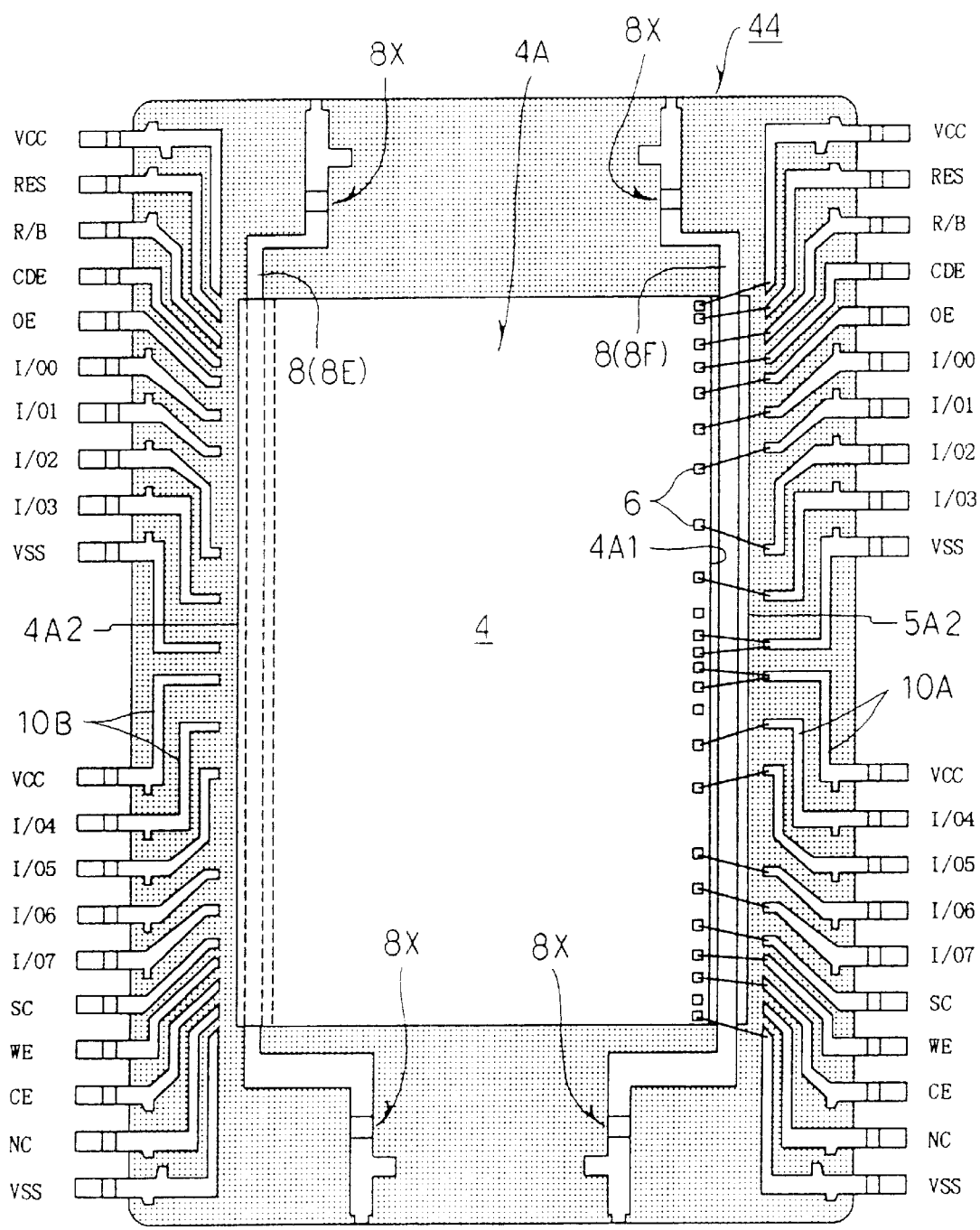
FIG. 41 is a plan view of a semiconductor device being Embodiment 9 of the present invention in a state where the upper part of a resin body has been removed.
Figure 42:
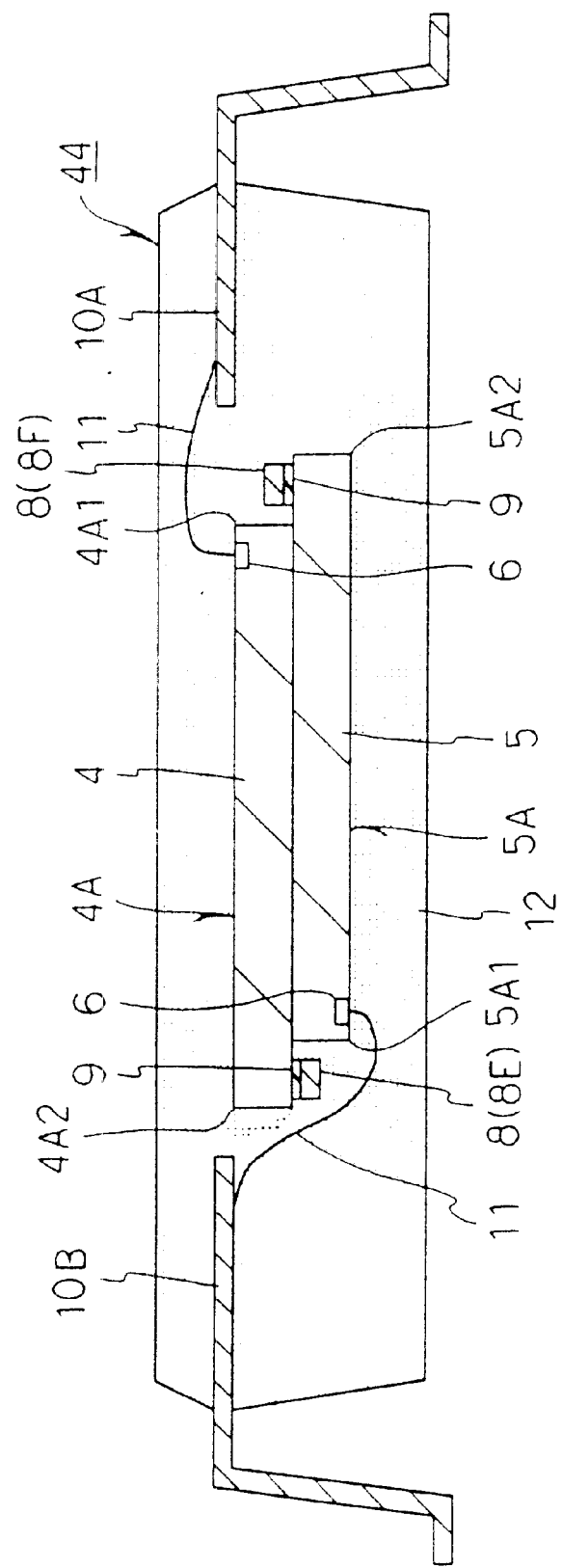
FIG. 42 is a sectional view of the semiconductor device being Embodiment 9 of the present invention.

FIG. 41 is a plan view of a semiconductor device being Embodiment 9 of the present invention in a state where the upper part of a resin body has been removed, while FIG. 42 is a sectional view of the semiconductor device.

As illustrated in FIGS. 41 and 42, the semiconductor device 44 of this embodiment has basically the same construction as that of Embodiment 4 described before, but it differs from the foregoing embodiment in constructional points explained below.

Semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may confront the side of leads 10A, and besides, where the positions of these semiconductor chips are staggered relatively to each other so that the other longer latus 4A2 of the semiconductor chip 4 may lie outside one longer latus 5A1 of the semiconductor chip 5 and that the other longer latus 5A2 of the semiconductor chip 5 may lie outside one longer latus 4A1 of the semiconductor chip 4 (that is, where the positions are relatively shifted in the direction in which one longer latus 4A1 of the semiconductor chip 4 and one longer latus 5A1 of the semiconductor chip 5 come near to each other).

In addition, the semiconductor chips 4 and 5 have not their rear surfaces bonded and fixed to each other, but they are stacked with their rear surfaces held in touch with each other.

The semiconductor device 44 of this embodiment is constructed having the two supporting leads 8, as in the foregoing embodiment 4. The chip fixation part of one 8E of the two supporting leads 8 is bonded and fixed through an adhesive layer 9 onto the region of the rear surface of the semiconductor chip 4 opposing to the region thereof on the side of the other longer latus 4A2 of the circuit forming surface 4A of this semiconductor chip 4, outside one longer latus 5A1 of the semiconductor chip 5. Also, the chip fixation part of the other supporting lead 8F is bonded and fixed through an adhesive layer 9 onto the region of the rear surface of the semiconductor chip 5 opposing to the region thereof on the side of the other longer latus 5A2 of the circuit forming surface 5A of this semiconductor chip 5, outside one longer latus 4A1 of the semiconductor chip 4.

The parts 8X of one supporting lead 8E are subjected to a bending work for locating the chip fixation part of this supporting lead onto the side of the rear surface of the semiconductor chip 4. Also, the parts 8X of the other supporting lead 8F are subjected to a bending work for locating the chip fixation part of this supporting lead onto the side of the rear surface of the semiconductor chip 5.

The manufacture of the semiconductor device 44 of this embodiment proceeds so that the region of the rear surface of the semiconductor chip 4 opposing to the region of the side of the other longer latus 4A2 of the circuit forming surface 4A of this semiconductor chip 4 is bonded and fixed to the chip fixation part of one supporting lead 8E through the adhesive layer 9, while the region of the rear surface of the semiconductor chip 5 opposing to the region of the side of the other longer latus 5A2 of the circuit forming surface 5A of this semiconductor chip 5 is bonded and fixed to the chip fixation part of the other supporting lead 8F through the adhesive layer 9, and that the electrodes 6 of the semiconductor chip 4 and the distal end parts of the inner portions of the leads 10A are electrically connected by pieces of wire 11, while the electrodes 6 of the semiconductor chip 5 and the distal end parts of the inner portions of leads 10B are electrically connected by pieces of wire 11. In the manufacture of the semiconductor device 44, the semiconductor chip 4 is supported on the frame member of a lead frame through one supporting lead 8E, and the semiconductor chip 5 is supported on the frame member of the lead frame through the other supporting lead 8F.

According to the semiconductor device 44 of this embodiment thus constructed, effects similar to those of the foregoing embodiment 5 are attained.

Moreover, the semiconductor chip 4 is supported by one supporting lead 8E, while the semiconductor chip 5 is supported by the other supporting lead 8F, so that the bonding fixation of the respective semiconductor chips 4, 5 can be dispensed with, in other words, that an adhesive layer can be omitted. As a result, thinning in the structure of the semiconductor device 44 and curtailment in the cost thereof can be achieved.

By the way, even in the semiconductor device 44 of this embodiment, the rear surfaces of the semiconductor chips 4 and 5 may well be bonded and fixed through an adhesive layer.

EMBODIMENT 10

Figure 43:
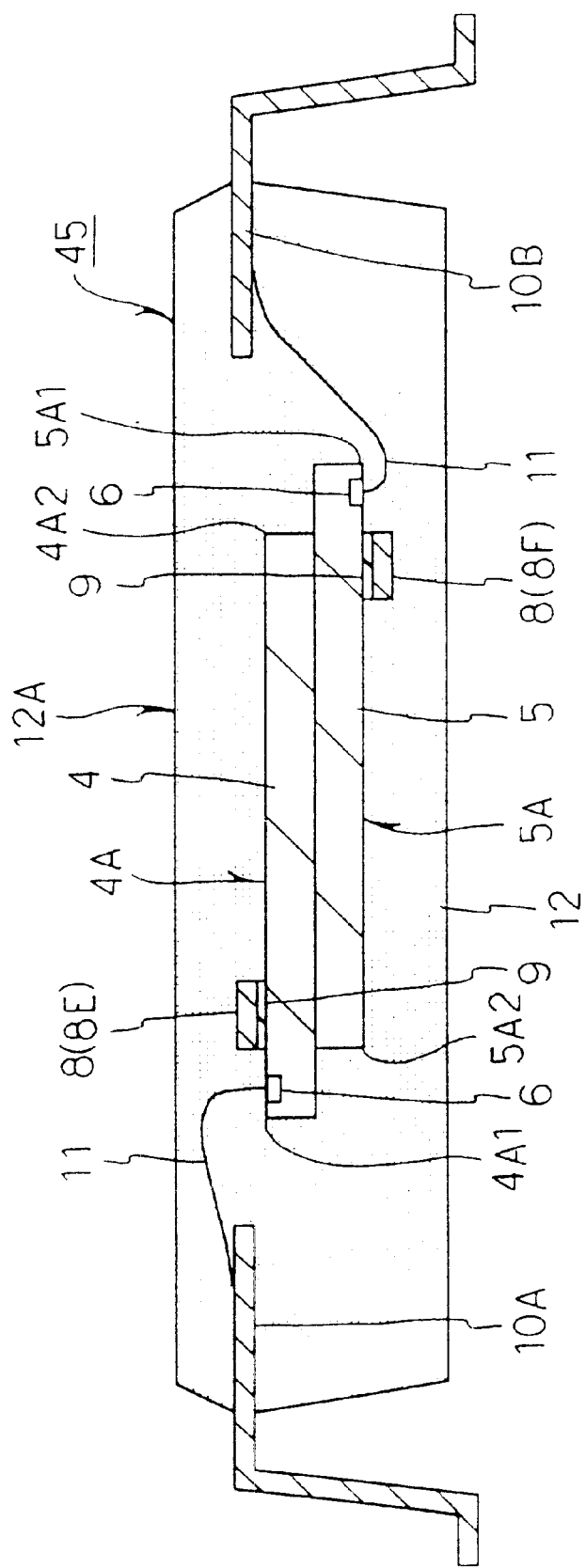
FIG. 43 is a sectional view of a semiconductor device being Embodiment 10 of the present invention.

FIG. 43 is a sectional view of a semiconductor device being Embodiment 10 of the present invention.

As illustrated in FIG. 43, the semiconductor device 45 of this embodiment has basically the same construction as that of Embodiment 9 described above, but it differs from the foregoing embodiment in constructional points explained below.

Semiconductor chips 4 and 5 are stacked in a state where the rear surfaces of these semiconductor chips are faced to each other so that one longer latus. 4A1 of the semiconductor chip 4 and the other longer latus 5A2 of the semiconductor chip 5 may confront the side of leads 10A, and besides, where the positions of these semiconductor chips are staggered relatively to each other so that one longer latus 4A1 of the semiconductor chip 4 may lie outside the other longer latus 5A2 of the semiconductor chip 5 and that one longer latus 5A1 of the semiconductor chip 5 may lie outside the other longer latus 4A2 of the semiconductor chip 4 (that is, where the positions are relatively shifted in the direction in which one longer latus 4A1 of the semiconductor chip 4 and one longer latus 5A1 of the semiconductor chip 5 come away from each other).

The semiconductor device 45 of this embodiment is constructed having the two supporting leads 8, as in the foregoing embodiment 9. The chip fixation part of one 8E of the two supporting leads 8 is bonded and fixed through an adhesive layer 9 onto the circuit forming surface 4A of the semiconductor chip 4 on the side of one longer latus 4A1 of this semiconductor chip. Also, the chip fixation part of the other supporting lead 8F is bonded and fixed through an adhesive layer 9 onto the circuit forming surface 5A of the semiconductor chip 5 on the side of one longer latus 4A1 of this semiconductor chip.

Parts of one supporting lead 8E are subjected to a bending work for locating the chip fixation part of this supporting lead onto the side of the circuit forming surface 4A of the semiconductor chip 4. Also, parts of the other supporting lead 8F are subjected to a bending work for locating the chip fixation part of this supporting lead onto the side of the circuit forming surface 5A of the semiconductor chip 5.

The manufacture of the semiconductor device 45 of this embodiment proceeds so that the semiconductor chips 4 and 5 are respectively inserted aslant between the supporting lead 8E and the supporting lead 8F, that the supporting lead 8E is bonded and fixed to the circuit forming surface 4A of the semiconductor chip 4A, while the supporting lead 8F is bonded and fixed to the circuit forming surface 5A of the semiconductor chip 5A, and that the electrodes 6 of the semiconductor chip 4 and the distal end parts of the inner portions of the leads 10A are electrically connected by pieces of wire 11, while the electrodes 6 of the semiconductor chip 5 and the distal end parts of the inner portions of leads 10B are electrically connected by pieces of wire 11. In the manufacture of the semiconductor device 45, the semiconductor chip 4 is supported on the frame member of a lead frame through one supporting lead 8E, and the semiconductor chip 5 is supported on the frame member of the lead frame through the other supporting lead 8F.

According to the semiconductor device 45 of this embodiment thus constructed, effects similar to those of the foregoing embodiment 9 are attained.

Moreover, the semiconductor chips 4 and 5 are stacked in the state where the positions of these semiconductor chips are relatively shifted in the direction in which one longer latus 4A1 of the semiconductor chip 4 and one longer latus 5A1 of the semiconductor chip 5 come away from each other, so that in electrically connecting the electrodes 6 of the semiconductor chip 4 with the inner portions of the leads 10A by the wire pieces 11, a heat stage can be held in touch with the partial region of the rear surface of the semiconductor chip 4 opposing to the electrodes 6 thereof, so as to effectively conduct the heat of the heat stage to the electrodes 6 of the semiconductor chip 4.

Besides, in electrically connecting the electrodes 6 of the semiconductor chip 5 with the inner portions of the leads 10B by the wire pieces 11, a heat stage can be held in touch with the partial region of the rear surface of the semiconductor chip 5 opposing to the electrodes 6 thereof, so as to effectively conduct the heat of the heat stage to the electrodes 6 of the semiconductor chip 5.

As a result, the inferior connections between the electrodes 6 of the semiconductor chip 4 and the wire pieces 11 can be relieved, and the inferior connections between the electrodes 6 of the semiconductor chip 5 and the wire pieces 11 can be relieved, so that the available percentage of the products of the semiconductor device 45 can be heightened.

By the way, even in the semiconductor device 45 of this embodiment, the rear surfaces of the semiconductor chips 4 and 5 may well be bonded and fixed through an adhesive layer.

EMBODIMENT 11

Figure 44:
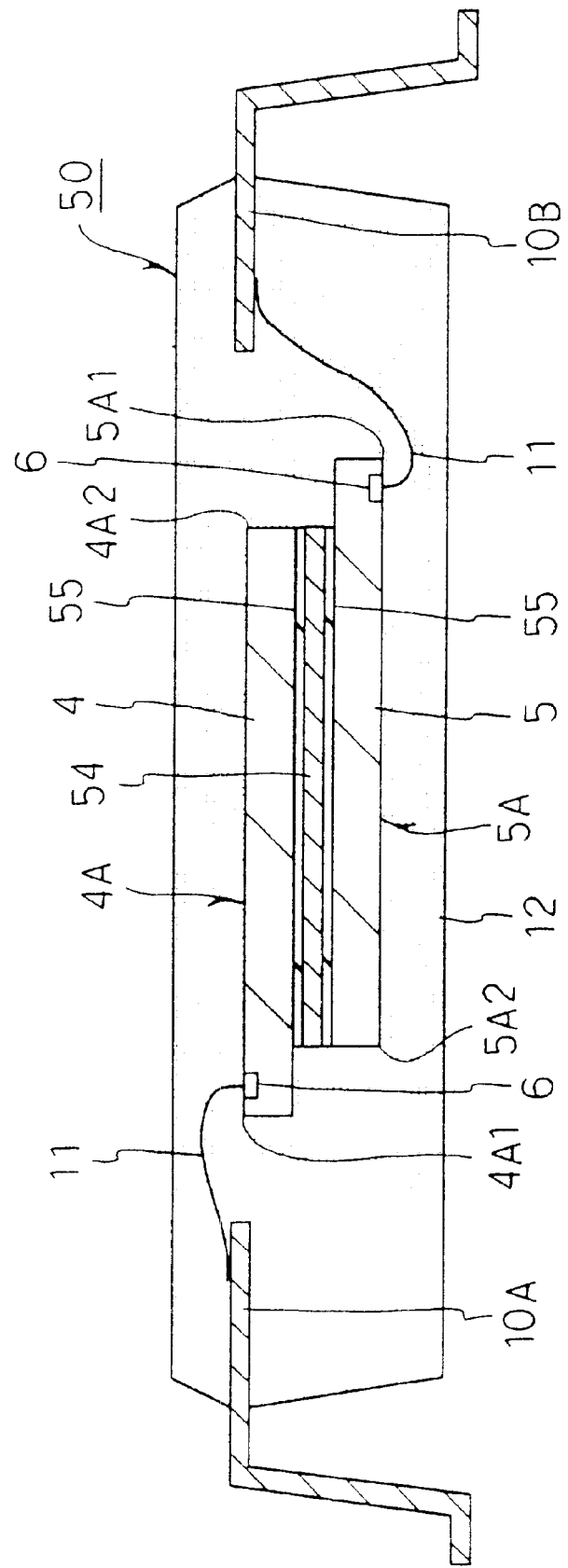
FIG. 44 is a sectional view of a semiconductor device being Embodiment 11 of the present invention.

FIG. 44 is a sectional view of a semiconductor device being Embodiment 11 of the present invention.

As illustrated in FIG. 44, the semiconductor device 50 of this embodiment has basically the same construction as that of Embodiment 10 described above, but it differs from the foregoing embodiment in constructional points explained below.

The semiconductor device 50 is constructed having a tab 54. A semiconductor chip 4 has its rear surface bonded and fixed through an adhesive layer 55 onto the front surface (one principal surface) of the front and rear surfaces (one principal surface and the other principal surface opposing to each other) of the tab 54. A semiconductor chip 5 has its rear surface bonded and fixed through an adhesive layer 55 onto the rear surface (the other principal surface) of the front and rear surfaces of the tab 54. Herein, the tab 54 is formed having a planar size which is smaller than the planar size of each of the semiconductor chips (4, 5).

The semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may confront the side of leads 10A, and besides, where the positions of these semiconductor chips are staggered relatively to each other so that one longer latus 4A1 of the semiconductor chip 4 may lie outside the other longer latus 5A2 of the semiconductor chip 5, as well as the side surface of the tab 54, and that one longer latus 5A2 of the semiconductor chip 5 may lie outside the other longer latus 4A2 of the semiconductor chip 4, as well as the side surface of the tab 54 (that is, where the positions are relatively shifted in the direction in which one longer latus 4A1 of the semiconductor chip 4 and one longer latus 5A1 of the semiconductor chip 5 come away from each other).

Owing to such a construction, in electrically connecting the electrodes 6 of the semiconductor chip 4 with the inner portions of the leads 10A by pieces of wire 11, a heat stage can be held in touch with the partial region of the rear surface of the semiconductor chip 4 opposing to the electrodes 6 thereof, and the heat of the heat stage is effectively conducted to the electrodes 6 of the semiconductor chip 4, so that the inferior connections between the electrodes 6 of the semiconductor chip 4 and the wire pieces 11 can be relieved. Besides, in electrically connecting the electrodes 6 of the semiconductor chip 5 with the inner portions of leads 10B by pieces of wire 11, a heat stage can be held in touch with the partial region of the rear surface of the semiconductor chip 5 opposing to the electrodes 6 thereof, and the heat of the heat stage is effectively conducted to the electrodes 6 of the semiconductor chip 5, so that the inferior connections between the electrodes 6 of the semiconductor chip 5 and the wire pieces 11 can be relieved. As a result, the available percentage of products can be heightened also for the semiconductor device 50 having the tab 54.

EMBODIMENT 12

Figure 45:
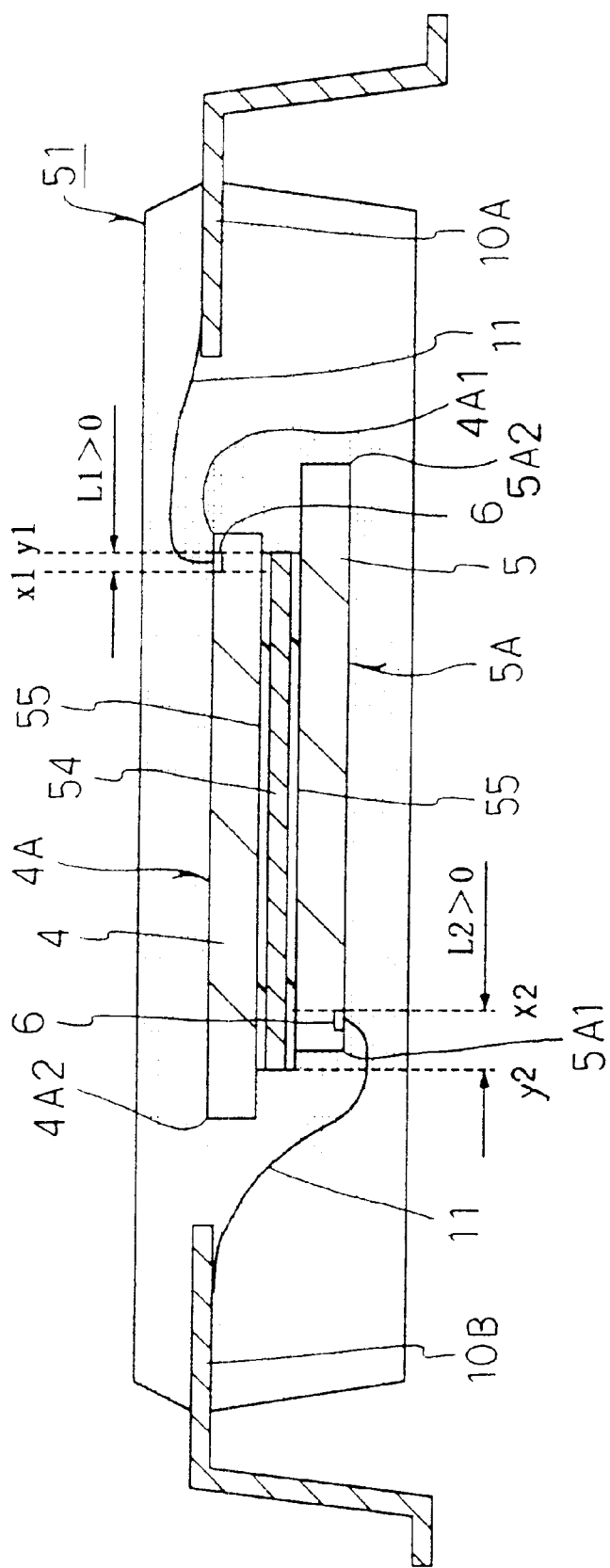
FIG. 45 is a sectional view of a semiconductor device being Embodiment 12 of the present invention.

FIG. 45 is a sectional view of a semiconductor device being Embodiment 12 of the present invention.

As illustrated in FIG. 45, the semiconductor device 51 of this embodiment has basically the same construction as that of Embodiment 11 described above, but it differs from the foregoing embodiment in constructional points explained below.

Semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may confront the side of leads 10A, and besides, where the positions of these semiconductor chips are staggered relatively to each other so that the side surface y1 of a tab 54 existing on the same side as one longer latus 4A1 of the semiconductor chip 4 may lie outside the inner side end x1 of each of the electrodes 6 of the semiconductor chip 4 and that the side surface y2 of the tab 54 existing on the same side as one longer latus 5A1 of the semiconductor chip 5 may lie outside the inner side end x2 of each of the electrodes 6 of the semiconductor chip 5 (that is, where the positions are relatively shifted in the direction in which one longer latus 4A1 of the semiconductor chip 4 and one longer latus 5A1 of the semiconductor chip 5 come near to each other).

Owing to such a construction, even when the planar size of the tab 54 is made smaller than the planar size of each of the semiconductor chips (4, 5) in order to reduce the area of each adhesive layer 55, the region of the rear surface of the semiconductor chip 4 opposing to the electrodes 6 thereof and the region of the rear surface of the semiconductor chip 5 opposing to the electrodes 6 thereof are supported by the tab 54. Therefore, bondability on the occasion of connecting one end side of each piece of wire 11 to the corresponding electrode 6 of the semiconductor chip 4 is enhanced, and bondability on the occasion of connecting one end side of each piece of wire 11 to the corresponding electrode 6 of the semiconductor chip 5 is enhanced.

EMBODIMENT 13

Figure 46:
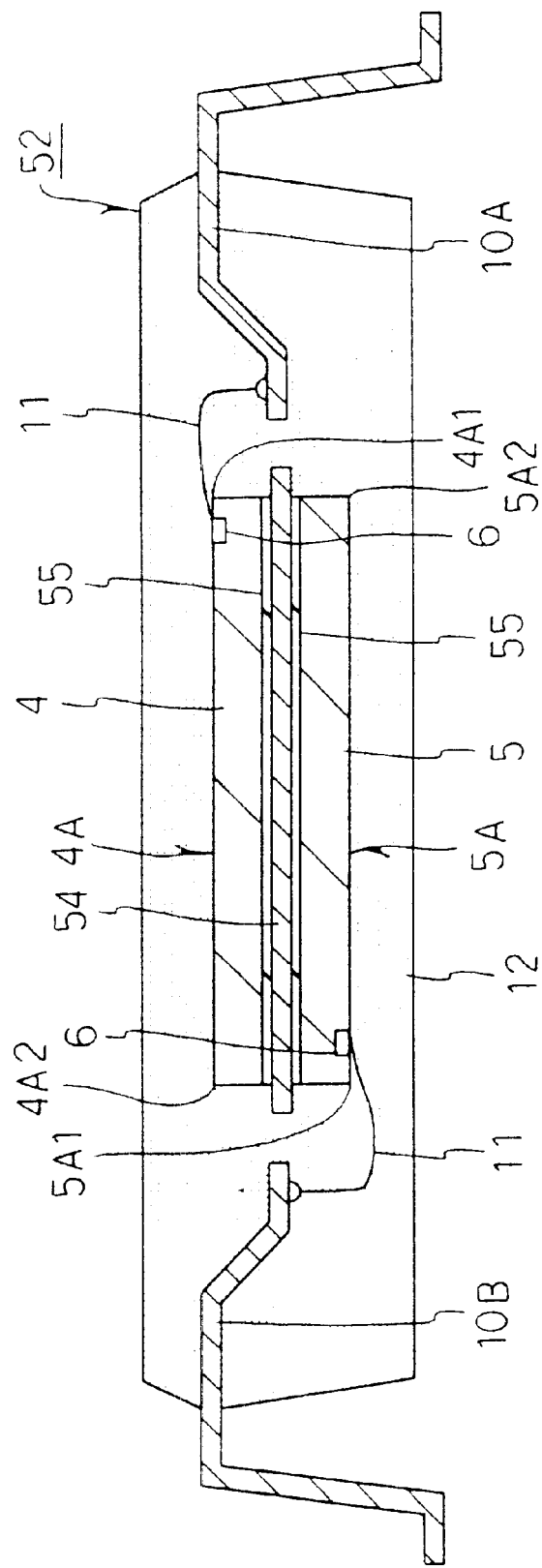
FIG. 46 is a sectional view of a semiconductor device being Embodiment 13 of the present invention.

FIG. 46 is a sectional view of a semiconductor device being Embodiment 13 of the present invention.

As illustrated in FIG. 46, the semiconductor device 52 of this embodiment has basically the same construction as that of Embodiment 10 described before, but it differs from the foregoing embodiment in constructional points explained below.

The semiconductor device 52 is constructed having a tab 54. A semiconductor chip 4 has its rear surface bonded and fixed through an adhesive layer 55 onto the front surface (one principal surface) of the front and rear surfaces (one principal surface and the other principal surface opposing to each other) of the tab 54. A semiconductor chip 5 has its rear surface bonded and fixed through an adhesive layer 55 onto the rear surface (the other principal surface) of the front and rear surfaces of the tab 54. Herein, the tab 54 is formed having a planar size which is larger than the planar size of each of the semiconductor chips (4, 5).

The semiconductor chips 4 and 5 are stacked in a state where the rear surfaces of these semiconductor chips are faced to each other so that one longer latus 4A1 of the semiconductor chip 4 and the other longer latus 5A2 of the semiconductor chip 5 may confront the side of leads 10A.

Pieces of wire 11 are connected by reverse bonding which connects each wire piece on the side of the corresponding lead earlier (first bonding) and connects it on the side of the corresponding electrode of the semiconductor chip later (second bonding). At the first bonding, in order to prevent the wire piece required especially in ball bonding. Accordingly, the wire connection surface of each lead 10A is located nearer to the side of the semiconductor chip 5 with respect to the circuit forming surface 4A of the semiconductor chip 4, whereupon the connection between the electrodes of the semiconductor chip 4 and the wire connection surface of the lead 10A by the wire piece 11 is done by the reverse bonding. Thus, the pull-up of the wire piece 11 is cancelled by the level difference between the circuit forming surface 4A of the semiconductor chip 4 and the wire connection surface of the lead 10A, so that the resin thickness of a resin body 12 on the side of the circuit forming surface 4A of the semiconductor chip 4 can be reduced. Likewise, the wire connection surface of each lead 10B is located nearer to the side of the semiconductor chip 4 with respect to the circuit forming surface 5A of the semiconductor chip 5, whereupon the connection between the electrode 6 of the semiconductor chip 5 and the wire connection surface of the lead 10B by the wire piece 11 is done by the reverse bonding. Thus, the pull-up of the wire piece 11 is cancelled by the level difference between the circuit forming surface 5A of the semiconductor chip 5 and the wire connection surface of the lead 10B, so that the resin thickness of the resin body 12 on the side of the circuit forming surface 5A of the semiconductor chip 5 can be reduced. As a result, a thinned structure can be attained even in the semiconductor device 52 having the tab 54.

By the way, salient electrodes may well be provided on the electrodes 6 of the respective semiconductor chips 4, 5. In this case, the connections of the wire pieces 11 at the second bonding are facilitated.

EMBODIMENT 14

In this embodiment, there will be described an example in which the present invention is applied to a semiconductor device wherein two semiconductor chips each having a built-in DRAM (Dynamic Random Access Memory) are encapsulated with an one resin body.

Figure 47:
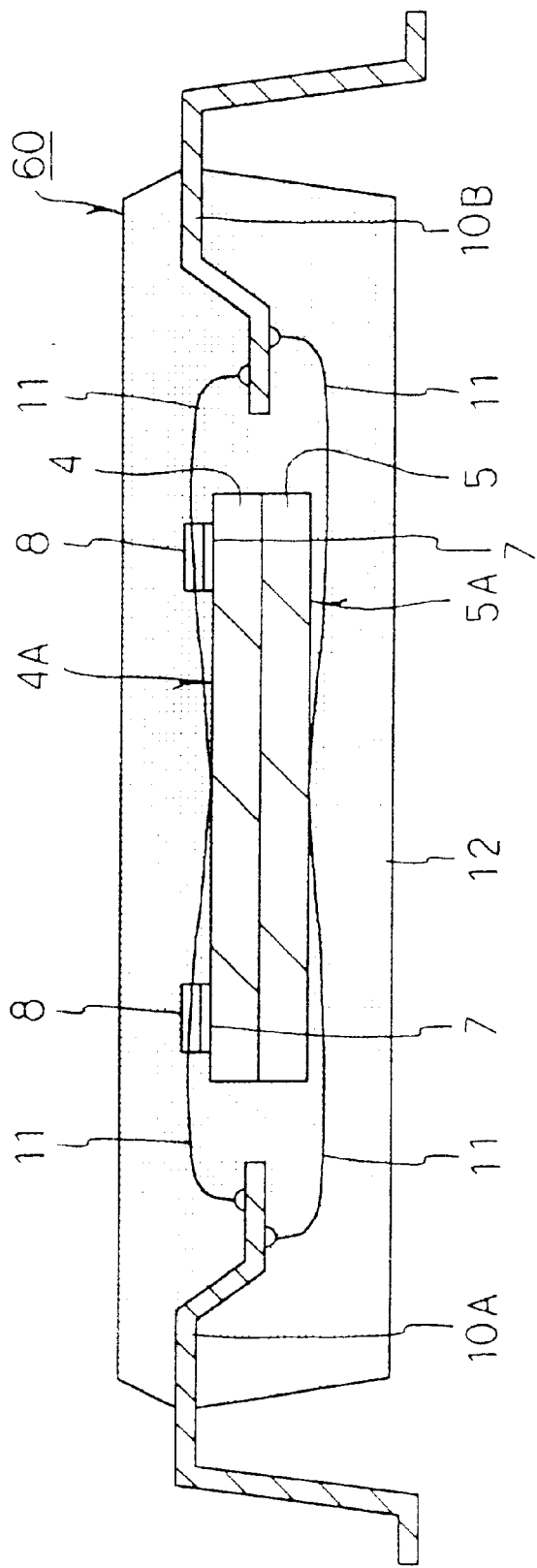
FIG. 47 is a sectional view of a semiconductor device being Embodiment 14 of the present invention.
Figure 48:
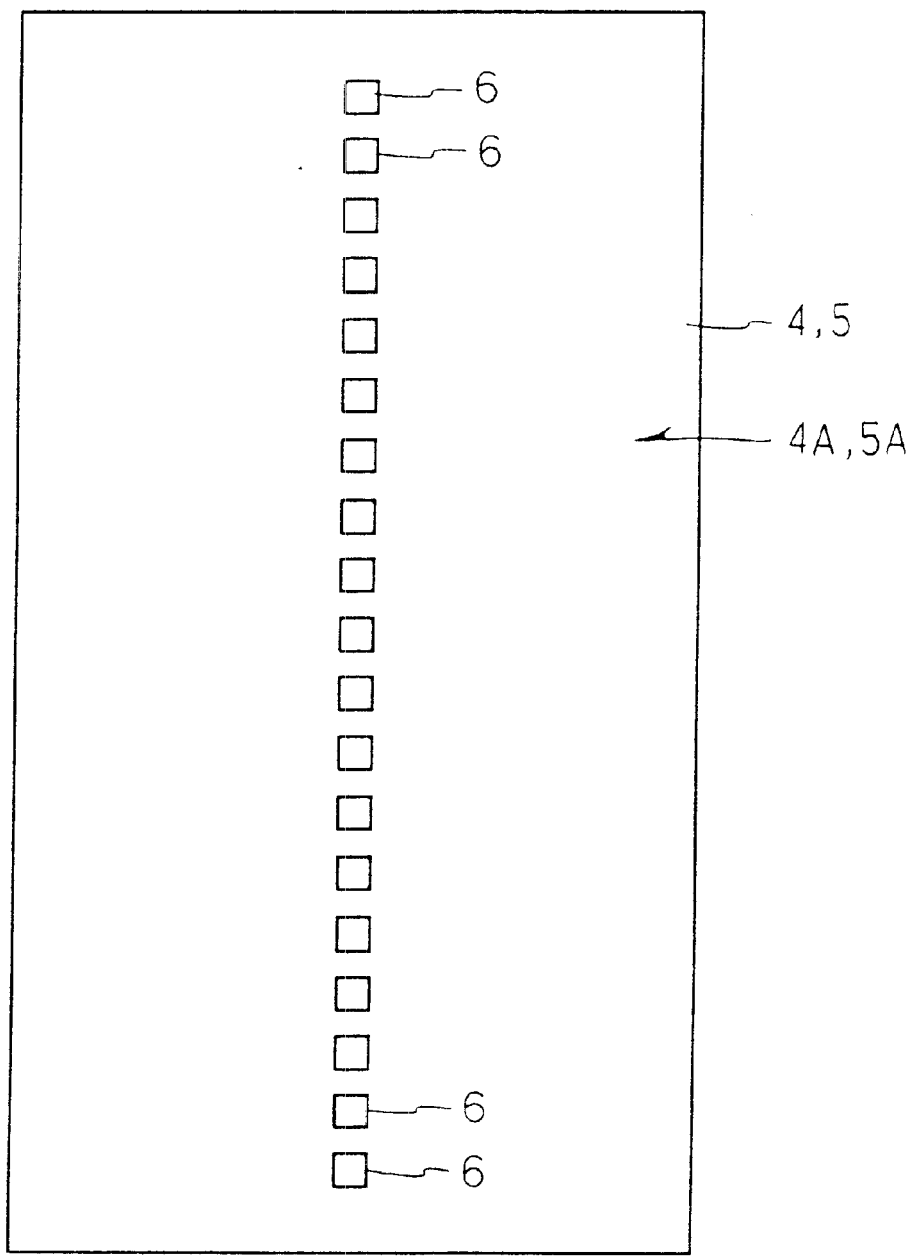
FIG. 48 is a plan view of semiconductor chips which are assembled in the semiconductor device being Embodiment 14 of the present invention.

FIG. 47 is a sectional view of a semiconductor device being Embodiment 14 of the present invention, while FIG. 48 is a plan view of semiconductor chips which are assembled in the semiconductor device.

As illustrated in FIG. 48, each of the semiconductor chips 4, 5 is so constructed that a plurality of electrodes 6 are arranged in the state of one column at the central part of its circuit forming surface (4A or 5A) and in the direction of the longer latera thereof. In a case where such semiconductor chips 4, 5 have been stacked with their rear surfaces facing to each other, the stacked structure falls into a state where the electrodes 6 of the same functions on the respective semiconductor chips 4, 5 oppose in the vertical direction of this stacked structure. As illustrated in FIG. 47, therefore, a single lead 10A arranged on the side of one longer latus of the semiconductor chip 4 and the electrodes 6 of the identical function on the respective semiconductor chips 4, 5 can be electrically connected by pieces of wire 11. Also, a single lead 10B arranged on the side of the other longer latus of the semiconductor chip 4 and the electrodes 6 of the identical function on the respective semiconductor chips 4, 5 can be electrically connected by pieces of wire 11.

In the semiconductor device 60 of this embodiment, the wire connection surface of each of the leads (10A, 10B) lies midway between the circuit forming surface 4A of the semiconductor chip 4 and the circuit forming surface 5A of the semiconductor chip 5. Accordingly, the connections between the electrode 6 of the semiconductor chip 4 and the wire connection surfaces (the upper sides as viewed in FIG. 47) of the leads (10A, 10B) by the wire pieces 11 are done by reverse bonding as in the foregoing embodiment 13, whereby the pull-up of the wire pieces 11 is cancelled by the level difference between the circuit forming surface 4A of the semiconductor chip 4 and the wire connection surfaces of the leads 10A, so that the resin thickness of the resin body 12 on the side of the circuit forming surface 4A of the semiconductor chip 4 can be reduced. Likewise, the connections between the electrode 6 of the semiconductor chip 5 and the wire connection surfaces (the lower sides as viewed in FIG. 47) of the leads (10A; 10B) by the wire pieces 11 are done by the reverse bonding, whereby the pull-up of the wire pieces 11 is cancelled by the level difference between the circuit forming surface 5A of the semiconductor chip 5 and the wire connection surfaces of the leads 10B, so that the resin thickness of the resin body 12 on the side of the circuit forming surface 5A of the semiconductor chip 5 can be reduced. As a result, it is permitted to thin the structure of the semiconductor device 60 wherein the two semiconductor chips (4, 5) each having the electrodes 6 arranged at the central part of its circuit forming surface are stacked and are encapsulated with the one resin body 12.

By the way, although this embodiment has been described concerning the semiconductor chips in each of which the electrodes 6 are arranged in the state of one column at the central part of its circuit forming surface, a thinned structure can be attained even with semiconductor chips in each of which electrodes 6 are arranged in the state of two zigzag columns at the central part of its circuit forming surface.

While the invention made by the inventors has been concretely described above in conjunction with the embodiments, it is a matter of course that the present invention is not restricted to the foregoing embodiments, but that it is variously alterable within a scope not departing from the purport thereof.

By way of example, the present invention is applicable to semiconductor devices of SOJ (Small Outline J-leaded Package) type, SOP (Small Outline Package) type, etc. which have bidirectional lead array structures.

Besides, the present invention is applicable to semiconductor devices of QFP (Quad Flatpack Package) type, QFJ (Quad Flatpack J-leaded Package) type, etc. which have quadridirectional lead array structures.

INDUSTRIAL APPLICABILITY

It is possible to thin the structure of a semiconductor device in which two semiconductor chips are stacked and are encapsulated with an one resin body.

Besides, it is possible to heighten the available percentage of the products of the semiconductor device.

What is claimed is:

1. A semiconductor device, comprising:
   a resin body;
   a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged outside said first latus of said first semiconductor chip, and which are electrically connected to the corresponding electrodes of said first semiconductor chip through pieces of conductive wire;

a plurality of second leads which extend inside and outside said resin body, which are arranged outside a second latus of said first semiconductor chip opposing to said first latus thereof, and which are electrically connected to the corresponding electrodes of said second semiconductor chip through pieces of conductive wire; and supporting leads which support said first semiconductor chip and said second semiconductor chip;

wherein said first semiconductor chip and said second semiconductor chip are bonded and fixed to each other in a state where the rear surfaces of the respective semiconductor chips are faced to each other so that the second latus of said first semiconductor chip and said first latus of said second semiconductor chip may confront a side of said second leads; and said supporting leads are bonded and fixed to either of the front surface of said first semiconductor chip or the front surface of said second semiconductor chip.

2. A semiconductor device according to claim 1, wherein said first semiconductor chip and said second semiconductor chip are bonded and fixed in a state where positions of the respective semiconductor chips are staggered relatively to each other so that said electrodes of said first semiconductor chip may lie outside a second latus of said second semiconductor chip opposing to said first latus thereof, and that said electrodes of said second semiconductor chip may lie outside said second latus of said first semiconductor chip.

3. A semiconductor device according to claim 2, wherein said first semiconductor chip and said second semiconductor chip are bonded and fixed in a state where the positions of the respective semiconductor chips are staggered relatively to each other so that a third latus of said first semiconductor chip intersecting with said first latus thereof may lie outside a third latus of said second semiconductor chip intersecting with said first latus thereof and lying on the same side as the third latus of said first semiconductor chip, and that a fourth latus of said second semiconductor chip opposing to the third latus thereof may lie outside a fourth latus of said first semiconductor chip opposing to said third latus thereof and lying on the same side as the fourth latus of said second semiconductor chip.

4. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged outside said first latus of said first semiconductor chip, and which are electrically connected to the corresponding electrodes of said first semiconductor chip through pieces of conductive wire;

a plurality of second leads which extend inside and outside said resin body, which are arranged outside a second latus of said first semiconductor chip opposing to said first latus thereof, and which are electrically connected to the corresponding electrodes of said second semiconductor chip through pieces of conductive wire;

a first supporting lead which is arranged outside a third latus of said first semiconductor chip intersecting with said first latus thereof and outside a third latus of said second semiconductor chip intersecting with said first latus thereof; and a second supporting lead which is arranged outside a fourth latus of said first semiconductor chip opposing to the third latus thereof and outside a fourth latus of said second semiconductor chip opposing to the third latus thereof;

wherein said first semiconductor chip and said second semiconductor chip are bonded and fixed to each other in a state where the rear surfaces of the respective semiconductor chips are faced to each other so that the second latus of said first semiconductor chip and said first latus of said second semiconductor chip may confront a side of said second leads, and where positions of said respective semiconductor chips are staggered relatively to each other so that said third latus of said first semiconductor chip may lie outside said third latus of said second semiconductor chip and that the fourth latus of said second semiconductor chip may lie outside the fourth latus of said first semiconductor chip;

said first supporting lead is bonded and fixed onto the rear surface of said first semiconductor chip outside said third latus of said second semiconductor chip; and said second supporting lead is bonded and fixed onto the rear surface of said second semiconductor chip outside said fourth latus of said first semiconductor chip.

5. A semiconductor device according to claim 4, wherein said first semiconductor chip and said second semiconductor chip are bonded and fixed in a state where the positions of said respective semiconductor chips are staggered relatively to each other so that said electrodes of said first semiconductor chip may lie outside a second latus of said second semiconductor chip opposing to said first latus thereof, and that said electrodes of said second semiconductor chip may lie outside said second latus of said first semiconductor chip.

6. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged outside said first latus of said first semiconductor chip, and which are electrically connected to the corresponding electrodes of said first semiconductor chip through pieces of conductive wire;

a plurality of second leads which extend inside and outside said resin body, which are arranged outside a second latus of said first semiconductor chip opposing to said first latus thereof, and which are electrically connected to the corresponding electrodes of said second semiconductor chip through pieces of conductive wire;

a first supporting lead which is arranged outside a third latus of said first semiconductor chip intersecting with said first latus thereof and outside a third latus of said second semiconductor chip intersecting with said first latus thereof; and a second supporting lead which is arranged outside a fourth latus of said first semiconductor chip opposing to the third latus thereof and outside a fourth latus of said second semiconductor chip opposing to the third latus thereof;

wherein said first semiconductor chip and said second semiconductor chip are bonded and fixed to each other in a state where the rear surfaces of the respective semiconductor chips are faced to each other so that the second latus of said first semiconductor chip and said first latus of said second semiconductor chip may confront a side of said second leads;

said first supporting lead is bonded and fixed onto the front surface of said first semiconductor chip and on a side of said third latus thereof; and said second supporting lead is bonded and fixed onto the front surface of said second semiconductor chip and on a side of the fourth latus thereof.

7. A semiconductor device according to claim 6, wherein said first semiconductor chip and said second semiconductor chip are bonded and fixed in a state where positions of said respective semiconductor chips are staggered relatively to each other so that said electrodes of said first semiconductor chip may lie outside a second latus of said second semiconductor chip opposing to said first latus thereof, and that said electrodes of said second semiconductor chip may lie outside said second latus of said first semiconductor chip.

8. A semiconductor device according to claim 7, wherein said first semiconductor chip and said second semiconductor chip are bonded and fixed in a state where the positions of said respective semiconductor chips are staggered relatively to each other so that said third latus of said first semiconductor chip may lie outside said third latus of said second semiconductor chip, and that said fourth latus of said second semiconductor chip may lie outside the fourth latus of said first semiconductor chip.

9. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire; and a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that the second latus of said first semiconductor chip may lie outside said first latus of said second semiconductor chip and that the second latus of said second semiconductor chip may lie outside said first latus of said first semiconductor chip;

each of said plurality of first leads has a distal end part of its inner portion, which lies within said resin body, bonded and fixed onto the rear surface of said second semiconductor chip outside said first latus of said first semiconductor chip; and each of said plurality of second leads has a distal end part of its inner portion, which lies within said resin body, bonded and fixed onto the rear surface of said first semiconductor chip outside said first latus of said second semiconductor chip.

10. A semiconductor device according to claim 9, wherein said rear surfaces of said first semiconductor chip and said second semiconductor chip are held in touch with each other.

11. A semiconductor device according to claim 9, wherein said rear surfaces of each first semiconductor chip and said second semiconductor chip are bonded and fixed to each other through an adhesive layer.

12. A semiconductor device according to claim 9, wherein:

those wire connection surfaces of said first leads to which the wire pieces are connected lie nearer to a side of said second semiconductor chip with respect to the front surface of said first semiconductor chip; and those wire connection surfaces of said second leads to which the wire pieces are connected lie nearer to a side of said first semiconductor chip with respect to the front surface of said second semiconductor chip.

13. A semiconductor device according to claim 9, wherein:

said inner portion of each of said first leads is constructed having a first part which traverses a latus of said real surface of said second semiconductor chip and which is bonded and fixed to said rear surface of said second semiconductor chip, a second part which bends from said first part toward a side of the front surface of said first semiconductor chip, and a third part which extends from said second part in the same direction as that of said first part; and said inner portion of each of said second leads is constructed having a first part which traverses a latus of said rear surface of said first semiconductor chip and which is fixed to said rear surface of said first semiconductor chip, a second part which bends from said first part of said inner portion of said each second lead toward the side of said front surface of said first semiconductor chip, and a third part which extends from said second part of said inner portion of said each second lead in the same direction as that of said first part of said inner portion of said each second lead.

14. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire; and a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that said first latus of said first semiconductor chip may lie outside the second latus of said second semiconductor chip and that said first latus of said second semiconductor chip may lie outside the second latus of said first semiconductor chip;

each of said plurality of first leads has a distal end part of its inner portion, which lies within said resin body, bonded and fixed onto the rear surface of said first semiconductor chip outside said second latus of said second semiconductor chip; and each of said plurality of second leads has a distal end part of its inner portion, which lies within said resin body, bonded and fixed onto the rear surface of said second semiconductor chip outside said second latus of said first semiconductor chip.

15. A semiconductor device according to claim 14, wherein:

said inner portion of each of said first leads is constructed having a first part which traverses a laths of said rear surface of said first semiconductor chip and which is bonded and fixed to said rear surface of said first semiconductor chip, a second part which bends from said first part toward a side of the front surface of said first semiconductor chip, and a third part which extends from said second part in the same direction as that of said first part; and said inner portion of each of said second leads is constructed having a first part which traverses a latus of said rear surface of said second semiconductor chip and which is fixed to said rear surface of said second semiconductor chip, a second part which bends from said first part of said inner portion of said each second lead toward the side of said front surface of said first semiconductor chip, and a third part which extends from said second part of said inner portion of said each second lead in the same direction as that of said first part of said inner portion of said each second lead.

16. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire; and a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that the second latus of said first semiconductor chip may lie outside said first latus of said second semiconductor chip and that the second latus of said second semiconductor chip may lie outside said first latus of said first semiconductor chip;

each of said plurality of first leads has a distal end part of its inner portion, which lies within said resin body, bonded and fixed onto the rear surface of said second semiconductor chip outside said first latus of said first semiconductor chip; and each of said plurality of second leads has a distal end part of its inner portion, which lies within said resin body, bonded and fixed onto the front surface of said first semiconductor chip and on the side of said second latus of said first semiconductor chip.

17. A semiconductor device according to claim 16, wherein:

said inner portion of each of said first leads is constructed having a first part which traverses a latus of said rear surface of said second semiconductor chip and which is bonded and fixed to said rear surface of said second semiconductor chip, a second part which bends from said first part toward a side of said front surface of said first semiconductor chip, and a third part which extends from said second part in the same direction as that of said first part; and said inner portion of each of said second leads is constructed having a first part which traverses said second latus of said first semiconductor chip and which is bonded and fixed to said front surface of said first semiconductor chip, a second part which bends from said first part of said inner portion of said each second lead toward a side of the rear surface of said first semiconductor chip, and a third part which extends from said second part of said inner portion of said each second lead in the same direction as that of said first part of said inner portion of said each second lead.

18. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire; and a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

wherein said first semiconductor chip and said second semiconductor chip are stacked in a state where the rear surface of said first semiconductor chip and the front surface of said second semiconductor chip are faced to each other so that said first latus of said first semiconductor chip and a second latus of said second semiconductor chip opposing to said first latus thereof may confront a side of said first leads, and where positions of the respective semiconductor chips are staggered relatively to each other so that said first latus of said first semiconductor chip may lie outside the second latus of said second semiconductor chip and that said first latus of said second semiconductor chip may lie outside the second latus of said second semiconductor chip;

each of said plurality of first leads has a distal end part of its inner portion, which lies within said resin body, bonded and fixed onto said rear surface of said first semiconductor chip outside said second latus of said first semiconductor chip; and each of said plurality of second leads has a distal end part of its inner portion, which lies within said resin body, bonded and fixed onto the rear surface of said second semiconductor chip on a side of said first latus of said second semiconductor chip.

19. A semiconductor device according to claim 18, wherein said rear surface of said first semiconductor chip and said front surface of said second semiconductor chip are held in touch with each other.

20. A semiconductor device according to claim 18, wherein said rear surface of said first semiconductor chip and said front surface of said second semiconductor chip are bonded and fixed to each other through an adhesive layer.

21. A semiconductor device according to claim 18, wherein:

said inner portion of each of said first leads is constructed having a first part which traverses a latus of said rear surface of said first semiconductor chip and which is bonded and fixed to said rear surface of said first semiconductor chip, a second part which bends from said first part toward a side of the front surface of said first semiconductor chip, and a third part which extends from said second part in the same direction as that of said first part; and said inner portion of each of said second leads is constructed having a first part which traverses a latus of said rear surface of said second semiconductor chip and which is fixed to said rear surface of said second semiconductor chip, a second part which bends from said first part of said inner portion of said each second lead toward the side of said front surface of said first semiconductor chip, and a third part which extends from said second part of said inner portion of said each second lead in the same direction as that of said first part of said inner portion of said each second lead.

22. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire;

a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

a first supporting lead which supports said first semiconductor chip; and a second supporting lead which supports said second semiconductor chip;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that the second latus of said first semiconductor chip may lie outside said first latus of said second semiconductor chip and that the second latus of said second semiconductor chip may lie outside said first latus of said first semiconductor chip;

said first supporting lead is bonded and fixed onto the rear surface of said first semiconductor chip and outside said first latus of said second semiconductor chip; and said second supporting lead is bonded and fixed onto the rear surface of said second semiconductor chip outside said first latus of said first semiconductor chip.

23. A semiconductor device according to claim 22, wherein said rear surfaces of said first semiconductor chip or said second semiconductor chip are held in touch with each other.

24. A semiconductor device according to claim 22, wherein said rear surfaces of said first semiconductor chip and said second semiconductor chip are bonded and fixed to each other through an adhesive layer.

25. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire;

a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire;

a first supporting lead which supports said first semiconductor chip; and a second supporting lead which supports said second semiconductor chip;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that said first latus of said first semiconductor chip may lie outside the second latus of said second semiconductor chip and that said first latus of said second semiconductor chip may lie outside said second latus of said first semiconductor chip;

said first supporting lead is bonded and fixed onto the front surface of said first semiconductor chip; and said second supporting lead is bonded and fixed onto the front surface of said second semiconductor chip.

26. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire;

a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire; and a tab which has the rear surface of said first semiconductor chip bonded and fixed onto a front surface of front and rear surfaces thereof, and which has the rear surface of said second semiconductor chip bonded and fixed onto the rear surface of said front and rear surfaces thereof;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that said first latus of said first semiconductor chip may lie outside the second latus of said second semiconductor chip, as well as a side surface of said tab, and that said first latus of said second semiconductor chip may lie outside said second latus of said first semiconductor chip, as well as another side surface of said tab.

27. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of conductive wire;

a plurality of second leads which extend inside and outside said resin body, which are arranged on a side of a second latus of said first semiconductor chip opposing to said first latus thereof, and which are electrically connected to the corresponding electrodes of said second semiconductor chip through pieces of conductive wire; and a tab which has the rear surface of said first semiconductor chip bonded and fixed onto a front surface of front and rear surfaces thereof, and which has the rear surface of said second semiconductor chip bonded and fixed onto the rear surface of said front and rear surfaces thereof;

wherein said first semiconductor chip and said second semiconductor chip are stacked in a state where the rear surfaces of the respective semiconductor chips are faced to each other so that said first latus of said first semiconductor chip and a second latus of said second semiconductor chip opposing to said first latus thereof may confront a side of said first leads, and where positions of said respective semiconductor chips are staggered relatively to each other so that a side surface of said tab on the same side as said first latus of said first semiconductor chip may lie outside inner side ends of said electrodes of said first semiconductor chip and that a side surface of said tab on the same side as said first latus of said second semiconductor chip may lie outside inner side ends of said electrodes of said second semiconductor chip.

28. A semiconductor device, comprising:

a resin body;

a first semiconductor chip and a second semiconductor chip which lie within said resin body, each of which is formed in a square shape when viewed in plan, and each of which is formed with a plurality of electrodes on a side of a first latus of a front surface of front and rear surfaces thereof and along the first latus;

a plurality of first leads which extend inside and outside said resin body, which are arranged on the side of said first latus of said first semiconductor chip, and which are electrically connected to the corresponding electrodes of said first semiconductor chip through pieces of first conductive wire;

a plurality of second leads which extend inside and outside said resin body, which are arranged on a side of a second latus of said first semiconductor chip opposing to said first latus thereof, and which are electrically connected to the corresponding electrodes of said second semiconductor chip through pieces of second conductive wire; and a tab which has the rear surface of said first semiconductor chip bonded and fixed onto a front surface of front and rear surfaces thereof, and which has the rear surface of said second semiconductor chip bonded and fixed onto the rear surface of said front and rear surfaces thereof;

wherein wire connection surfaces of said first leads lie nearer to a side of said second semiconductor chip with respect to the front surface of said first semiconductor chip;

wire connection surfaces of said second leads lie nearer to a side of said first semiconductor chip with respect to the front surface of said second semiconductor chip;

each of the first wire pieces is connected by reverse bonding in which it is bonded onto the wire connection surface of the corresponding first lead as first bonding and is subsequently bonded to the corresponding electrode of said first semiconductor chip as second bonding; and each of the second wire pieces is connected by reverse bonding in which it is bonded onto the wire connection surface of the corresponding second lead as first bonding and is subsequently bonded to the corresponding electrode of said second semiconductor chip as second bonding.

* * * * *